(12) United States Patent
Midorikawa

(10) Patent No.: US 7,077,231 B2
(45) Date of Patent: Jul. 18, 2006

(54) AUTOMOTIVE PASSENGER RESTRAINT AND PROTECTION APPARATUS

(75) Inventor: Yukinori Midorikawa, Fujisawa (JP)

(73) Assignee: NSK Autoliv Co., Ltd., Fujisawa (JP)

( * ) Notice: Subject to any disclaimer, the term of this patent is extended or adjusted under 35 U.S.C. 154(b) by 33 days.

(21) Appl. No.: 11/003,663

(22) Filed: Dec. 3, 2004

(65) Prior Publication Data

US 2005/0077717 A1   Apr. 14, 2005

Related U.S. Application Data

(62) Division of application No. 10/722,943, filed on Nov. 25, 2003, now Pat. No. 6,997,277, which is a division of application No. 10/385,811, filed on Mar. 11, 2003, now Pat. No. 6,843,339, which is a division of application No. 09/862,052, filed on May 21, 2001, now Pat. No. 6,561,299, which is a division of application No. 09/207,911, filed on Dec. 9, 1998, now Pat. No. 6,257,363.

(30) Foreign Application Priority Data

| Dec. 16, 1997 | (JP) | 09-363274 |
| Dec. 16, 1997 | (JP) | 09-363276 |
| Dec. 18, 1997 | (JP) | 09-363840 |
| Dec. 26, 1997 | (JP) | 09-366747 |
| Feb. 17, 1998 | (JP) | 10-049999 |
| Jun. 3, 1998 | (JP) | 10-169146 |
| Jun. 5, 1998 | (JP) | 10-172130 |
| Jun. 10, 1998 | (JP) | 10-176561 |
| Aug. 5, 1998 | (JP) | 10-221913 |
| Aug. 7, 1998 | (JP) | 10-224526 |
| Aug. 31, 1998 | (JP) | 10-245555 |
| Aug. 31, 1998 | (JP) | 10-245700 |

(51) Int. Cl.
*B60R 21/01* (2006.01)

(52) U.S. Cl. .................. 180/268; 280/807; 701/45
(58) Field of Classification Search .............. 180/268, 180/269, 271; 280/801.1, 802, 807; 701/45
See application file for complete search history.

(56) References Cited

U.S. PATENT DOCUMENTS

| 3,986,093 A | 10/1976 | Wakamatsu et al. |
| 4,059,822 A | 11/1977 | Toshioka et al. |

(Continued)

FOREIGN PATENT DOCUMENTS

GB   2102130   1/1983

(Continued)

*Primary Examiner*—Christopher P. Ellis
*Assistant Examiner*—Christopher Bottorff
(74) *Attorney, Agent, or Firm*—Frishauf, Holtz, Goodman & Chick, P.C.

(57) ABSTRACT

An automotive passenger restraint and protection apparatus for an automotive vehicle has a seatbelt and operates to restrain an occupant of the automotive vehicle by the seatbelt to protect the occupant. An electric retractor has a DC motor for retracting and protracting the seatbelt. An MPU applies voltage having a predetermined waveform to the DC motor, and then detects a waveform of current flowing to the DC motor. The MPU carries out fault diagnosis of the DC motor, based upon the detected waveform of current when the voltage having the predetermined waveform is applied to the DC motor. Thus, accurate fault diagnosis of the apparatus can be achieved.

1 Claim, 50 Drawing Sheets

U.S. PATENT DOCUMENTS

| | | |
|---|---|---|
| 4,187,925 A | 2/1980 | Lindblad |
| 4,300,081 A | 11/1981 | Van Landingham |
| 4,410,061 A * | 10/1983 | Terabayashi ................. 180/268 |
| 4,562,390 A | 12/1985 | Tobise |
| 4,572,543 A | 2/1986 | Tsuge et al. |
| 4,787,569 A | 11/1988 | Kanada et al. |
| 4,821,562 A | 4/1989 | Inoue |
| 4,839,532 A | 6/1989 | Kokuryo et al. |
| 4,850,325 A | 7/1989 | Abe et al. |
| 4,896,741 A | 1/1990 | Kawai et al. |
| 4,906,857 A | 3/1990 | Cummins et al. |
| 4,907,757 A | 3/1990 | Rumpf et al. |
| 4,972,129 A | 11/1990 | Kawai et al. |
| 5,014,810 A | 5/1991 | Mattes et al. |
| 5,244,231 A | 9/1993 | Bauer et al. |
| 5,270,530 A | 12/1993 | Godlewski et al. |
| 5,345,513 A | 9/1994 | Takeda et al. |
| 5,552,986 A | 9/1996 | Omura et al. |
| 5,570,260 A | 10/1996 | Kanai et al. |
| 5,611,497 A | 3/1997 | Krambeck et al. |
| 5,661,664 A | 8/1997 | Novosel et al. |
| 5,765,774 A | 6/1998 | Maekawa et al. |
| 5,831,409 A | 11/1998 | Lindberg et al. |
| 5,835,873 A | 11/1998 | Darby et al. |
| 5,929,576 A | 7/1999 | Yasohara et al. |
| 5,943,435 A | 8/1999 | Gaborski |
| 6,108,179 A | 8/2000 | Katae et al. |
| 6,257,363 B1 | 7/2001 | Midorikawa et al. |
| 6,561,299 B1 | 5/2003 | Midorikawa et al. |

FOREIGN PATENT DOCUMENTS

| | | |
|---|---|---|
| JP | 61-134464 | 8/1996 |
| JP | 09-175327 | 7/1997 |

* cited by examiner

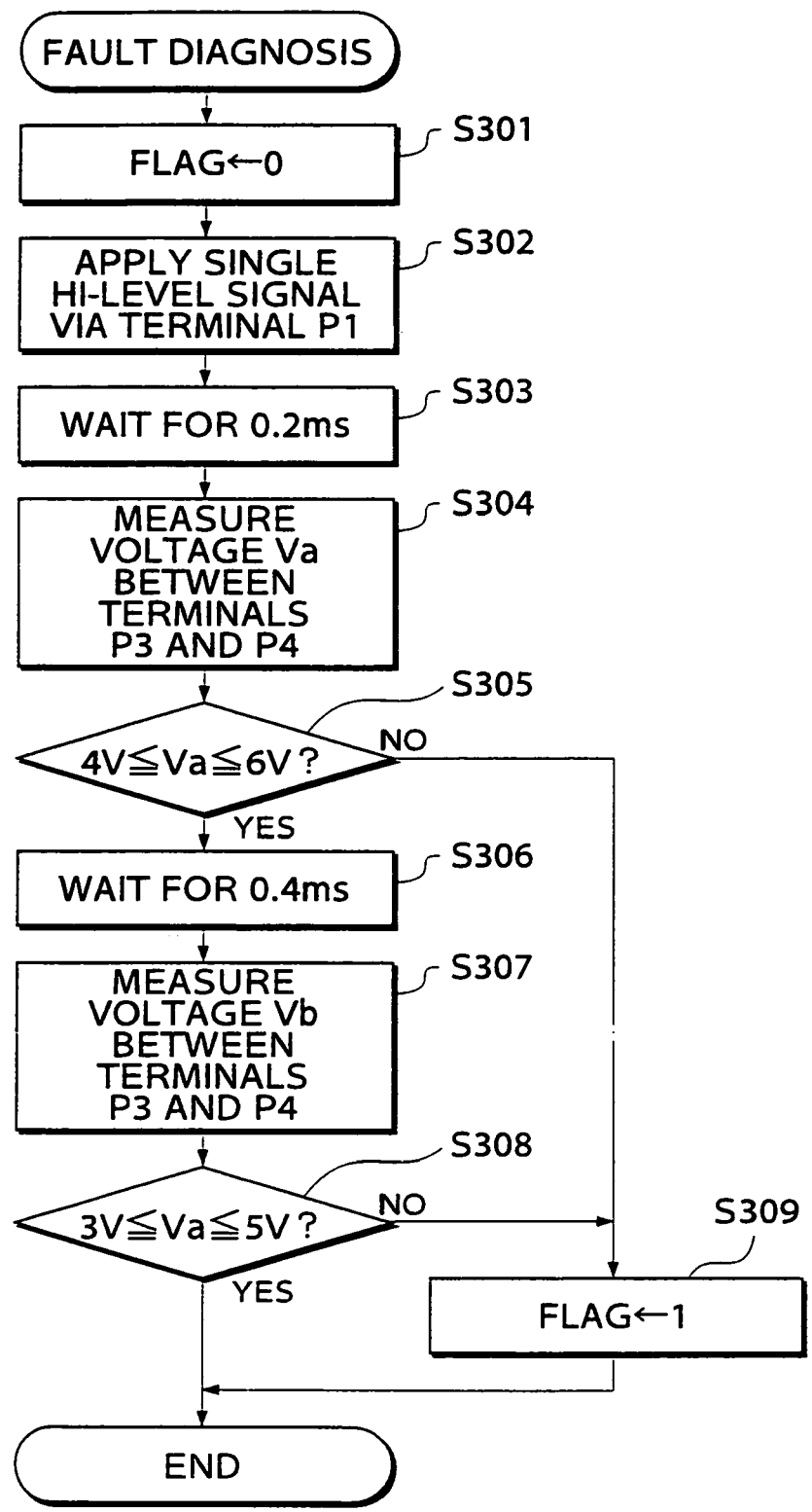

SEAT
104

104

110a  108  109
110b  107

AUTOMOTIVE PASSENGER RESTRAINT AND PROTECTION APPARATUS

This is a Division of application Ser. No. 10/722,943 filed Nov. 25, 2003, now U.S. Pat. No. 6,996,277 which is a Division of application Ser. No. 10/385,811 filed Mar. 11, 2003, now U.S. Pat. No. 6,843,339 which is a Division of application Ser. No. 09/862,052 filed May 21, 2001, now U.S. Pat. No. 6,561,299 issued May 13, 2003, which is a Division of application Ser. No. 09/207,911 filed Dec. 9, 1998, now U.S. Pat. No. 6,257,363 issued Jul. 10, 2001.

BACKGROUND OF THE INVENTION

1. Field of the Invention

This invention relates to an automotive passenger restraint and protection apparatus for automotive vehicles such as automobiles, which uses an electric retracting and protracting a seatbelt for an occupant (driver or passenger).

2. Prior Art

An automotive passenger restraint and protection apparatus is conventionally known, which has an electric retractor which protracts and retracts a seatbelt. The electric retractor has driving means formed, e.g. of an electric motor (hereinafter referred to as "motor" or "DC motor") for driving the electric retractor.

In the conventional automotive passenger restraint and protection apparatus of this type, fault diagnosis of the apparatus is carried out by pulling out or releasing a seatbelt by the occupant to ascertain whether the seatbelt can be actually protracted or retracted.

The above manner of fault diagnosis is unable to accurately detect faults in a DC motor for driving the electric retractor and its peripheral parts.

There have been proposed many other fault diagnosis methods for automotive passenger restraint and protection apparatuses.

One of those conventional methods is a method of detecting temperature in the vicinity of the motor by a temperature sensor or detecting current flowing to the motor by a current detecting circuit, and determining by an MPU (Micro Processing Unit) of the apparatus that there is is a fault in the apparatus when the detected temperature value or current value continuously exceeds a predetermined value over a predetermined time period. Upon determination that there is a fault in the apparatus, the MPU causes the motor to be stopped to prevent firing of the motor.

According to the above fault diagnosis method, however, if an abnormality occurs in a power transmission mechanism which transmits a driving force from the motor to a reel shaft which has the seatbelt wound thereon such that the power transmission cannot transmit the driving force and accordingly the motor runs idle, the temperature in the vicinity of the motor rises and the current flowing to the motor increases but not to such a degree that the MPU can determine that there is a fault or abnormality. Consequently, such a kind of abnormality cannot be detected by the conventional fault diagnosis method.

Further, if no countermeasure is taken to eliminate such an abnormality of the power transmission mechanism, the motor may have a shortened effective life.

On the other hand, if the motor for driving the electric retractor is continuously operated for a long time, the temperature of the motor rises and can exceed the withstand temperature so that the motor can become faulty.

The conventional automotive passenger restraint and protection apparatus, however, is not provided with a function of preventing such a kind of fault.

The conventional automotive passenger restraint and protection apparatuses include a type which has a function of carrying out a seatbelt slackening operation for giving a predetermined amount of looseness to the seatbelt if seatbelt attaching detecting means detects that the seatbelt has shifted from a state disconnected from the occupant to a state attached to the occupant, and carrying out a seatbelt storing operation for storing the seatbelt into a retracted position if the seatbelt attaching detecting means detects that the seatbelt has shifted from the attached state to the disconnected state.

Further, the conventional automotive passenger restraint and protection apparatuses include a type which has a function of carrying out a seatbelt slackening operation of retracting the seatbelt to a retraction limit position (hereinafter merely referred to as "limit" unless otherwise specified) if the seatbelt is protracted by the occupant in attaching the seatbelt to his body, and then protracting the seatbelt so as to give a predetermined amount of looseness to the seatbelt.

If, however, the seatbelt attaching detecting means becomes faulty such that it always determines that the seatbelt is disconnected from the occupant even when the seatbelt is attached to the occupant, the seatbelt slackening operation cannot be performed even when the seatbelt has been attached to the occupant, whereby a predetermined amount of looseness cannot be given to the seatbelt, failing to providing a comfortable seatbelt wearing feeling for the occupant. Further, even if the seatbelt has shifted to the disconnected state from the attached state with the seatbelt attaching detecting means being faulty, the seatbelt storing operation cannot be performed, so that the seatbelt is held in the disconnected or protracted state.

Conversely, if the seatbelt attaching detecting means becomes faulty such that it always determines that the seatbelt is attached to the occupant even when the seatbelt is disconnected from the occupant, the seatbelt slackening operation can be carried out while the seatbelt is in the stored state, failing to keep the seatbelt in a proper stored state. Further, in this state, if the seatbelt is attached to the occupant' body, a determination is made that the seatbelt has been protracted from a state attached to the occupant, so that the seatbelt slackening operation is carried out. However, if then the seatbelt is disconnected from the occupant, a determination is made that the seatbelt is attached to the occupant, so that the seatbelt storing operation cannot be performed, whereby the seatbelt is held in the protracted state.

Moreover, in the above type of automotive passenger restraint and protection apparatus, the seatbelt is always given a fixed amount of looseness irrespective of whether there is a fear of collision of the automotive vehicle. Therefore, the above function is not perfect to properly protect the occupant.

Further, in the conventional automotive passenger restraint and protection apparatus, the power consumption of the MPU is not contemplated. As a result, for example, the MPU operates so as to exhibit its full function even in the case where the full function of the MPU need not be exhibited.

On the other hand, an automotive passenger restraint and protection apparatus is conventionally known, which is provided with driving/traveling state detecting means which detects a collision danger state and a collision unavoidable state of the automotive vehicle, and a dozing state of the driver.

According to this type of automotive passenger restraint and protection apparatus, if the driving/traveling state detecting means detects the collision danger state of the automotive vehicle or the dozing state of the driver, protraction and retraction of the seatbelt are alternately carried out at irregular time intervals so as to alert the occupant or driver to the danger. Further, if the collision unavoidable state of the automotive vehicle is detected, the seatbelt is retracted with a predetermined magnitude of retracting force so as to properly protect the occupant upon a collision of the automotive vehicle.

In the conventional automotive passenger restraint and protection apparatus, however, once the ignition switch of the automotive vehicle is turned on, electric power is supplied from the power supply all the time thereafter, so that the electric power is consumed even when the driving/traveling state detecting means need not be operated.

Further, the electric retractor is constructed such that once disconnection of the seatbelt from the occupant is detected, it retracts the seatbelt into its fully retracted position.

Therefore, if the occupant once releases a tongue of the seatbelt from a buckle secured to the seat into a disconnected state and immediately then attaches the tongue of the seat to the buckle, he has to manually protract the seatbelt against the retracting force of the electric retractor. Thus, a large force is required for protracting the seatbelt, and therefore a weak occupant who has degraded physical ability such as an advanced-age occupant takes long to mount the seatbelt onto his body.

Further, an automotive passenger restraint and protection apparatus has been proposed, e.g. by Japanese Laid-Open Patent Publication (Kokai) No. 9-175327, which includes an electric retractor, and collision danger predicting means, wherein the electric retractor operates in response to a signal indicative of collision danger from the collision danger predicting means, to cause vibration by alternately applying and releasing pressure to and from the occupant through the seatbelt. This vibration is continued until a signal indicative of a collision being unavoidable is received from the collision danger predicting means or the signal indicative of collision danger ceases to be received.

The proposed automotive passenger restraint and protection apparatus are, however, required to be still improved in the following points. That is, the collision danger predicting means merely predicts or foresees a future phenomenon but cannot perfectly predict a future phenomenon. Therefore, according to the proposed construction that stops vibration by alternate application and release of pressure upon stopping of receipt of the collision danger signal, the collision danger signal is not received even when there is still a possibility that the vehicle encounters a collision, so that the vibration is stopped. Thus, sufficient warning cannot be given to the occupant.

Further, in the conventional automotive passenger restraint and protection apparatus, in the case where when the seatbelt is in a state disconnected from the occupant, when the seat is protracted by the occupant, the time period after the protraction of the seatbelt by the occupant is stopped and before retraction of the seat is started by the electric retractor is almost constant irrespective of the speed of the protraction of the seatbelt by the occupant. More specifically, the occupant with the seatbelt not attached to his body protracts the seatbelt in order to mount the seatbelt onto his body, and thereafter stops protracting the seatbelt since he cannot easily soon engage the tongue of the seatbelt with the buckle and hence takes time to mount the seatbelt onto his body. The time period after the stoppage of protraction of the seatbelt by the occupant and before retraction of the seatbelt by the electric retractor is started is set to a predetermined fixed time period which corresponds to the expected time that the occupant should take by trying to engage the seatbelt with the buckle.

However, if the occupant protracts the seatbelt without the intention of mounting the seatbelt onto his body and then gets off the automotive vehicle and closes the door, retraction of the seatbelt by the electric retractor is not carried out over the set predetermined time period. As a result, the protracted seatbelt can be caught in the door when the occupant closes the door. On the other hand, in the case where the occupant takes longer time than expected to mount the seatbelt onto his body, retraction of the seatbelt by the electric retractor can start before the occupant completes the mounting. Then, the occupant takes long to mount the seatbelt onto his body due to the retracting force of the electric retractor.

The time period after the seatbelt is protracted by the occupant and before he closes the door after getting off the automotive vehicle varies depending upon the occupant's physical ability. Generally speaking, in the case of an occupant having a high physical ability, the time the occupant takes to get off the vehicle is short and the time period after the occupant protracts and before he closes the door is short, whereas in the case of an occupant having a low physical ability, the time the occupant takes to get off the vehicle is long and the time period after the occupant protracts and before he closes the door is long. Further, generally speaking, the seatbelt protracting speed of an occupant of a high physical ability is high, whereas that of an occupant of a low physical ability is low. Accordingly, generally, the time period after stoppage of protraction of the seatbelt by the occupant and before completion of mounting of the seatbelt onto his body is relatively short in the case of an occupant of a high physical ability, and relatively long in the case of an occupant of a low physical ability.

In the conventional automotive passenger restraint and protection apparatus, however, the time period after the stoppage of protraction of the seatbelt by the occupant and before the start of retraction of the seat by the electric retractor is set to an almost constant value irrespective of the physical ability of the occupant. Therefore, if the set time period is a relatively long time period corresponding to an occupant of a low physical ability, when an occupant of a high physical ability gets off the vehicle and closes the door in a relatively short time, the seatbelt can be caught in the door, while if the set time period is a relatively short time period corresponding to an occupant of a high physical ability, when an occupant of a low physical ability mounts the seatbelt onto his body, the seatbelt starts to be retracted by the electric retractor before he finishes mounting the seatbelt onto his body, thus impeding the occupant's mounting motion.

Further, in the conventional automotive passenger restraint and protection apparatus, supply voltage to the electric retractor is supplied from a battery provided in the automotive vehicle all the time, as known from Japanese Laid-Open Utility Model publication (Kokai) No. 61-134464. Further, in the apparatus according to this publication, the seatbelt is not retracted after disconnection of the seatbelt from the occupant.

According to this conventional automotive passenger restraint and protection apparatus, however, since the supply voltage to the electric retractor is supplied from the batter all the time, the battery is consumed even when the supply voltage need not be supplied to the electric retractor, resulting in early deterioration of the battery. Further, since the seatbelt is not retracted after disconnection of the seatbelt from the occupant, there is a possibility that the tongue of the seatbelt can be caught in the door.

SUMMARY OF THE INVENTION

It is a first object of the invention to provide an automotive passenger restraint and protection apparatus which is capable of achieving accurate fault diagnosis of the apparatus.

A second object of the invention is to provide an automotive passenger restraint and protection apparatus which is capable of performing accurate fault diagnosis of the apparatus and giving warning upon detection of a fault to alert the occupant to the fault.

A third object of the invention is to provide an automotive passenger restraint and protection apparatus which is capable of preventing driving means for protracting and retracting the seatbelt from becoming faulty.

A fourth object of the invention is to provide an automotive passenger restraint and protection apparatus which is capable of providing a comfortable seatbelt attaching feeling and preventing the seatbelt from being damaged even when attaching or disconnection of the seatbelt to or from the occupant cannot be accurately detected due to a fault.

A fifth object of the invention is to provide an automotive passenger restraint and protection apparatus which is capable of changing the operative state of control means of the apparatus according to the expected ability thereof to thereby reduce the power consumption.

A sixth an automotive passenger restraint and protection apparatus which is capable of supplying electric power to driving/traveling state detecting means only when the driving/traveling state detecting means needs to be operated, to thereby reduce the power consumption.

A seventh object of the invention is to provide an automotive passenger restraint and protection apparatus which is capable of facilitating mounting of the seatbelt onto the occupant even when the occupant has a low physical ability to thereby properly protect the occupant.

An eighth object of the invention is to provide an automotive passenger restraint and protection apparatus which is capable of preventing the seatbelt from being caught in the door of the automotive vehicle.

A ninth object of the invention is to provide an automotive passenger restraint and protection apparatus which is capable of continuing vibration by alternate application and release of pressure to and from the occupant as long as it is expected that the automotive vehicle runs into danger even after a collision danger signal ceases to be received, to thereby fully alert the occupant to the danger.

A tenth object of the invention is to provide an automotive passenger restraint and protection apparatus which is capable of accurately determining the degree of danger of collision of the automotive vehicle.

An eleventh object of the invention is to provide an automotive passenger restraint and protection apparatus which is capable of properly protecting the occupant in a manner dependent upon the degree of danger of collision of the automotive vehicle.

A twelfth object of the invention is to provide an automotive passenger restraint and protection apparatus which is capable of preventing deterioration of the power supply.

To attain the first object, according to a first aspect of the invention, there is provided an automotive passenger restraint and protection apparatus for an automotive vehicle, having a seatbelt, for restraining an occupant of the automotive vehicle by the seatbelt to protect the occupant, comprising an electric retractor having driving means for retracting and protracting the seatbelt, voltage waveform applying means for applying voltage having a predetermined waveform to the driving means, current waveform detecting means for detecting a waveform of current flowing to the driving means, and fault diagnosis means for carrying out fault diagnosis of the driving means, based upon the waveform of current detected by the current waveform detecting means when the voltage waveform applying means applies the voltage having the predetermined waveform to the driving means.

According to the first aspect, fault diagnosis of the driving means is carried out based upon a waveform of current detected by the current waveform detecting means when the voltage waveform applying means applies voltage having a predetermined waveform to the driving means. As a result, it is possible to determine whether the driving means is functioning normally or abnormally, in an electric manner, thereby achieving accurate fault diagnosis of the apparatus.

To attain the first object, according to a second aspect of the invention, there is provided an automotive passenger restraint and protection apparatus for an automotive vehicle, having a seatbelt, for restraining an occupant of the automotive vehicle by the seatbelt to protect the occupant, comprising an electric retractor having driving means for retracting and protracting the seatbelt, a load having load characteristics equivalent to electrical characteristics of the driving means, voltage waveform applying means for selectively selectively applying voltage having a predetermined waveform to the driving means and the load, current waveform detecting means for detecting a waveform of current flowing to the driving means or to the load, and fault diagnosis means for carrying out fault diagnosis of the driving means, based upon the waveform of current detected by the current waveform detecting means when the voltage waveform applying means applies the voltage having the predetermined waveform to the driving means and the waveform of current detected by the current waveform detecting means when the voltage waveform applying means applies the voltage having the predetermined waveform to the load.

According to the second aspect, fault diagnosis of the driving means is carried out based upon a waveform of current detected by the current waveform detecting means when the voltage waveform applying means applies voltage having a predetermined waveform to the driving means and a waveform of current detected by the current waveform detecting means when the voltage waveform applying means applies the voltage having the predetermined waveform to the load. As a result, it is possible to determine whether the driving means is functioning normally or abnormally, in an electric manner, thereby achieving accurate fault diagnosis of the apparatus.

To attain the second object, according to a third aspect of the invention, there is provided an automotive passenger restraint and protection apparatus for an automotive vehicle, having a seatbelt, for restraining an occupant of the automotive vehicle by the seatbelt to protect the occupant, comprising an electric retractor having driving means for retracting and protracting the seatbelt, warning means for giving warning upon occurrent of a fault of the driving means, control means for controlling the driving means and the warning means, and terminal voltage measuring means for measuring terminal voltage across the driving means, wherein the control means stops operation of the driving means and causes the warning means to give warning when the driving means has continued to operate over a predetermined time period while the terminal voltage measured by the terminal voltage measuring means falls within a range between a first predetermined value and a second predetermined value.

According to the third aspect, the control means stops operation of the driving means and causes the warning means to give warning when the driving means has continued to operate over a predetermined time period while the terminal voltage measured by the terminal voltage measuring means falls within a range between a first predetermined value and a second predetermined value. As a result, it is possible to perform accurate fault diagnosis of the apparatus and give warning upon detection of a fault to alert the occupant to the fault.

Preferably, the voltage range between the first predetermined value and the second predetermined is a range that can be assumed when the driving means runs idle while it is functioning normally.

To attain the second object, according to a fourth aspect of the invention, there is provided an automotive passenger restraint and protection apparatus for an automotive vehicle, having a seatbelt, for restraining an occupant of the automotive vehicle by the seatbelt to protect the occupant, comprising an electric retractor having driving means for retracting and protracting the seatbelt, warning means for giving warning upon occurrent of a fault of the driving means, control means for controlling the driving means and the warning means, and current detecting means for detecting current flowing to the driving means, wherein the control means stops operation of the driving means and causes the warning means to give warning when the driving means has continued to operate over a predetermined time period while the current detected by the current detecting means falls within a range between a first predetermined value and a second predetermined value.

According to the fourth aspect, the control means stops operation of the driving means and causes the warning means to give warning when the driving means has continued to operate over a predetermined time period while the current detected by the current detecting means falls within a range between a first predetermined value and a second predetermined value. As a result, it is possible to perform accurate fault diagnosis of the apparatus and give warning upon detection of a fault to alert the occupant to the fault.

Preferably, the current range between the first predetermined value and the second predetermined is a range that can be assumed when the driving means runs idle while it is functioning normally.

To attain the third object, according to a fifth aspect of the invention, there is provided an automotive passenger restraint and protection apparatus for an automotive vehicle, having a seatbelt, for restraining an occupant of the automotive vehicle by the seatbelt to protect the occupant, comprising an electric retractor having driving means for retracting and protracting the seatbelt, supply voltage supplying means for supplying supply voltage to the driving means, abnormality detecting means for detecting abnormality of the driving means, and supply voltage decreasing means for decreasing the supply voltage supplied to the driving means by the supply voltage supplying means when the abnormality of the driving means is detected by the abnormality detecting means.

According to the fifth aspect, the supply voltage supplied to the driving means by the supply voltage supplying means is decreased when abnormality of the driving means is detected by the abnormality detecting means. As a result, excessively high supply voltage is not applied to the driving means to thereby prevent the driving means from becoming faulty.

Preferably, the automotive passenger restraint and protection apparatus according to the fifth aspect includes current detecting means for detecting current flowing to the driving means, and timer means for measuring a time period during which the current detected by the current detecting means exceeds a predetermined value, and wherein the abnormality detecting means detects that the driving means is abnormal when the time period measured by the timer means exceeds a predetermined time period.

Also preferably, the automotive passenger restraint and protection apparatus according to the fifth aspect includes tension detecting means for detecting tension of the seatbelt, and timer means for measuring a time period during which the tension detected by the tension detecting means exceeds a predetermined value, and wherein the abnormality detecting means detects that the driving means is abnormal when the time period measured by the timer means exceeds a predetermined time period.

Also preferably, the automotive passenger restraint and protection apparatus according to the fifth aspect includes torque detecting means for detecting rotational torque of the electric retractor, and timer means for measuring a time period during which the rotational torque detected by the torque detecting means exceeds a predetermined value, and wherein the abnormality detecting means detects that the driving means is abnormal when the time period measured by the timer means exceeds a predetermined time period.

Also preferably, the automotive passenger restraint and protection apparatus according to the fifth aspect includes temperature detecting means for detecting temperature in a vicinity of the driving means or temperature of the driving means, and timer means for measuring a time period during which the temperature detected by the temperature detecting means exceeds a predetermined value, and wherein the abnormality detecting means detects that the driving means is abnormal when the time period measured by the timer means exceeds a predetermined time period.

To attain the fourth object, according to a sixth aspect of the invention, there is provided an automotive passenger restraint and protection apparatus for an automotive vehicle, having a seatbelt, for restraining an occupant of the automotive vehicle by the seatbelt to protect the occupant, comprising a reel shaft having the seatbelt wound thereon, winding amount detecting means for detecting an amount of winding of the seatbelt on the reel shaft, driving means for rotating the reel shaft in a direction of retracting the seatbelt and in a direction of protracting the seatbelt, control means for controlling the driving means, seatbelt attaching detecting means for detecting whether the seatbelt is attached to the occupant or disconnected from the occupant, and fault detecting means for detecting a fault of the seatbelt attaching detecting means, wherein the control means controls the driving means according to the amount of winding of the seatbelt on the reel shaft detected by the winding amount detecting means, when the fault of the seatbelt attaching detecting means is detected by the fault detecting means.

According to the sixth aspect, the driving means is controlled according to an amount of winding of the seatbelt on the reel shaft detected by the winding amount detecting means, when a fault of the seatbelt attaching detecting means is detected by the fault detecting means. As a result, even when attaching or disconnection of the seatbelt to or from the occupant cannot be accurately detected due to a fault, if the amount of winding of the seatbelt detected by the winding amount detecting means is small, it is judged that the seatbelt is attached to the occupant, and then the seatbelt is retracted to the retraction limit, followed by being given a predetermined amount of looseness. On the other hand, if the amount of winding of the seatbelt detected by the winding amount detecting means is large, it is judged that the seatbelt is disconnected from the occupant, and then the seatbelt is stored into its retracted position. Thus, even when attaching or disconnection of the seatbelt to or from the occupant cannot be accurately detected due to a fault. it is possible to provide a comfortable seatbelt attaching feeling and prevent the seatbelt from being damaged.

To attain the fifth object, according to a seventh aspect of the invention, there is provided an automotive passenger restraint and protection apparatus for an automotive vehicle, having a seatbelt, for restraining an occupant of the automotive vehicle by the seatbelt to protect the occupant, comprising an electric retractor having driving means for retracting and protracting the seatbelt, seatbelt attaching detecting means for detecting attaching of the seatbelt to the occupant or disconnection of the seatbelt from the occupant, and seatbelt protraction detecting means for detecting protraction of the seatbelt by the occupant, and control means for controlling the driving means by performing a plurality of functions, the control means having selecting means for selecting a reduced power consumption mode for permitting the control means to perform at least one minimum required function of the plurality of functions so as to save power consumption by the electric retractor, or a normal power consumption mode for permitting the control means to perform all of the plurality of functions so as not to save power consumption by the electric retractor, wherein the selecting means selects the reduced power consumption mode when a predetermined time period has elapsed after detection of the disconnection of the seatbelt from the occupant by the seatbelt attaching detecting means while the normal power consumption mode is selected, and selects the normal power consumption mode when the protraction of the seatbelt by the occupant is detected by the seatbelt protraction detecting means or when the attaching of the seatbelt to the occupant is detected by the seatbelt attaching detecting means.

According to the seventh aspect, the reduced power consumption mode is selected when a predetermined time period has elapsed after detection of disconnection of the seatbelt from the occupant by the seatbelt attaching detecting means while a normal power consumption mode is selected, and the normal power consumption mode is selected when protraction of the seatbelt by the occupant is detected by the seatbelt protraction detecting means or when attaching of the seatbelt to the occupant is detected by the seatbelt attaching detecting means. Thus, the operative state of the control means can be changed according to the expected ability thereof. As a result, it is possible to reduce the power consumption.

To attain the sixth object, according to an eighth aspect of the invention, there is provided an automotive passenger restraint and protection apparatus for an automotive vehicle, having a seatbelt, for restraining an occupant of the automotive vehicle by the seatbelt to protect the occupant, comprising an electric retractor having driving means for retracting and protracting the seatbelt, vehicle stoppage detecting means for detecting stoppage of the automotive vehicle, driving/traveling state detecting means for detecting states of driving and traveling of the automotive vehicle by the occupant, supply means for supplying electric power to the driving/traveling state detecting means, and control means for controlling the supply means so as to stop supply of the power to the driving/traveling state detecting means when the stoppage of the automotive vehicle is detected by the vehicle stoppage detecting means.

According to the eighth aspect, the supply means is controlled so as to stop supply of electric power to the driving/traveling state detecting means when stoppage of the automotive vehicle is detected by the vehicle stoppage detecting means. Thus, electric power is supplied to the driving/traveling state detecting means only when the latter needs to be operated, to thereby reduce the power consumption.

Preferably, the vehicle stoppage detecting means comprises at least one of seatbelt attaching detecting means for detecting whether the seatbelt is attached to the occupant, shift position detecting means for detecting whether a shift position of a transmission of the automotive vehicle is in a parking position, and parking brake detecting means for detecting whether a parking brake of the automotive vehicle is operated.

To attain the seventh object, according to a ninth aspect of the invention, there is provided an automotive passenger restraint and protection apparatus for an automotive vehicle, having a seatbelt, for restraining an occupant of the automotive vehicle by the seatbelt to protect the occupant, comprising an electric retractor having driving means for retracting and protracting the seatbelt, control means for controlling the driving means, seatbelt protraction detecting means for detecting protraction of the seatbelt by the occupant, and release detecting means for detecting release of the seatbelt from a state attached to the occupant to a state disconnected from the occupant, wherein the control means controls the driving means so as to start retraction of the seatbelt when the release of the seatbelt is detected by the release detecting means, controls the driving means so as to stop operation thereof over a predetermined time at least one time after the start of retraction of the seatbelt and before completion of the retraction, and controls the driving means so as to protract the seatbelt when the protraction is detected by the seatbelt protraction detecting means within the predetermined time period.

According to the ninth aspect, the driving means is controlled so as to start retraction of the seatbelt when release of the seatbelt is detected by the release detecting means, then controlled so as to stop operation thereof over a predetermined time at least one time after the start of retraction of the seatbelt and before completion of the retraction, and controlled so as to protract the seatbelt when protraction of the seatbelt is detected by the seatbelt protraction detecting means within the predetermined time period. As a result, the occupant need not pull out or protract the seatbelt against the retracting force of the driving means, thereby facilitating mounting of the seatbelt onto the occupant.

To attain the eighth object, according to a tenth aspect of the invention, the control means of the automotive restraint and protection apparatus according to the ninth aspect controls the driving means so as to retract the seatbelt when the protraction is not detected by the seatbelt protraction detecting means within the predetermined time period. This can avoid that the seatbelt is left in a protracted state, to thereby prevent the seatbelt from being caught in the door.

To attain the ninth object, according to an eleventh aspect of the invention, there is provided an automotive passenger restraint and protection apparatus for an automotive vehicle, having a seatbelt, for restraining an occupant of the automotive vehicle by the seatbelt to protect the occupant, comprising danger degree determining means for determining a degree of danger of collision of the automotive vehicle, danger predicting means for predicting a possibility of collision of the automotive vehicle, from the degree of danger determined by the danger degree determining means, collision danger signal generating means for generating a collision danger signal when the possibility of collision is predicted by the danger predicting means, driving means responsive to the collision danger signal, for carrying out alternate retraction and protraction of the seatbelt, deceleration detecting means for detecting deceleration of the automotive vehicle, and seatbelt driving control means for controlling the driving means so as to continue the alternate retraction and protraction of the seatbelt without stopping same after the collision danger signal ceases to be generated and until the deceleration of the automotive vehicle detected by the deceleration detecting means exceeds a predetermined value.

According to the eleventh aspect, the driving means is controlled to continue alternate retraction and protraction of the seatbelt without stopping same even after the collision danger signal ceases to be generated, so long as it is expected that the automotive vehicle runs into danger, to thereby fully alert the occupant to the danger. Thus, the automotive restraint and protection apparatus can be utilized as a warning device.

To attain the seventh object, according to a twelfth aspect of the invention, there is provided an automotive passenger restraint and protection apparatus for an automotive vehicle, having a seatbelt, for restraining an occupant of the automotive vehicle by the seatbelt to protect the occupant, comprising seatbelt attaching state detecting means for detecting whether the seatbelt is in a state attached to the occupant or in a state disconnected from the occupant, seatbelt protraction detecting means for detecting protraction of the seatbelt by the occupant, seatbelt protraction stoppage detecting means for detecting stoppage of protraction of the seatbelt, inhibiting means for inhibiting retraction of the seatbelt over a predetermined time period after the stoppage of protraction of the seatbelt is detected by the seatbelt protraction stoppage detecting means after the protraction of the seatbelt is detected by the seatbelt protraction detecting means while the seatbelt is detected to be in the state disconnected from the occupant by the seatbelt attaching state detecting means, protracting speed detecting means for detecting speed of protraction of the seatbelt, and setting means for setting the predetermined time period according to the speed of protraction of the seatbelt detected by the protracting speed detecting means.

According to the twelfth aspect, a predetermined time period over which retraction of the seatbelt is inhibited after stoppage of protraction of the seatbelt is detected following detection of the protraction of the seatbelt while the seatbelt is a state disconnected from the occupant, is set according to the speed of protraction of the seatbelt detected by the protracting speed detecting means. As a result, even when an occupant of a high physical ability gets off the vehicle and closes the door in a short time after protracting the seatbelt, it can be prevented that the seatbelt is caught in the door. On the other hand, when an occupant of a low physical ability mounts the seatbelt onto his body, it can be prevented that the seatbelt starts to be retracted before he finishes mounting the seatbelt onto his body to impede hip mounting motion, whereby mounting of the seatbelt onto the occupant is facilitated.

Preferably, the setting means sets the predetermined time period to a shorter value as the speed of protraction of the seatbelt detected by the protracting speed detecting means is higher, and to a longer value as the detected speed of protraction of the seatbelt is lower.

To attain the tenth object, according to a thirteenth aspect of the invention, there is provided an automotive passenger restraint and protection apparatus for an automotive vehicle, having a seatbelt, for restraining an occupant of the automotive vehicle by the seatbelt to protect the occupant, comprising a motor for retracting and protracting the seatbelt, seatbelt attaching state detecting means for detecting whether the seatbelt is in a state attached to the occupant or in a state disconnected from the occupant., danger degree detecting means for detecting a significant degree of danger of collision of the automotive vehicle, and control means for controlling the motor so as to retract the seatbelt to a limit thereof and then protract the seatbelt to thereby give a predetermined amount of looseness to the seatbelt, wherein the control means controls the motor so as to give a first predetermined amount of looseness to the seatbelt when the significant degree of danger is not detected by the danger degree detecting means while the seatbelt is detected to be in the state attached to the occupant, and controls the motor so as to give a second predetermined amount of looseness to the seatbelt which is smaller than the first predetermined amount of looseness when the significant degree of danger is detected by the danger degree detecting means while the seatbelt is detected to be in the state attached to the occupant.

According to the thirteenth aspect, the motor is controlled so as to give a first predetermined amount of looseness to the seatbelt when a significant degree of danger is not detected by the danger degree detecting means while the seatbelt is in a state attached to the occupant, and controlled so as to give a second predetermined amount of looseness to the seatbelt which is smaller than the first predetermined amount of looseness when the significant degree of danger is detected by the danger degree detecting means while the seatbelt is in the state attached to the occupant. Thus, when no significant degree of danger is detected, the first amount of looseness is given to the seatbelt, whereby the occupant does not have a feeling of oppression, and on the other hand, when the significant degree of danger is detected, the second amount of looseness is given to the seatbelt, whereby the occupant can be properly protected. As a result, a comfortable seatbelt attaching feeling can be given to the occupant, while the occupant can be properly protected.

To attain the eleventh object, according to a fourteenth aspect of the invention, the danger degree detecting means of the automotive passenger restraint and protection apparatus according to the thirteenth aspect comprises at least one of vehicle speed detecting means for detecting traveling speed of the automotive vehicle, braking detecting means for detecting stepping-on of a brake pedal of the automotive vehicle, steering angle change rate detecting means for detecting a rate of change in a steering angle of the automotive vehicle, ambient illuminance detecting means for detecting ambient illuminance of the automotive vehicle, and raindrop detecting means for detecting raindrops on the automotive vehicle, the danger degree detecting means detecting the significant degree of danger if the vehicle speed detecting means detects that the traveling speed of the automotive vehicle is higher than a predetermined value and at the same time at least one of conditions is satisfied that the stepping-on of the brake pedal is detected by the braking detecting means, the steering angle change rate detecting means detects that the rate of change of the steering angle exceeds a predetermined value, the ambient illuminance detecting means detects that the ambient illuminance of the automotive vehicle is below a predetermined value, and the raindrop detecting means detects the raindrops on the automotive vehicle.

According to the fourteenth aspect, it is possible to accurately determine the degree of danger of collision of the automotive vehicle.

To attain the twelfth object, according to a fifteenth aspect of the invention, various forms of the automotive passenger restraint and protection apparatus according to the fourteenth aspect are provided as follows:

The danger degree detecting means comprises vehicle speed detecting means for detecting traveling speed of the automotive vehicle, and braking detecting means for detecting a stepping-on force of a brake pedal of the automotive vehicle or stepping-on speed thereof, the control means controlling the motor such that rotational speed of the motor in retracting the seatbelt is higher as the stepping-on force or the stepping-on speed detected by the braking detecting means is larger, when the traveling speed of the automotive vehicle detected by the vehicle speed detecting means is higher than a predetermined value.

The danger degree detecting means comprises vehicle speed detecting means for detecting traveling speed of the automotive vehicle, and braking detecting means for detecting stepping-on of a brake pedal of the automotive vehicle, the control means controlling the motor such that rotational speed of the motor in retracting the seatbelt is higher as the traveling speed of the automotive vehicle detected by the vehicle speed detecting means is higher, when the detected traveling speed is higher than a predetermined value and at the same time the stepping-on of the brake pedal is detected by the braking detecting means.

The danger degree detecting means comprises vehicle speed detecting means for detecting traveling speed of the automotive vehicle, and steering angle change rate detecting means for detecting a rate of change in a steering angle of the automotive vehicle, the control means controlling the motor such that rotational speed of the motor in retracting the seatbelt is higher as the rate of change in the steering angle detected by the steering angle change rate detecting means is larger, when the traveling speed of the automotive vehicle detected by the vehicle speed detecting means is higher than a predetermined value.

The danger degree detecting means comprises vehicle speed detecting means for detecting traveling speed of the automotive vehicle, and steering angle change rate detecting means for detecting a rate of change in a'steering angle of the automotive vehicle, the control means controlling the motor such that rotational speed of the motor in retracting the seatbelt is higher as the traveling speed of the automotive vehicle detected by the vehicle speed detecting means is higher, when the detected traveling speed is higher than a predetermined value and at the same time the rate of change in the steering angle detected by the steering angle change rate detecting means is larger than a predetermined value.

The danger degree detecting means comprises vehicle speed detecting means for detecting traveling speed of the automotive vehicle, and ambient illuminance detecting means for detecting ambient illuminance of the automotive vehicle, the control means controlling the motor such that rotational speed of the motor in retracting the seatbelt is higher as the ambient illuminance detected by the ambient illuminance detecting means is smaller, when the traveling speed of the automotive vehicle detected by the vehicle speed detecting means is higher than a predetermined value.

The danger degree detecting means comprises vehicle speed detecting means for detecting traveling speed of the automotive vehicle, and ambient illuminance detecting means for detecting ambient illuminance of the automotive vehicle, the control means controlling the motor such that rotational speed of the motor in retracting the seatbelt is higher as the traveling speed of the automotive vehicle detected by the vehicle speed detecting means is higher, when the detected traveling speed is higher than a predetermined value and at the same time the ambient illuminance detected by the ambient illuminance detecting means is smaller than a predetermined value.

The danger degree detecting means comprises vehicle speed detecting means for detecting traveling speed of the automotive vehicle, and raindrop detecting means for detecting raindrop on the automotive vehicle, the control means controlling the motor such that rotational speed of the motor in retracting the seatbelt is higher as the traveling speed of the automotive vehicle detected by the vehicle speed detecting means is higher, when the detected traveling speed is higher than a predetermined value and at the same time the raindrops are detected by the raindrop detecting means.

The danger degree detecting means comprises vehicle speed detecting means for detecting traveling speed of the automotive vehicle, and braking detecting means for detecting a stepping-on force of a brake pedal of the automotive vehicle or stepping-on speed thereof, the control means controlling the motor such that an amount of protraction of the seatbelt is smaller as the stepping-on force or the stepping-on speed detected by the braking detecting means is larger, when the traveling speed of the automotive vehicle detected by the vehicle speed detecting means is higher than a predetermined value.

The danger degree detecting means comprises vehicle speed detecting means for detecting traveling speed of the automotive vehicle, and braking detecting means for detecting stepping-on of a brake pedal of the automotive vehicle, the control means controlling the motor such that an amount of protraction of the seatbelt is smaller as the traveling speed of the automotive vehicle detected by the vehicle speed detecting means is higher, when the detected traveling speed is higher than a predetermined value and at the same time the stepping-on of the brake pedal is detected by the braking detecting means.

The danger degree detecting means comprises vehicle speed detecting means for detecting traveling speed of the automotive vehicle, and steering angle change rate detecting means for detecting a rate of change in a steering angle of the automotive vehicle, the control means controlling the motor such that an amount of protraction of the seatbelt is smaller as the rate of change in the steering angle detected by the steering angle change rate detecting means is larger, when the traveling speed of the automotive vehicle detected by the vehicle speed detecting means is higher than a predetermined value.

The danger degree detecting means comprises vehicle speed detecting means for detecting traveling speed of the automotive vehicle, and steering angle change rate detecting means for detecting a rate of change in a steering angle of the automotive vehicle, the control means controlling the motor such that an amount of protraction of the seatbelt is smaller as the traveling speed of the automotive vehicle detected by the vehicle speed detecting means is higher, when the detected traveling speed is higher than a predetermined value and at the same time the rate of change in the steering angle detected by the steering angle change rate detecting means is larger than a predetermined value.

The danger degree detecting means comprises vehicle speed detecting means for detecting traveling speed of the automotive vehicle, and ambient illuminance detecting means for detecting ambient illuminance of the automotive vehicle, the control means controlling the motor such that an amount of protraction of the seatbelt is smaller as the ambient illuminance detected by the ambient illuminance detecting means is smaller, when the traveling speed of the automotive vehicle detected by the vehicle speed detecting means is higher than a predetermined value.

The danger degree detecting means comprises vehicle speed detecting means for detecting traveling speed of the automotive vehicle, and ambient illuminance detecting means for detecting ambient illuminance of the automotive vehicle, the control means controlling the motor such that an amount of protraction of the seatbelt is smaller as the traveling speed of the automotive vehicle detected by the vehicle speed detecting means is higher, when the detected traveling speed is higher than a predetermined value and at the same time the ambient illuminance detected by the ambient illuminance detecting means is smaller than a predetermined value.

The danger degree detecting means comprises vehicle speed detecting means for detecting traveling speed of the automotive vehicle, and raindrop detecting means for detecting raindrops on the automotive vehicle, the control means controlling the motor such that an amount of protraction of the seatbelt is smaller as the traveling speed of the automotive vehicle detected by the vehicle speed detecting means is higher, when the detected traveling speed is higher than a predetermined value and at the same time the raindrops are detected by the raindrop detecting means.

According to the fifteenth aspect, it is possible to properly protect the occupant in a manner dependent upon the degree of danger of collision of the automotive vehicle.

To attain the thirteenth object, according to a sixteenth aspect of the invention, there is provided an automotive passenger restraint and protection apparatus for an automotive vehicle, having a seatbelt, for restraining an occupant of the automotive vehicle by the seatbelt to protect the occupant, comprising an electric retractor having driving means for retracting and protracting the seatbelt, power supply means for supplying power to the electric retractor, detecting means for detecting whether there is a need for supply of power from the power supply means to the electric retractor, first switching means responsive to results of detection of the detecting means, for selecting supply of power from the power supply means to the electric retractor and stoppage of the supply of power, second switching means for selecting supply of power from the power supply means to the electric retractor and stoppage of the supply of power, and monitor control means for monitoring the results of detection of the detecting means and controlling the second switching means in response to the results of detection of the detecting means, wherein the monitor control means is responsive to a result of detection of the detecting means that there is no need for supply of power from the power supply means to the electric retractor after supply of power from the power supply means to the electric retractor, for controlling the second switching means so as to start supply of power from the power supply means to the electric retractor, and following the start of supply of power by the second switching means, the first switching means stops the supply of power to the electric retractor in response to the result of detection of the detecting means, and wherein the monitor control means controls the second switching means so as to stop the supply of power to the electric retractor after lapse of a predetermined time period from the stoppage of the supply of power by the first switching means.

According to the sixteenth aspect, when the detecting means detects that there is no need for supply of power from the power supply means to the electric retractor after supply of power from the power supply means to the electric retractor, the first switching means stops the supply of power to the electric retractor in response to the result of detection of the detecting means. As a result, wasteful consumption and deterioration of the battery can be prevented.

Further, when the detecting means detects that there is no need for supply of power from the power supply means to the electric retractor after supply of power from the power supply means to the electric retractor, the monitor control means controls the second switching means to start supply of power from the power supply means to the electric retractor, and after lapse of a predetermined time period from the stoppage of the supply of power by the first switching means, the monitor control means controls the second switching means to stop the supply of power to the electric retractor. As a result, retraction of the seatbelt can be carried out without fail when the seatbelt is disconnected from the occupant, to thereby prevent the seatbelt tongue from being caught in the door.

The above and other objects, features, and advantages of the invention will become more apparent from the following detailed description taken in conjunction with the accompanying drawings.

BRIEF DESCRIPTION OF THE DRAWINGS

FIG. 3 is a flowchart showing a fault diagnosis program according to the first embodiment, executed by an MPU 14 appearing in FIG. 1;

DETAILED DESCRIPTION

The invention will now be described in detail with reference to drawings showing embodiments thereof.

First Embodiment

Figure 1:
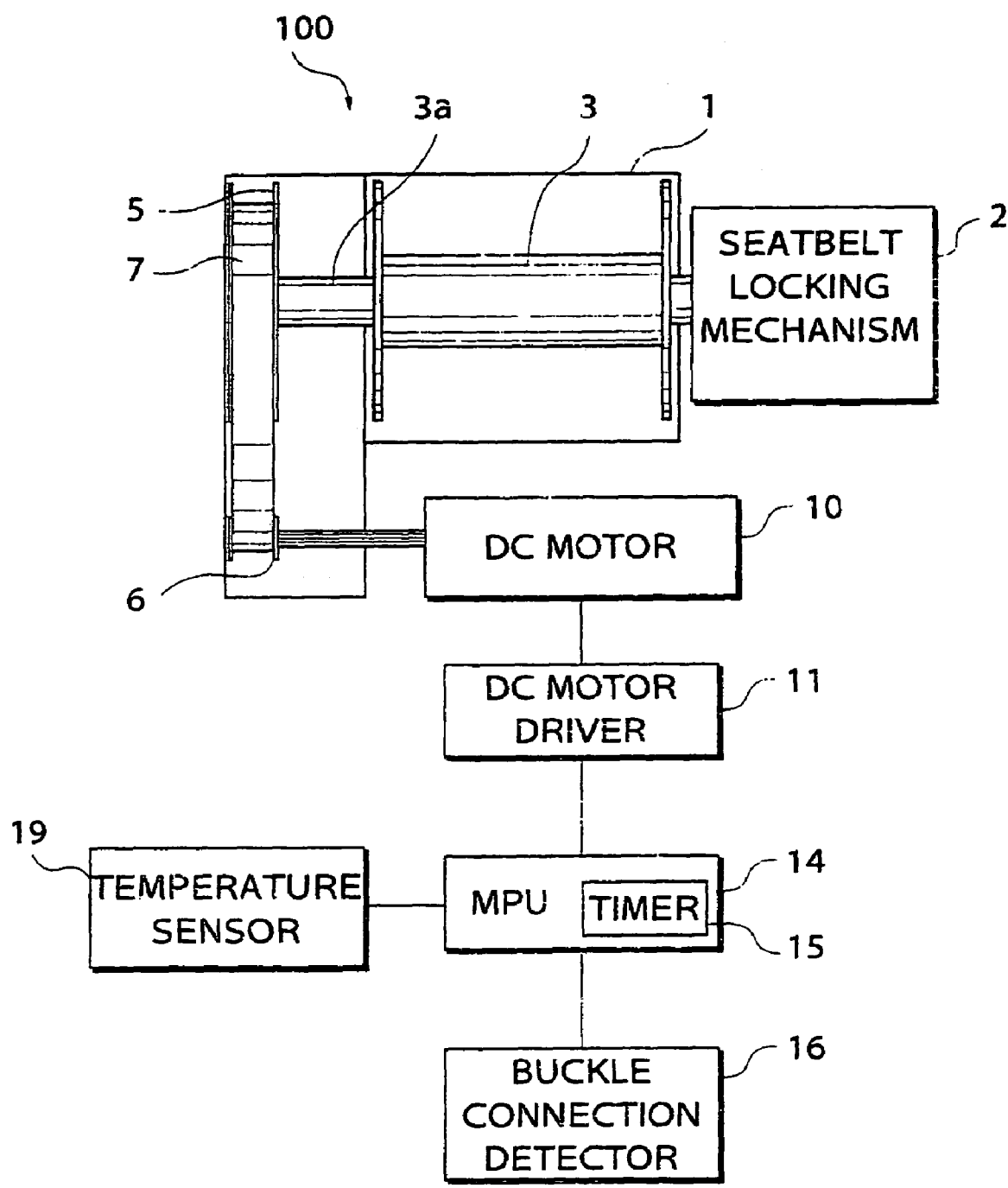
FIG. 1 is a block diagram schematically showing the arrangement of an electric retractor 100 provided in an automotive passenger restraint and protection apparatus according to a first embodiment of the invention.

Referring first to FIG. 1, there is shown the arrangement of an electric retractor 100 provided in an automotive passenger restraint and protection apparatus according to a first embodiment of the invention.

The seatbelt retractor 100 has a frame 1 in which is rotatably mounted a reel shaft (takeup shaft) 3 for retracting and protracting a seatbelt. Secured to an end of the reel shaft 3 is a known seatbelt locking mechanism 2 which is adapted to lock or stop the seatbelt from being protracted when a predetermined or higher degree of deceleration is applied to an automotive vehicle in which the present apparatus is installed or when the seatbelt is protracted at a predetermined or higher degree of acceleration.

The reel shaft 3 has a central shaft $3a$ coupled to a central shaft of a reel shaft pulley 5, which is in turn coupled to a DC motor pulley 6 via a power transmission belt 7.

The reel shaft pulley 5 and the DC motor pulley 6 each have an outer periphery thereof formed with a predetermined number of outer teeth, while the power transmission belt 7 has an inner periphery thereof formed with a predetermined number of inner teeth which are in mesh with the outer teeth of the reel shaft pulley 5 and the DC motor pulley 6.

The DC motor pulley 6 has a central shaft thereof coupled to a DC motor 10 such that the rotation of the DC motor 10 is transmitted to the reel shaft 3 via the DC motor pulley 6.

The DC motor 10 is fixed to the frame 1 at at least two points thereof, and is connected to an MPU (Micro Processing Unit) 14 via a DC motor driver 11 which rotatively drives the DC motor 10 in response to a PWM (Pulse Width Modulation) signal from the MPU 14.

Figure 2:
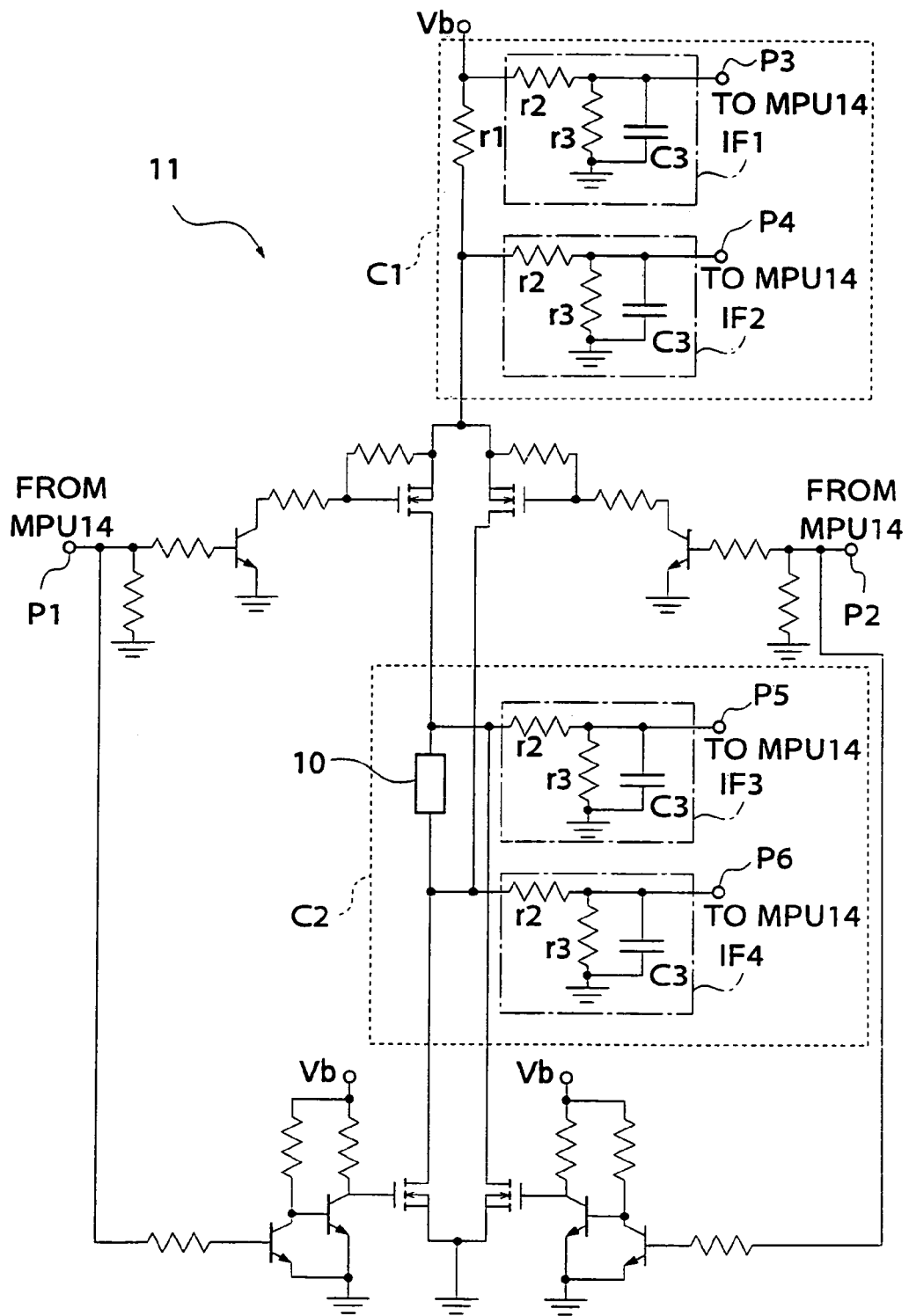
FIG. 2 is a circuit diagram showing the configuration of a DC motor driver 11 appearing in FIG. 1.

FIG. 2 is a circuit diagram showing the construction of the DC motor driver 11. In FIG. 2, reference numerals P1 and P2 designate input terminals for the PWM (Pulse Width Modulation) signal from the MPU 14, which has a frequency of 20 kHz, for example. Reference numerals P3 and P4 designate output terminals for detecting current, and P5 and P6 output terminals for detecting voltage, the terminals P1 to P6 being connected to the MPU 14. Supply voltage from a battery Vb shown in FIG. 2 is supplied to the DC motor 10. A plurality of transistors and FETs appearing in FIG. 2 are for selectively causing the DC motor 10 to be normally rotated or reversely rotated in response to the PWM signal from the MPU 14. More specifically, the DC motor driver 11 is constructed such that if a high-level control signal is delivered through the terminal P1 from the MPU 14, the DC motor 10 is rotated in the normal direction, whereby the seatbelt is retracted by the reel shaft 3, while if a high-level control signal delivered through the terminal P2 from the MPU 14, the DC motor 10 is rotated in the reverse direction, whereby the seatbelt is protracted by the reel shaft 3.

In FIG. 2, reference numeral C1 designates a current detecting circuit which detects current i flowing to the DC motor 10, based upon current flowing through a resistance r1. The current detecting circuit C1 is comprised of interface circuits (hereinafter abbreviated as "IFs") IF1 and IF2 which operate to remove current fluctuations or variations due to the influence of the PWM signal. The MPU 14 receives voltage signals from the IFs IF1 and IF2 and detects current i flowing to the DC motor 10 from these voltage signals.

In FIG. 2, reference numeral C2 designates a voltage measuring circuit 2 which measures terminal voltage across the DC motor 10, and is comprised of IFs IF3 and IF4 which operate to remove fluctuations or variations in the terminal voltage due to the influence of the PWM signal. The MPU 14 receives voltage signals from the IFs IF3 and IF4 and measures the terminal voltage across the DC motor 10 from these voltage signals.

The IFs IF1 to IF4 are each formed by a low-pass filter formed of a resistance r2, a resistance r3 smaller in resistance value than the resistance r2, and a capacitor c3, all the IFs having a cutoff frequency of 20 Hz, for example. By virtue of these IFs, the influence of the PWM signal output from the MPU 14 upon the current detecting circuit C1 and the voltage measuring circuit C2 is reduced to −60 dB, which is almost negligible for detection of current by the current detecting circuit C1 and detection of terminal voltage by the voltage measuring circuit C2.

Referring back to FIG. 1, the MPU 14 has a built-in timer 21 for measuring time. Connected to the MPU 14 are a buckle connection detector 16 which detects whether a tongue of the seatbelt has been attached to or mounted on the buckle and whether the tongue of the seatbelt has been disconnected from the buckle, and a temperature sensor 19 which detects temperature in the vicinity of the DC motor 10 or the temperature of the DC motor 10 itself.

FIG. 3 is a flowchart showing a fault diagnosis program executed by the MPU 14.

First, a flag FLAG, which, when set to 1, indicates that the DC motor driver 11 functions abnormally, and when set to 0, indicates that the DC motor driver 11 functions normally, is reset to 0 at a step S301.

Figure 4A:
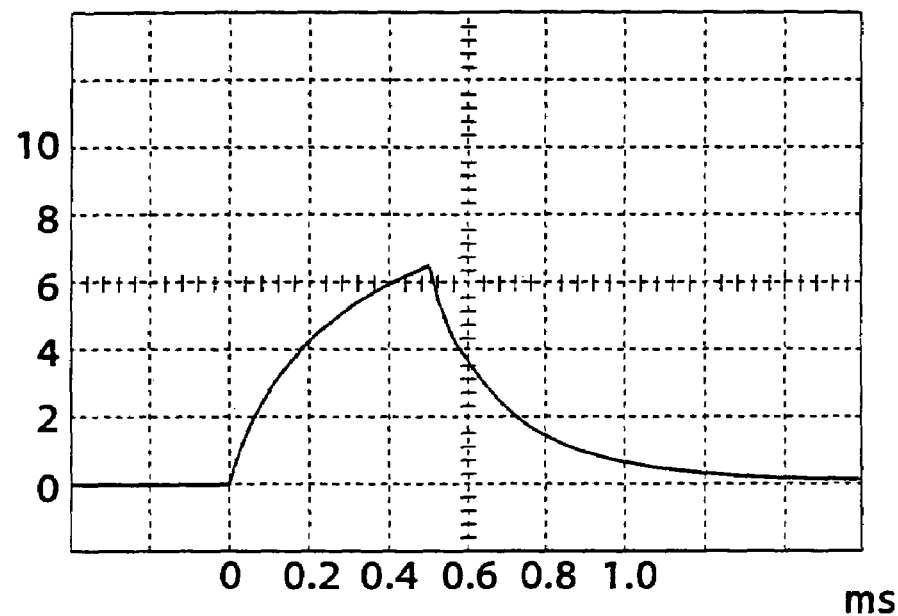
FIG. 4A is a graph showing an example of the waveform of voltage across terminals P3 and P4.

Then, a high-level signal, for example, a single pulse having a rectangular waveform and a pulse width of 0.5 ms is applied to the terminal P1 at a step S302, and the lapse of a predetermined time period (e.g. 0.2 ms) is waited after the application of the high-level signal at a step S303. Then, terminal voltage Va is measured from a value of current flowing between the terminals P3 and P4 at a step S304, and it is determined at a step S305 whether the measured terminal voltage Va falls within a range between 4 volts and 6 volts. An example of the terminal voltage between the terminals P3 and P4 is shown in FIG. 4A.

If the measured terminal voltage Va does not fall within the range between 4 volts and 6 volts, the flag FLAG is set to 1 at a step S309, followed by terminating the present processing. If the measured terminal voltage Va falls within the above range, the lapse of a predetermined time period (e.g. 0.4 ms) is waited at a step S306. During the waiting, the flag FLAG is held at 0 to indicate that the DC motor driver 11 is normal.

Then, terminal voltage Vb is again measured from a value of current then flowing between the terminals P3 and P4 at a step S307 followed by determining at a step S308 whether the measured terminal voltage Vb falls within a range between 3 volts and 5 volts. If it is determined at the step S308 that the measured terminal voltage Va does not fall within the above range, the flag FLAG is set to 1 at the step S309, followed by terminating the present processing. On the other hand, if it is determined that the measured terminal voltage Vb falls within the range between 3 volts and 5 volts, the flag FLAG is held at 0, followed by terminating the present processing.

The MPU 14 notifies the occupant through a display device or a warning light (not shown) whether the DC motor driver 11 is normal or abnormal, based upon the value of the flag FLAG which indicates results of the above described fault diagnosis. In the above described manner, the MPU 14 can perform fault diagnosis of the DC motor driver 16 including characteristics of the DC motor 10.

Although in the above described fault diagnosis program, the MPU 14 applies the high-level signal to the DC motor driver 11 through the input terminal P1, a similar fault diagnosis program is also executed by the MPU 14 by applying a high-level signal to the DC motor driver 16 through the other input terminal P2.

As described above, according to the first embodiment, after the high-level signal, e.g. a single pulse with a pulse width of 0.5 ms is applied from the MPU to the input terminal P1 to the DC motor driver 11, two kinds of the terminal voltage Va and Vb are measured based upon current flowing between the terminals P3 and P4, to determine, based upon the measured terminal voltage Va and Vb, whether the DC motor driver 11 is normal or abnormal. As a result, accurate fault diagnosis can be carried out. Further, based upon the value of the flag FLAG, results of the fault diagnosis are notified to the occupant by means of a display device or a warning light, whereby the occupant can notice a fault of the DC motor driver 11 and take appropriate measures.

Although in the present embodiment the terminal voltage is measured twice based upon current flowing between the terminals P3 and P4, the terminal voltage may be measured only once or three times or more. If the number of times of measurement is increased, more accurate fault diagnosis can be achieved.

Second to thirteenth embodiments of the invention will be described hereinbelow. In the description of these embodiments, elements and parts as well as steps corresponding to those in the first embodiment described above are designated by identical reference numerals, detailed description of which is omitted. In the following, only those which differ from the first embodiment will be described.

Second Embodiment

An automotive passenger restraint and protection apparatus according to a second embodiment of the invention includes an electric retractor which is identical in construction with the electric retractor 100 of the first embodiment described above, description of which is therefore omitted. The second embodiment is distinguished from the first embodiment only in the manner of fault diagnosis executed by the MPU 14.

A manner of fault diagnosis according to the present embodiment, executed by the MPU 14 will be described hereinbelow.

Figure 5:
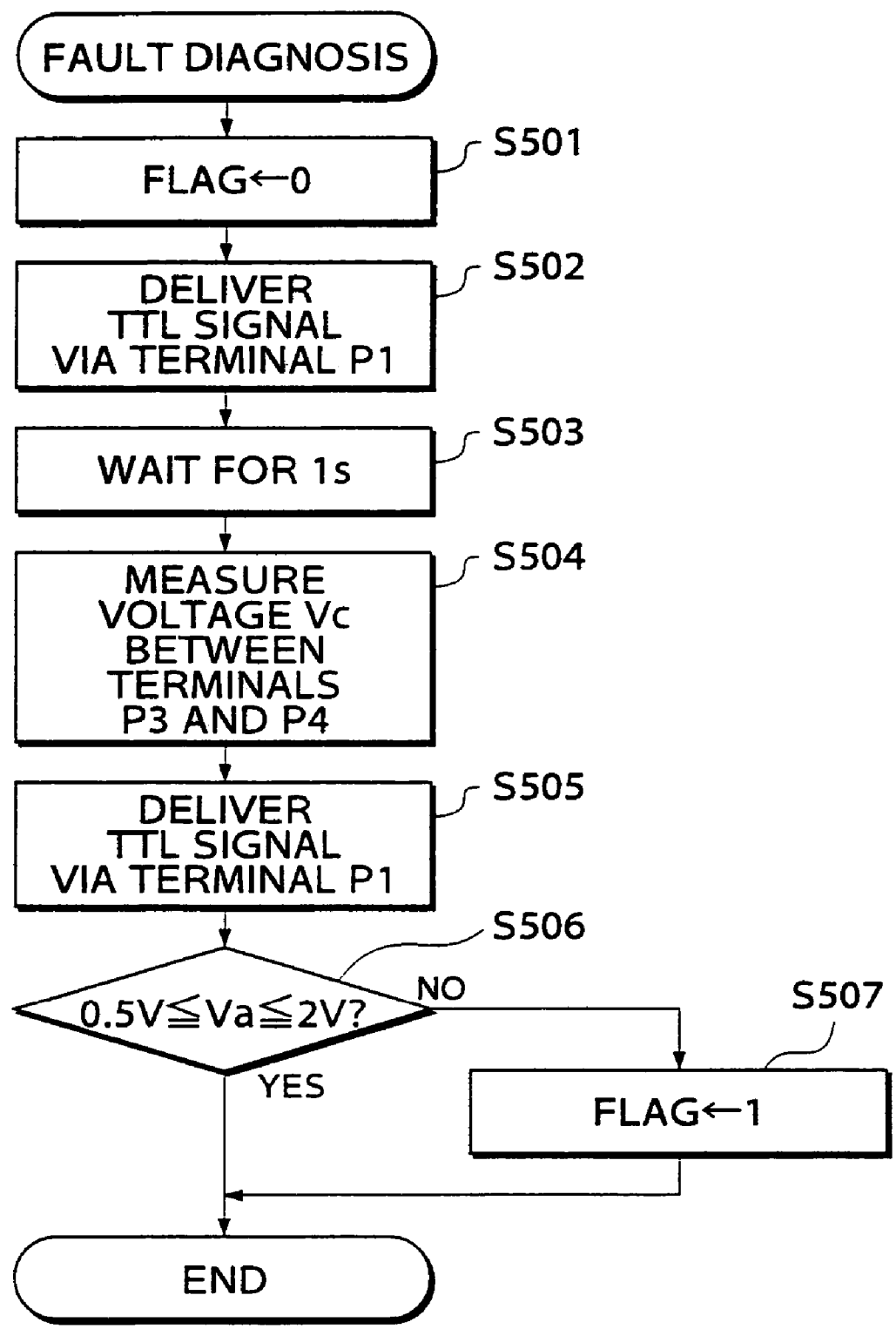
FIG. 5 is a flowchart showing a fault diagnosis program according to a second embodiment of the invention, executed by the MPU 14.

FIG. 5 is a flowchart showing a fault diagnosis program according to the present embodiment, executed by the MPU 14.

Figure 4B:
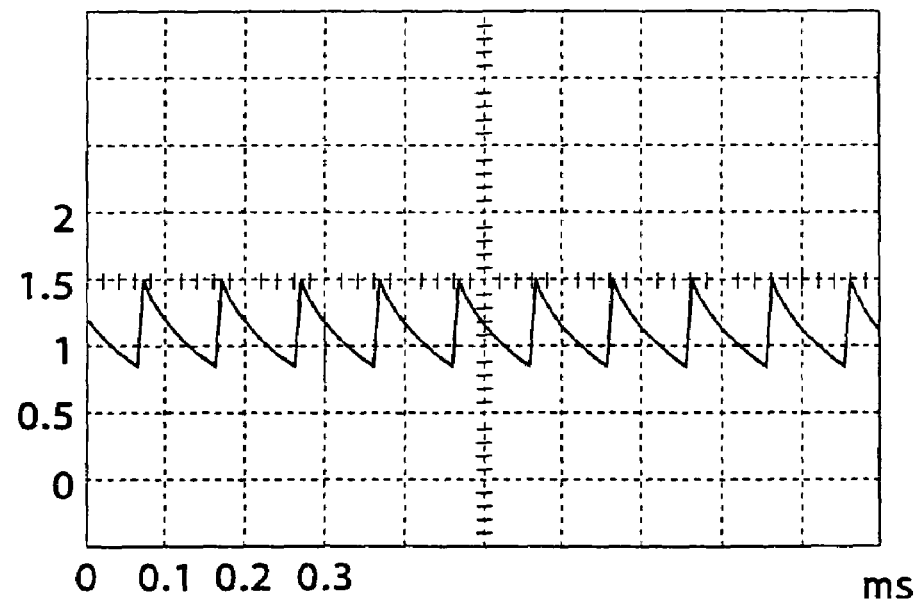
FIG. 4B is a graph showing another example of the waveform of voltage across terminals P3 and P4.

First, the flag FLAG is reset to 0 at a step S501. Then, a signal of a TTL (Transistor Transistor Level) level having a frequency of 10 kHz and a duty factor of 10%, for example is applied to the terminal P1 at a step S502, and the lapse of a predetermined time period (e.g. 1 sec) is waited after the application of the TTL level signal at a step S503. An example of the waveform of terminal voltage then applied between the terminals P3 and P4 is shown in FIG. 4B.

Then, terminal voltage Vc is measured from a value of current flowing between the terminals P3 and P4 at a step S504, followed by stopping the application of the TTL level signal to the terminal P1 at a step S505. Then, it is determined at a step S506 whether the measured terminal voltage Vc falls within a range between 0.5 volts and 2 volts.

If the measured terminal voltage Vc does not fall within the range between.0.5 volts and 2 volts, the flag FLAG is set to 1 at a step S507, followed by terminating the present processing. If the measured terminal voltage Vc falls within the above range, the flag FLAG is held at 0 to indicate that the DC motor driver 11 is normal, followed by terminating the present processing.

The MPU 14 notifies the occupant through a display device or a warning light (not shown) whether the DC motor driver 11 is normal or abnormal, based upon the value of the flag FLAG which indicates results of the above described fault diagnosis. In the above described manner, the MPU 14 can perform fault diagnosis of the DC motor driver 16 including characteristics of the DC motor 10.

Although in the above described fault diagnosis program, the MPU 14 applies the TTL level signal to the DC motor driver 11 through the input terminal P1, a similar fault diagnosis program is also executed by the MPU 14 by applying a TTL level signal to the DC motor driver 16 through the other input terminal P2.

As described above, according to the second embodiment, after the application of a TTL level signal having a frequency of 10 kHz and a duty factor of 10%, for example, to the terminal P1, terminal voltage Vc is measured from a value of current flowing between the terminals P3 and P4, to determine whether the measured terminal voltage Vc falls within a predetermined range. Based upon results of the determination, whether the DC motor driver 11 is normal or abnormal is determined. As a result, accurate fault diagnosis can be carried out. Further, based upon the value of the flag FLAG, results of the fault diagnosis are notified to the occupant by means of a display device or a warning light, whereby the occupant can notice a fault of the DC motor driver 11 and take appropriate measures.

Third Embodiment

An automotive passenger restraint and protection apparatus according to a third embodiment of the invention includes an electric retractor 300 which is distinguished from the electric retractor 100 of the first embodiment only in the construction of the DC motor driver 11. Except for this, the construction of the electric retractor 300 is identical with the electric retractor, description of which is therefore omitted.

Figure 6:
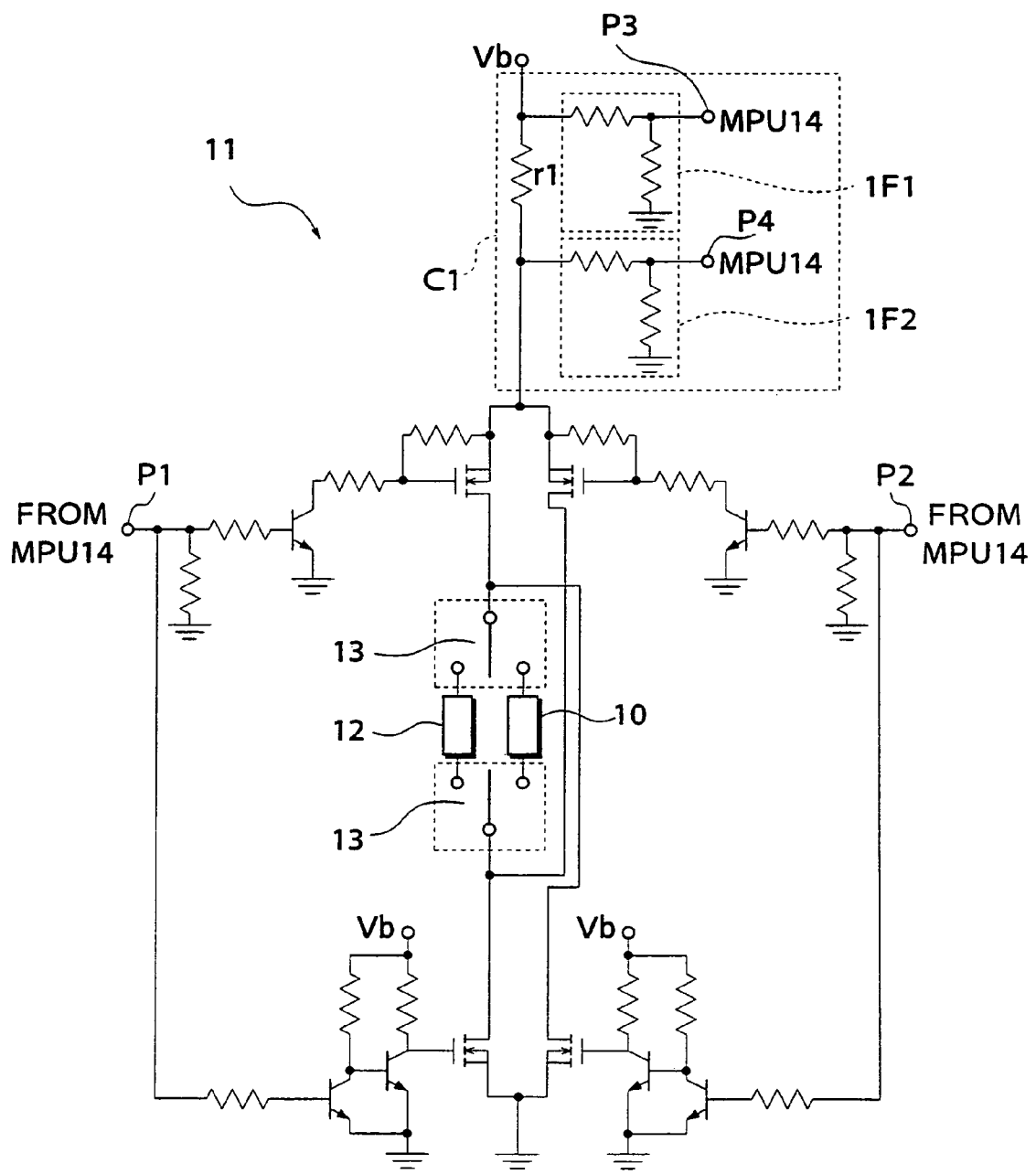
FIG. 6 is a flowchart showing the configuration of a DC motor driver 11 employed in a third embodiment of the invention.

FIG. 6 is a circuit diagram of the construction of the DC motor driver 11 according to the present embodiment.

The construction of the DC motor driver 11 employed in the present embodiment is distinguished from that of the DC motor driver 11 employed in the first embodiment (FIG. 2) in that the IFs IF3 and IF4 are omitted, and a load 12 for use in the fault diagnosis is connected in parallel with the DC motor 10, and a switch 13 is provided for selecting the DC motor 10 or the load 12. The load has load characteristics equivalent to electrical characteristics of the DC motor 10. Except for these points, the construction of the DC motor driver 11 of the present embodiment is identical with that shown in FIG. 2, description of which is therefore omitted.

The switch 13 is adapted to operate in response to a control signal from the MPU 14 to be selectively connected to the DC motor 10 side or to the load 12 side.

Figure 7:
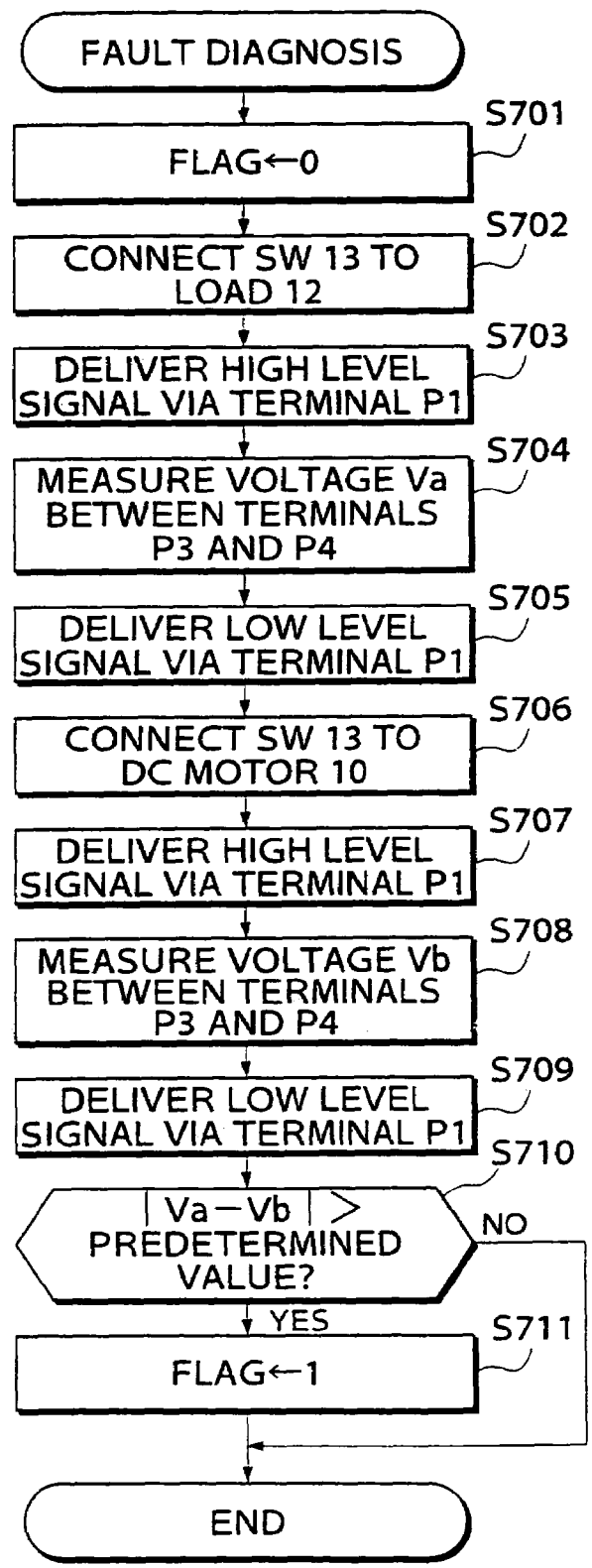
FIG. 7 is a flowchart showing a fault diagnosis program according to the third embodiment of the invention, executed by the MPU 14.

FIG. 7 is a flowchart showing a fault diagnosis program executed by the MPU 14.

First, the flag FLAG is reset to 0 at a step S701.

Then, the switch 13 is connected to the load 12 side at a step S702, and a high-level signal, for example, a single pulse having a rectangular wavefor and a pulse width of 0.5 ms, is applied to the terminal P1 at a step S703. Then, terminal voltage Va is measured from a value of current flowing between the terminals P3 and P4 at a step S704, followed by applying a low-level signal to the terminal P1 at a step S705.

Then, the switch 13 is connected to the DC motor 10 side at a step S706, and then again a high-level signal, for example, a single pulse having a rectangular waveform and a pulse width of 0.5 ms, is applied to the terminal P1 at a step S707. Then, terminal voltage Vb is measured based upon a value of current flowing between the terminals P3 and P4 at a step S708, followed by applying a low-level signal to the terminal P1 at a step S709.

Then, it is determined at a step S710 whether the absolute value of the difference between the measured terminal voltage Va and the measured terminal voltage Vb is larger than a predetermined value. The predetermined value is set based upon temperature in the vicinity of the DC motor 10 and the load 12 or the temperature of the DC motor 10 and the load 12 themselves.

If it is determined at the step S710 that the absolute value is not larger than the predetermined value, the present program is terminated so that the flag FLAG is held at 0, whereas if the absolute value is not larger than the predetermined value, the flag FLAG is set to 1 at a step S711, followed by terminating the present processing.

The MPU 14 notifies the occupant through a display device or a warning light (not shown) whether the DC motor driver 11 is normal or abnormal, based upon the value of the flag FLAG which indicates results of the above described fault diagnosis. In the above described manner, the MPU 14 can perform fault diagnosis of the DC motor driver 16 including characteristics of the DC motor 10.

Although in the above described fault diagnosis program, the MPU 14 applies the high-level signal and low-level signal to the DC motor driver 11 through the input terminal P1, a similar fault diagnosis program is also executed by the MPU 14 by applying a high-level signal and a low-level signal to the DC motor driver 16 through the other input terminal P2.

As described above, according to the third embodiment, terminal voltage Va applied when the load 12 is connected and terminal voltage Vb applied when the DC motor 10 is connected are measured, and based upon whether the absolute value of the difference between the measured terminal voltage Va and the measured terminal voltage Vb, it is determined whether the DC motor driver 11 is normal or abnormal. As a result, accurate fault diagnosis can be carried out. Further, results of the fault diagnosis are notified to the occupant by means of a display device or a warning light, whereby the occupant can notice a fault of the DC motor driver 11 and take appropriate measures.

Although in the third embodiment, as the high-level signal, a single pulse having a pulse width of 0.5 ms is applied (steps S703 and S707), a pulse train having a frequency of 10 kHz and a duty factor of 10%, for example, may be applied, instead.

Fourth Embodiment

An automotive passenger restraint and protection apparatus according to a fourth embodiment of the invention includes an electric retractor 400 which is distinguished from the electric retractor 100 of FIG. 1 in that a warning device is connected to the MPU 14 for giving warning by means of a warning buzzer, a warning light or the like, in place of the temperature sensor 19 shown in FIG. 1, and except for this, the construction of the electric retractor 400 is identical with that of FIG. 1, illustration and description of which are therefore omitted.

Figure 8:
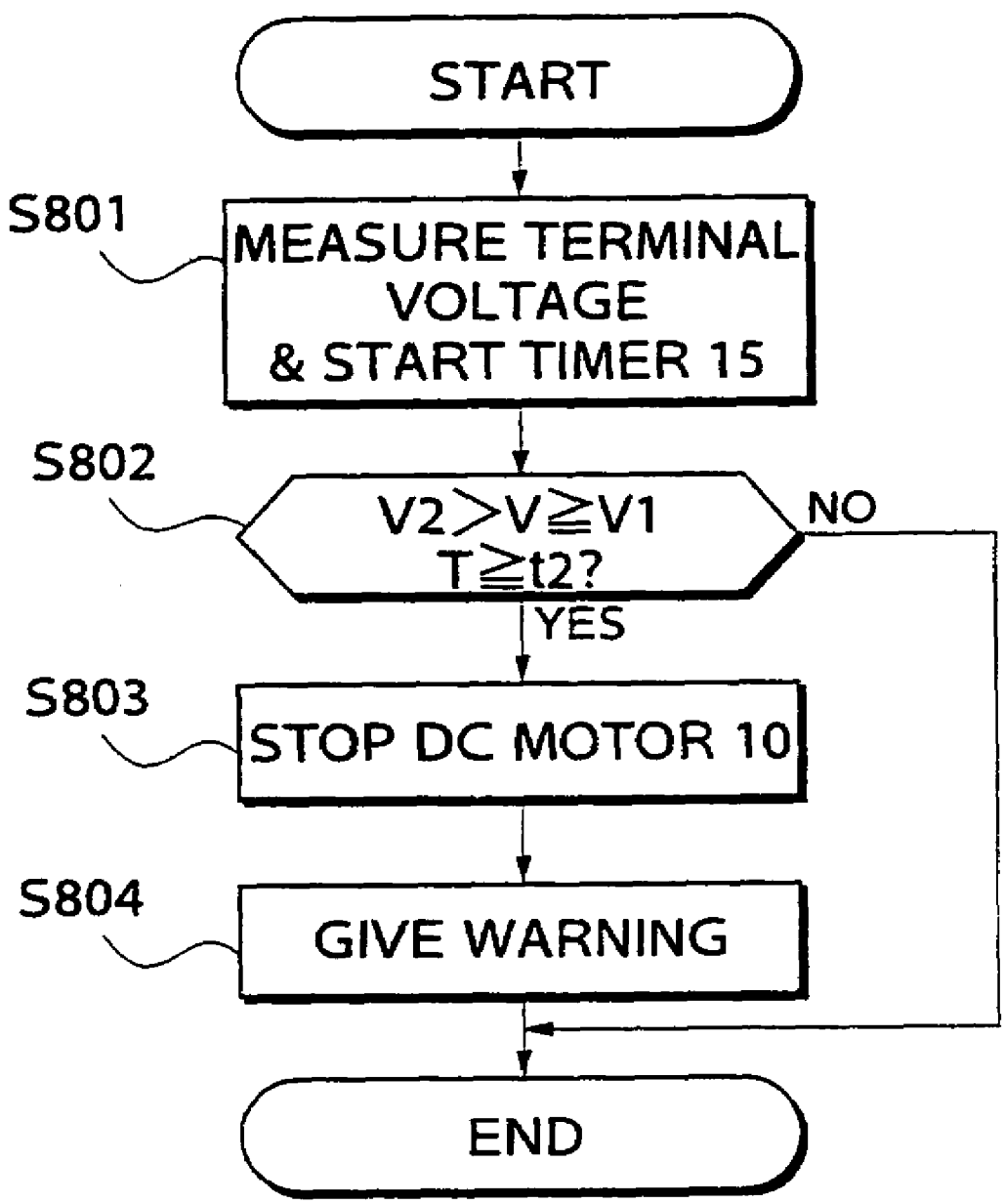
FIG. 8 is a flowchart showing a fault diagnosis program according to a fourth embodiment of the invention executed by the MPU 14.

FIG. 8 is a flowchart showing a fault diagnosis program according to the fourth embodiment, executed by the MPU 14. This program is stored in a memory, not shown, within the MPU 14 and executed at predetermined time intervals t1 (e.g. 15 sec).

First, terminal voltage V across the DC motor 10 is measured by the voltage detecting circuit C2 and at the same time the timer 15 is started to measure elapsed time at a step S801.

Then, it is determined at a step S802 whether the measured terminal voltage V has continuously fallen within a range between a first predetermined value V1 (e.g. 5 volts) and a second predetermined value V2 (e.g. 10 volts) over a predetermined time period t2 (e.g. 10 sec). The first and second predetermined values V1 and V2 are both higher than a range assumed when the DC motor 10 and the DC motor driver 11 are functioning normally, but are set to values defining a range to be assumed when the DC motor 10 runs idle due to abnormality of the power transmission mechanism or the like and the DC motor 10 and the DC motor driver 11 are not truly faulty. In the following description, the term "fault" indicates a state where the DC motor 10 runs idle due to abnormality of the power transmission mechanism or the like. If the measured terminal voltage V has not continuously fallen within the range between the first predetermined value V1 and the second predetermined value V2 over the predetermined time period t2, it is determined that there is no "fault", and then the present program is immediately terminated, whereas if the measured terminal voltage V has continuously fallen within the range between the first predetermined value V1 and the second predetermined value V2 over the predetermined time period t2, it is determined that there is a "fault", and then a PWM signal is delivered from the MPU 14 to the DC motor driver 11 to stop the driving of the DC motor 10 at a step S803, and a control signal is delivered from the MPU 14 to the warning device to give warning by the warning buzzer, the warning light or the like at a step S804, followed by terminating the present processing.

Figure 9:
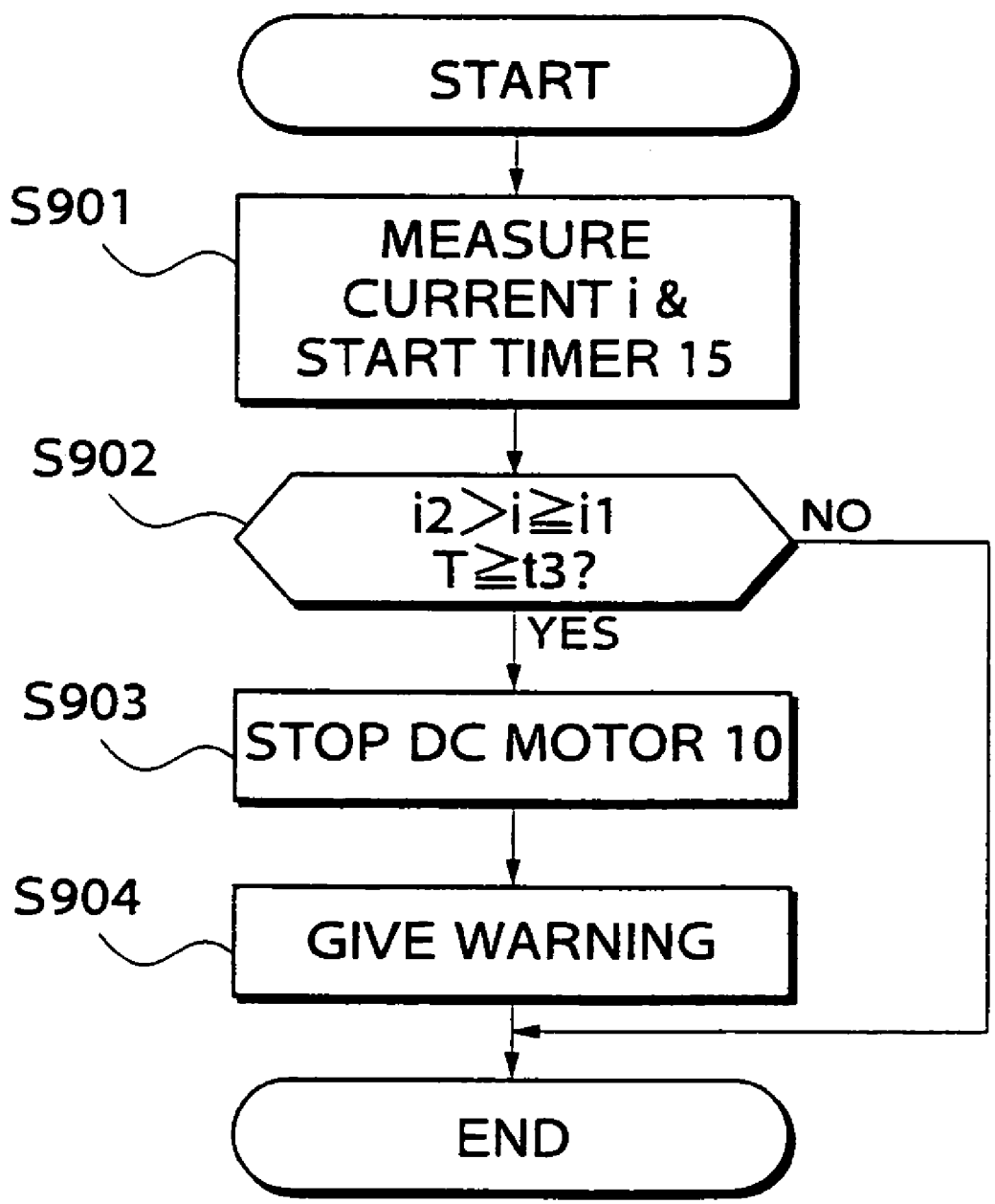
FIG. 9 is a flowchart showing another fault diagnosis program according to the fourth embodiment.

FIG. 9 is a flowchart showing another fault diagnosis program according to the present embodiment. This program is stored in a memory, not shown, within the MPU 14 and executed at predetermined time intervals t1 (e.g. 15 sec).

First, current i flowing to the DC motor 10 is measured by the current detecting circuit C1 and at the same time the timer 15 is started to measure elapsed time at a step S901.

Then, it is determined at a step S902 whether the measured current i has continuously fallen within a range between a first predetermined value i1 (e.g. 2 amperes) and a second predetermined value i2 (e.g. 4 amperes) over a predetermined time period t3 (e.g. 10 sec). The first and second predetermined values i1 and i2 are both larger than a range assumed when the DC motor 10 and the DC motor driver 11 are functioning normally, but are set to values defining a range to be assumed when the DC motor 10 runs idle due to abnormality of the power transmission mechanism or the like and the DC motor 10 and the DC motor driver 11 are not truly faulty. In the following description, the term "fault" indicates a state where the DC motor 10 runs idle due to abnormality of the power transmission mechanism or the like. If the measured current i has not continuously fallen within the range between the first predetermined value i1 and the second predetermined value i2 over the predetermined time period t3, it is determined that there is no "fault", and then the present program is immediately terminated, whereas if the measured current i has continuously fallen within the range between the first predetermined value i1 and the second predetermined value i2 over the predetermined time period t3, it is determined that there is a "fault", and then the processing proceeds to a step S903. The step S903 and a step S904 are identical with the above described steps S803 and S804 of FIG. 8, description of which is therefore omitted.

As described above, according to the present embodiment, if the terminal voltage V has continued to fall within the range between the first and second predetermined values V1 and V2 to be assumed when the DC motor 10 runs idle due to abnormality of the power transmission mechanism or the like, over the predetermined time period t2, or if the current i has continued to fall within the range between the first and second predetermined values i1 and i2 to be assumed when the DC motor 10 runs idle due to abnormality of the power transmission mechanism or the like, over the predetermined time period t3, it is determined that there is a "fault", that is, the DC motor 10 has been running idle for a considerable time period so that the DC motor 10 or the DC motor driver 11 can subsequently become truly faulty, and a warning is given by the warning device. As a result, accurate fault diagnosis can be achieved and the detected fault can be notified to the occupant.

As a variation of the present embodiment, the determination of the step S802 of FIG. 8 and that of the step S902 of FIG. 9 may be combined together to carry out both of these determinations. For example, it may be determined that there is a "fault" if the measured terminal voltage V has continuously fallen within the range between the first predetermined value V1 and the second predetermined value V2 over the predetermined time period t2 and at the same time the measured current i has continuously fallen within the range between the first predetermined value i1 and the second predetermined value i2 over the predetermined time period t3.

Fifth Embodiment

An electric retractor 500 provided in an automotive passenger restraint and protection apparatus according to a fifth embodiment of the invention is distinguished from the electric retractor of FIG. 1 in that a torque sensor 4, a tension sensor 9, and a warning device 7 are additionally provided.

Figure 10:
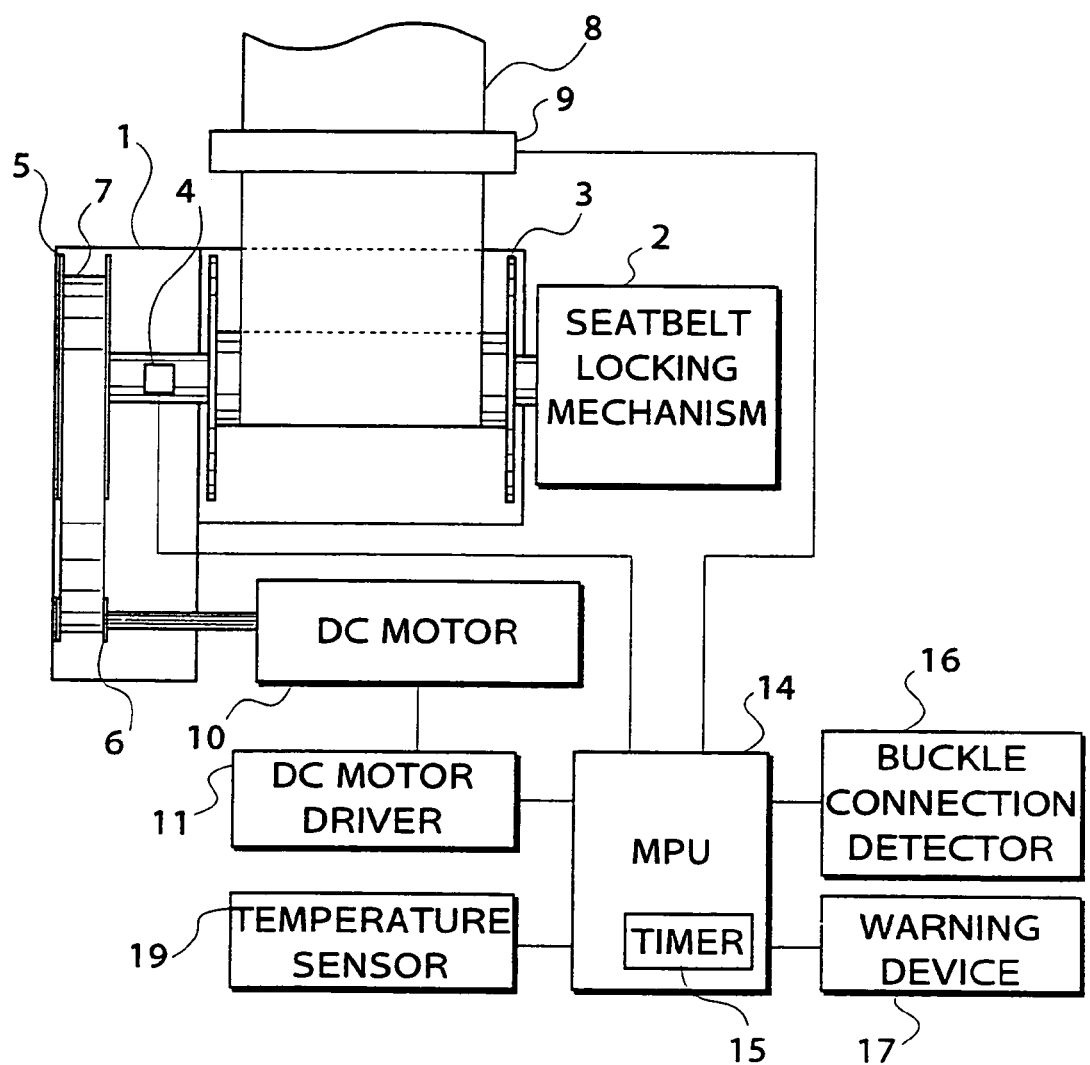
FIG. 10 is a block diagram schematically showing the arrangement of an electric retractor 500 provided in an automotive passenger restraint and protection apparatus according to a fifth embodiment of the invention.

The electric retractor 500 according to the fifth embodiment will now be described with reference to FIG. 10 showing the arrangement of the same.

As shown in FIG. 10, the electric retractor 500 includes the torque sensor 4, the tension sensor 9, the warning device 17, the buckle connection detector 16, and the temperature sensor, 19, which are connected to the MPU 14.

The warning device 17 is for giving warning when an abnormality of the DC motor 10 is detected by the MPU 14 in a manner described hereinafter.

The tension sensor 9 senses tension α of the seatbelt 8 and delivers a signal indicative of the sensed tension α to the MPU 14. The torque sensor 4 senses rotational torque β of the reel shaft 3 and delivers a signal indicative of the sensed rotational torque β to the MPU 14.

The construction of the DC motor driver 11 employed in the fifth embodiment is identical with that shown in FIG. 1, except that a switch is provided between the battery Vb and the DC motor 10, for selectively connecting or disconnecting the former to or from the latter to supply of the supply voltage to the DC motor 10 or stop the supply. Illustration of the construction of the DC motor driver 11 is therefore omitted.

Figure 11:
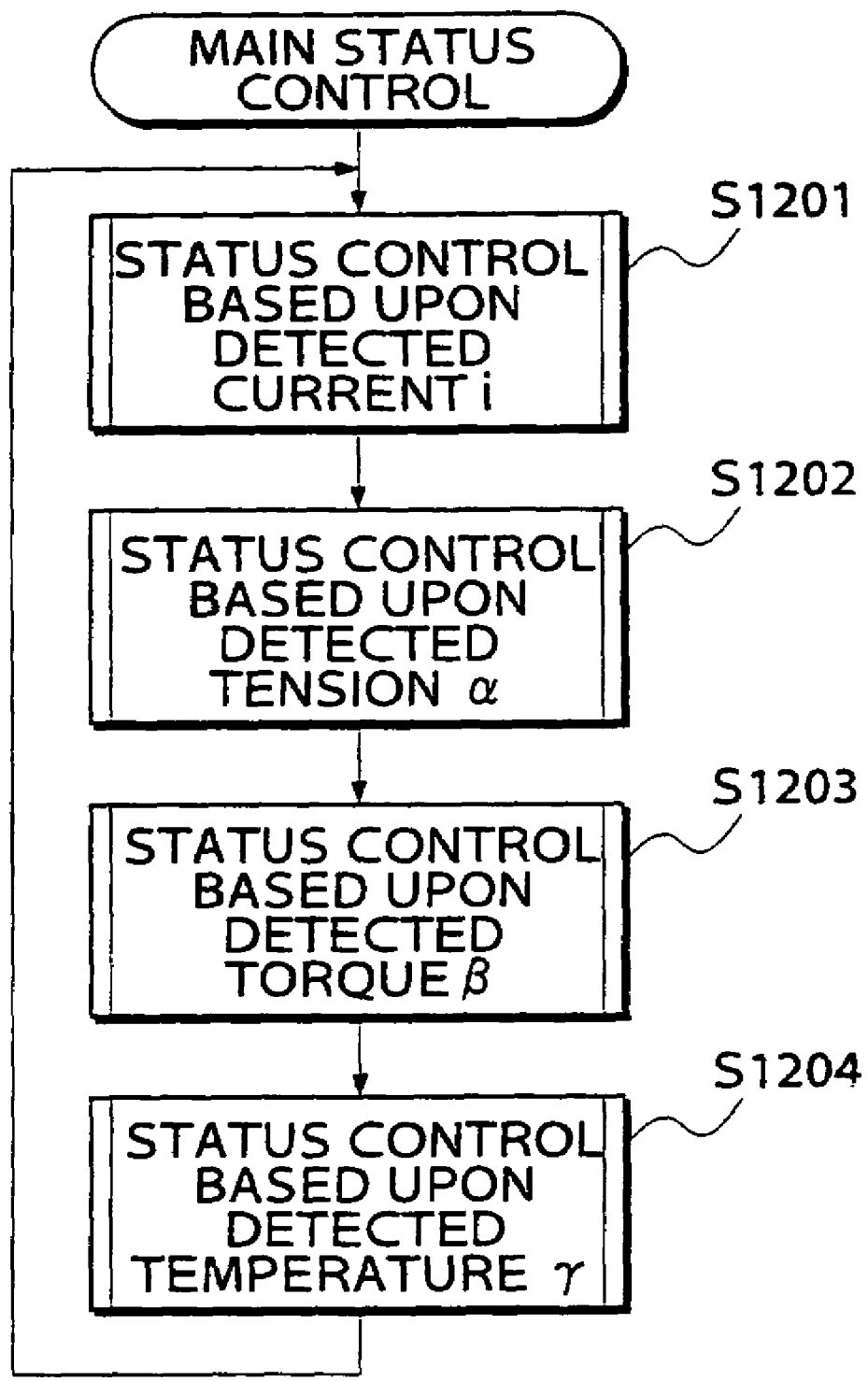
FIG. 11 is a flowchart showing a main status control program according to the fifth embodiment, executed by the MPU 14.

FIG. 11 is a flowchart showing a main status control program according to the fifth embodiment, executed by the MPU 14. This control program is executed every predetermined time period.

First, status control is executed based upon results of a determination of the current i flowing to the DC motor 10 at a step S1201. Details of the status control will be described with reference to FIG. 12. Upon the start of the status control at the step S1201, the timer 15 starts measuring time t elapsed after the start of execution of the status control program at the step S1201.

Then, status control is executed based upon results of the detection of the tension α of the seatbelt 8 by the tension sensor 9 at a step S1202. Details of the status control at the step S1202 will be described with reference to FIG. 13. Upon the start of the status control at the step S1202, the timer 15 starts measuring time t elapsed after the start of execution of the status control program at the step S1202.

Then, status control is executed based upon results of the detection of the rotational torque β of the reel shaft 3 by the torque sensor 4 at a step S1203. Details of the status control at the step S1203 will be described with reference to FIG. 14. Upon the start of the status control at the step S1203, the timer 15 starts measuring time t elapsed after the start of execution of the status control program at the step S1203.

Lastly, status control is executed based upon results of the temperature γ of the temperature in the vicinity of the DC motor 10 or the temperature of the DC motor 10 itself at a step S1204, followed by the program returning to the step S1201. Details of the status control at the step S1204 will be described with reference to FIG. 15. Upon the start of the status control at the step S1204, the timer 15 starts measuring time t elapsed after the start of execution of the status control program at the step S1204.

Figure 12:
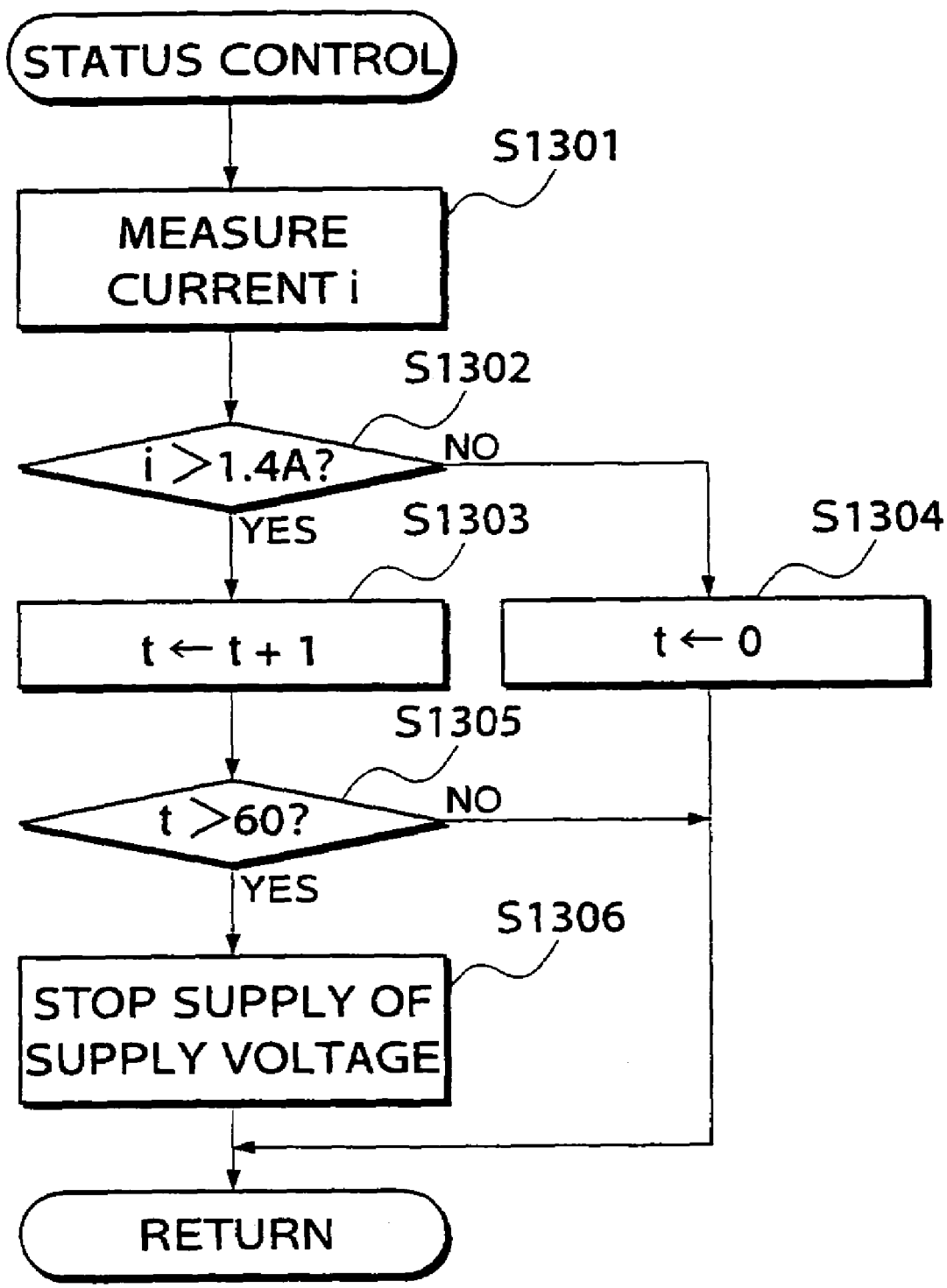
FIG. 12 is a flowchart showing a status control program executed at a step S1201 in FIG. 11.

FIG. 12 is a flowchart showing the status control program executed at the step S1201.

First, the current i flowing to the DC motor 10 is detected by the current detecting circuit C1 at a step S1301, and it is determined whether the detected current i exceeds a predetermined value (e.g. 1.4 amperes). If the current i does not exceed the predetermined value, it is determined that the DC motor 10 is functioning normally, and then the time t measured by the timer 15 after the start of the present status control program is reset to 0 at a step S1304, followed by terminating the present processing. On the other hand, if the detected current i exceeds the predetermined value, the value of the timer 15 is incremented by 1 at a step S1303.

Then, it is determined at a step S1305 whether the elapsed time t exceeds a predetermined time period t (e.g. 60 sec). If the former does not exceed the latter, it is determined that the DC motor 10 is functioning normally, and the present program is immediately terminated, whereas if the former exceeds the latter, it is determined that the DC motor 10 is abnormal, and then the switch 35 of the DC motor driver 11 is operated to stop the supply of the supply voltage from the battery Vb to the DC motor 10 at a step S1306, followed by terminating the present processing.

According to the above status control program (step S1201), if the current i flowing to the DC motor 10 has continued to exceed the predetermined value (1.4 amperes) over the predetermined time period (60 sec), it is determined that the DC motor 10 is abnormal, and then the supply of the supply voltage from the battery Vb to the DC motor 10 is stopped. Therefore, it is possible to prevent the DC motor 10 from becoming faulty.

Figure 13:
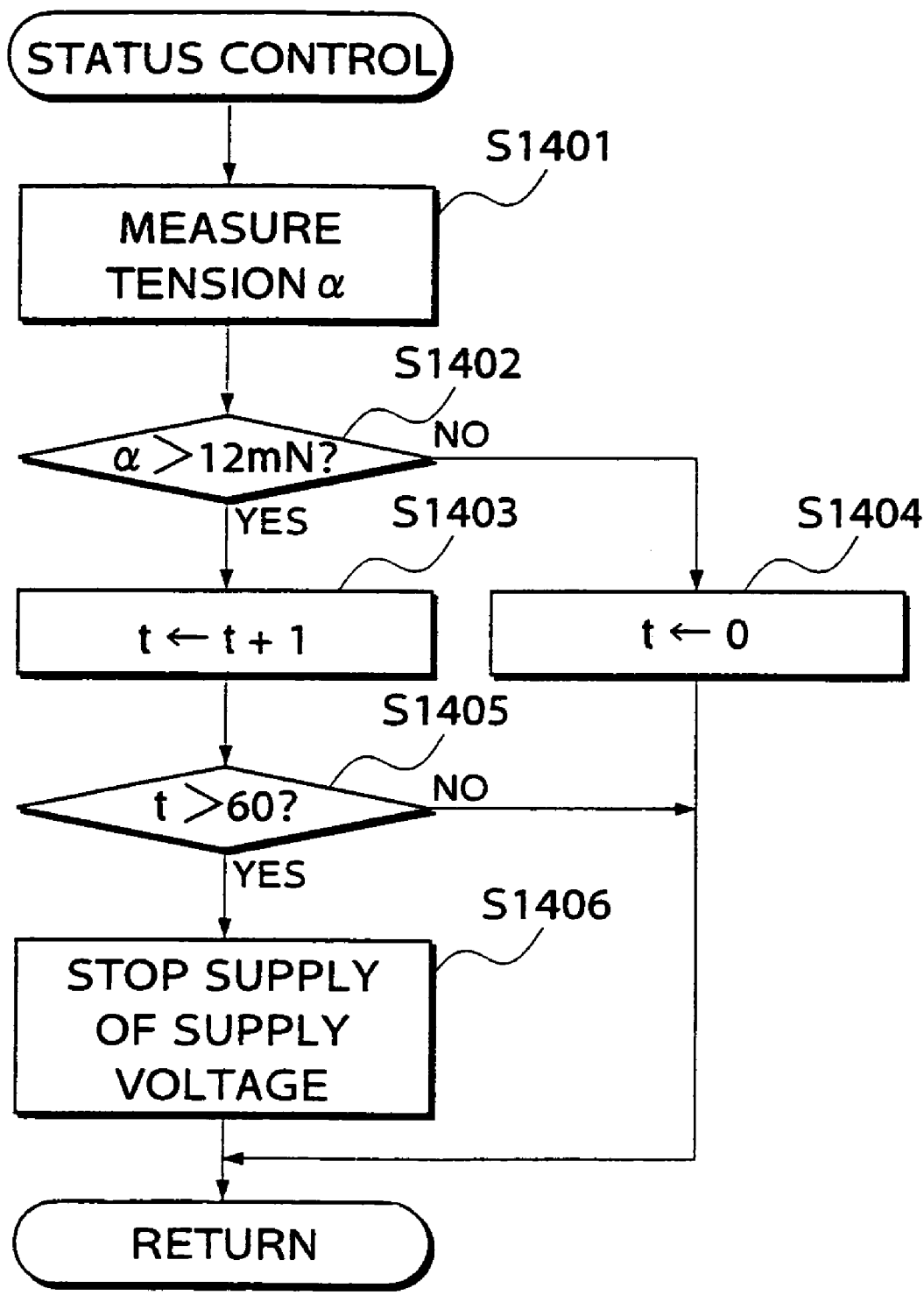
FIG. 13 is a flowchart showing a status control program executed at a step S1202 in FIG. 11.

FIG. 13 is a flowchart showing the status control program executed at the step S1202.

First, the tension α of the seatbelt 8 is sensed by the tension sensor 9 at a step S1401, and it is determined at a step S1402 whether the sensed tension α is larger than a predetermined value (e.g. 12 mN). If the sensed tension α is not larger than the predetermined value, it is determined that the DC motor 10 is functioning normally, and then the processing proceeds to a step S1404. On the other hand, if the sensed tension α is larger than the predetermined value, the processing proceeds to a step S1403. The steps S1403 to S1406 are identical with the steps S1303 to S1306 of FIG. 12 described above, description of which is therefore omitted.

According to the above status control program (step S1202), if the sensed tension α has continued to be larger than the predetermined value (12 mN) over the predetermined time period ( 60 sec), it is determined that the DC motor 10 is abnormal, and then the supply of the supply voltage from the battery Vb to the DC motor 10 is stopped. Therefore, it is possible to prevent the DC motor 10 from becoming faulty.

Figure 14:
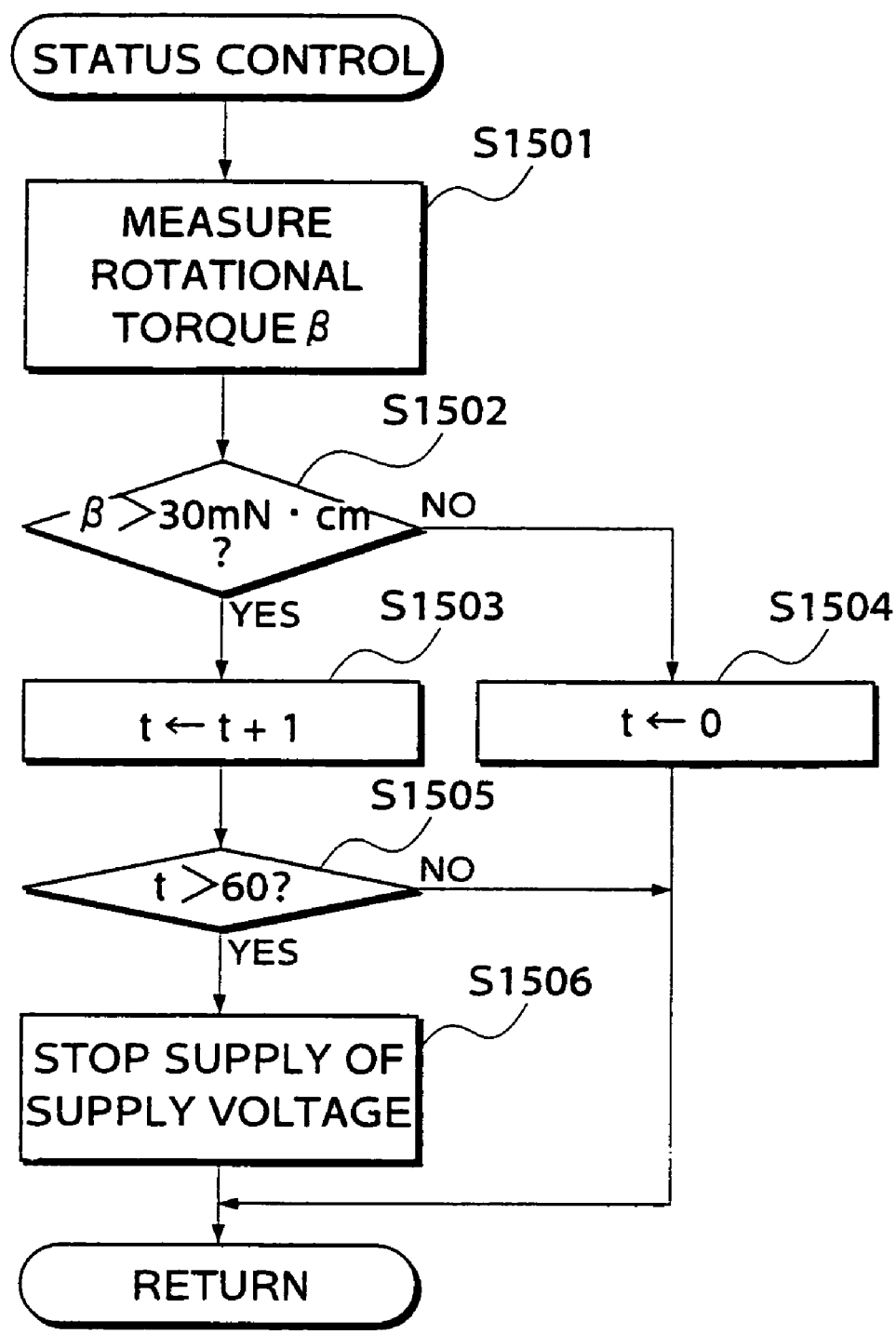
FIG. 14 is a flowchart showing a status control program executed at a step S1203 in FIG. 11.

FIG. 14 is a flowchart showing the status control program executed at the step S1203.

First, the rotational torque β of the reel shaft 3 is sensed by the torque sensor 4 at a step S1501, and it is determined at a step S1502 whether the sensed rotational torque β is larger than a predetermined value (e.g. 30 mN·cm). If the sensed rotational torque β is not larger than the predetermined value, it is determined that the DC motor 10 is normal, and then the processing proceeds to a step S1504, whereas if the sensed rotational torque β is larger than the predetermined value, the processing proceeds to a step S1503. The steps S1503 to S1506 are identical with the steps S1303 to S1306 of FIG. 12 described above, description of which is therefore omitted.

According to the above status control program (step S1203), if the sensed rotational torque β has continued to be larger than the predetermined value (30 mN·cm) over the predetermined time period (60 sec), it is determined that the DC motor 10 is abnormal, and then the supply of the supply voltage from the battery Vb to the DC motor 10 is stopped. Therefore, it is possible to prevent the DC motor 10 from becoming faulty.

Figure 15:
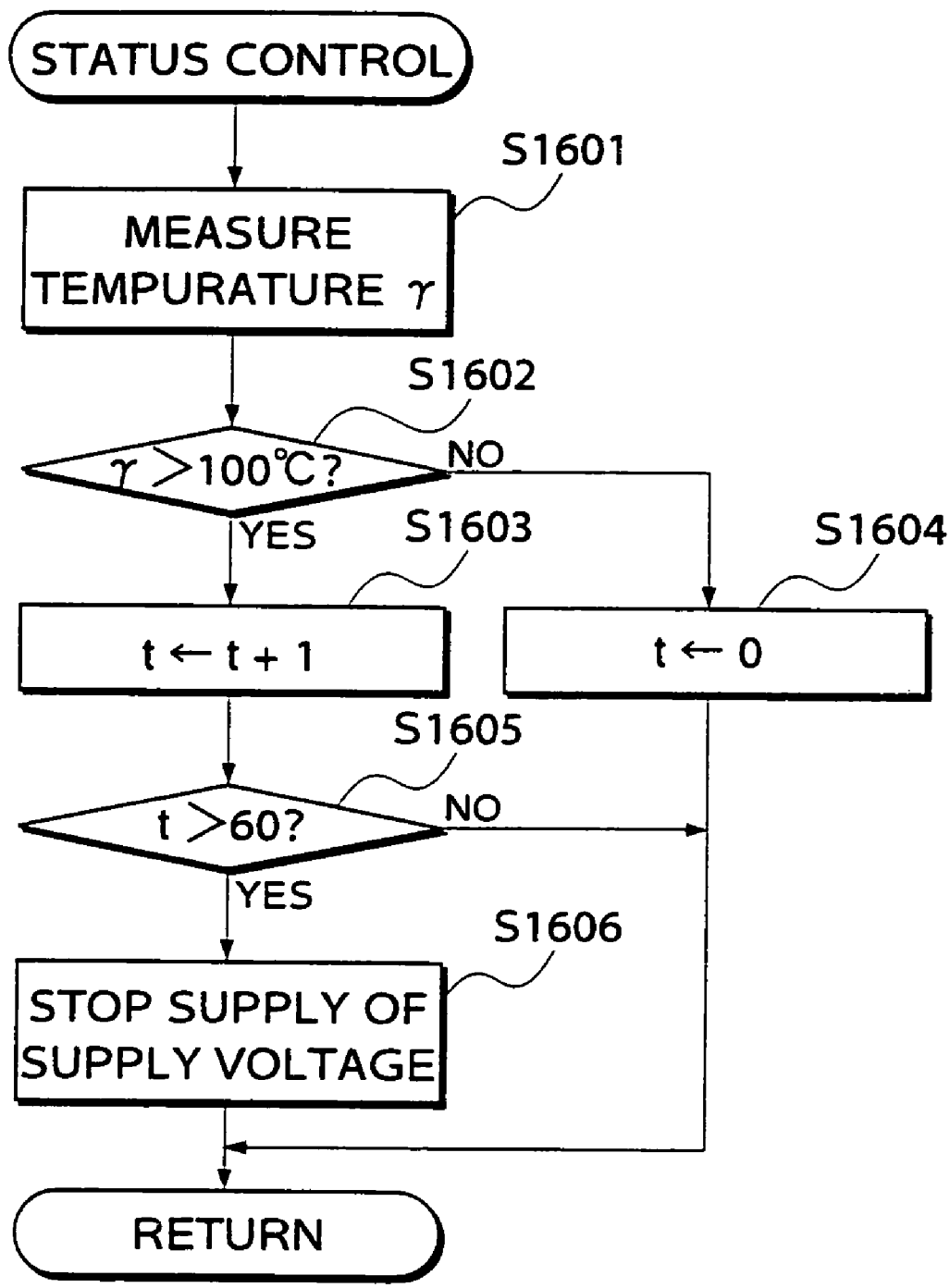
FIG. 15 is a flowchart showing a status control program executed at a step S1204 in FIG. 11.

FIG. 15 is a flowchart showing the status control program executed at the step S1204.

First, the temperature 7 in the vicinity of the DC motor 10 or the temperature of the DC motor 10 itself is sensed by the temperature sensor 19 at a step S1601, and it is determined at a step S1602 whether the sensed temperature γ exceeds a predetermined value (e.g. 100° C.). If the sensed temperature γ does not exceed the predetermined value, it is determined that the DC motor 10 is normal, and then the processing proceeds to a step S1604, whereas if the sensed temperature γ exceeds the predetermined value, the processing proceeds to a step S1603. The steps S1603 to S1606 are identical with the steps S1303 to S1306 of FIG. 12 described above, description of which is therefore omitted.

According to the above status control program (step S1204), if the sensed temperature γ has continued to exceed the predetermined value (100° C.) over the predetermined time period (60 sec), it is determined that the DC motor 10 is abnormal, and then the supply of the supply voltage from the battery Vb to the DC motor 10 is stopped. Therefore, it is possible to prevent the DC motor 10 from becoming faulty.

Although in the above described steps S1306, S1406, S1506, and S1606, when it is determined that the DC motor 10 is abnormal, and the supply of the supply voltage to the DC motor 10 is stopped by means of the switch, alternatively a transformer or the like may be provided and the supply voltage from the battery Vb to the DC motor 10 may be decreased by the transformer or the like.

Further, in addition to stopping the supply of the supply voltage to the DC motor 10 or decreasing the supply voltage, the warning device 17 may be actuated to give warning to notify the occupant of the abnormal state of the DC motor 10.

Further alternatively, a control signal in the form of a pulse signal may be delivered from the MPU 14 through the terminal P1 in FIG. 2 to the DC motor driver 11, and if it is determined that the DC motor 10 is abnormal, the pulse width, i.e. duty factor of the pulse signal may be varied. More specifically, the duty factor of the pulse signal is decreased. This provides substantially the same results as decreasing the supply voltage to the DC motor 10.

Furthermore, a high-level signal may be delivered as the control signal from the MPU 14 through the terminal P2 in FIG. 2 to the DC motor driver 11 when it is determined that the DC motor 10 is normal, and when it is determined that the DC motor 10 is abnormal, and a low-level signal may be delivered from the MPU 14 through the terminal P2 to the DC motor driver 11 when it is determined that the DC motor 10 is abnormal. This causes a decrease in the current flowing to the DC motor 10, providing substantially the same results as decreasing the supply voltage to the DC motor 10.

The parameters used for the abnormality determination, i.e. current i, tension α, rotational torque β, and temperature γ are merely illustrative and not limitative.

Sixth Embodiment

Figure 16:
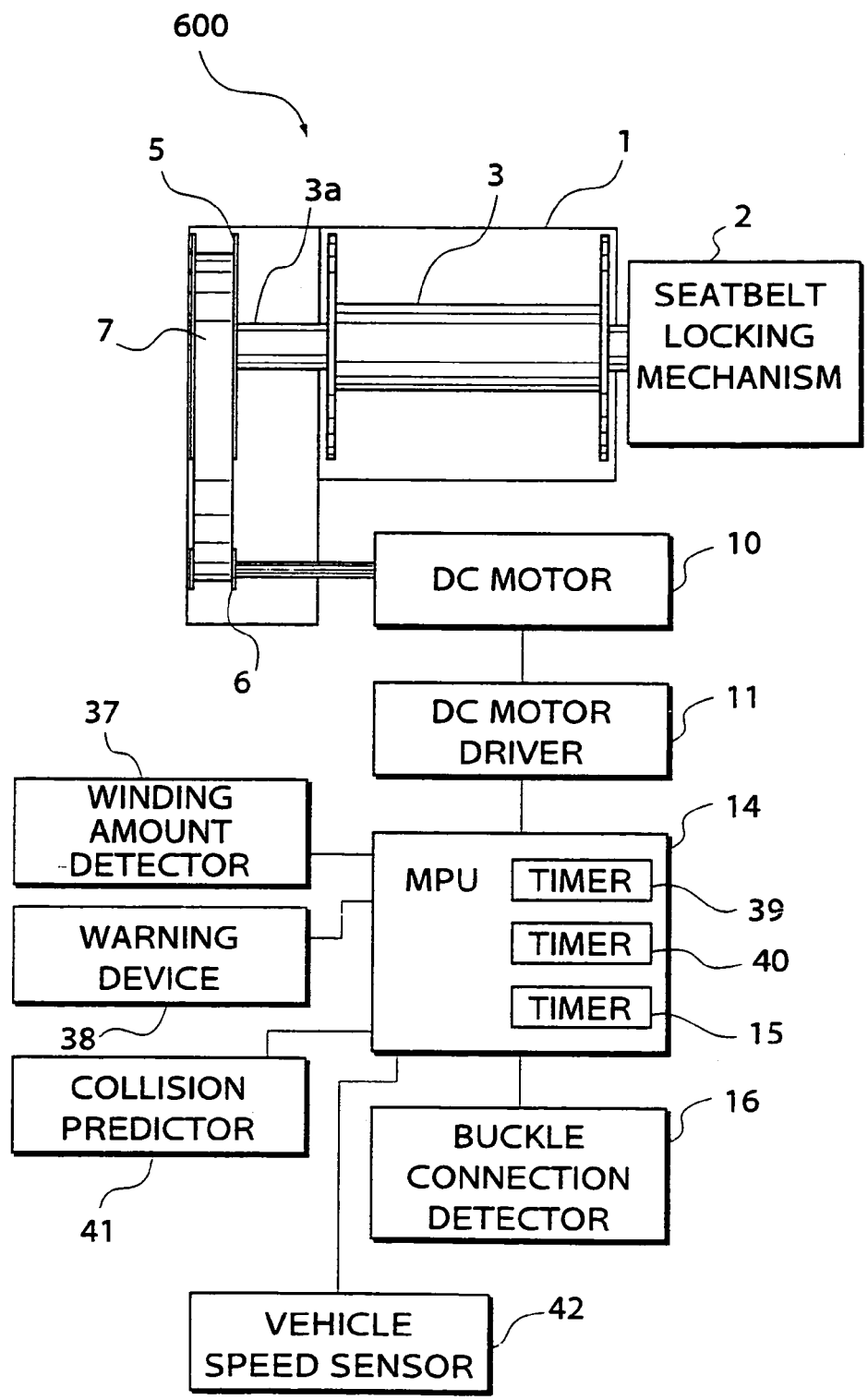
FIG. 16 is a block diagram schematically showing the arrangement of an electric retractor 600 provided in an automotive passenger restraint and protection apparatus according to a sixth embodiment of the invention.

FIG. 16 shows the construction of an electric retractor 600 provided in an automotive passenger restraint and protection apparatus according to a sixth embodiment of the invention, which is distinguished from the electric retractor 100 of FIG. 1 only in that a winding amount detector 37, a warning device 38, a collision predictor 41, and a vehicle sensor 42, which are connected to the MPU 14, in place of the temperature sensor 19.

The following description relates to these component elements 16, 37, 38, 41, and 42 and the MPU. The construction of the other component elements is identical with that of those of the electric retractor 100, description of which is therefore omitted.

The MPU 14 has built-in timers 15, 39 and 40 for measuring elapsed time. The winding amount detector 37 detects an amount of winding of the seatbelt, i.e. an amount of winding of the seatbelt on the reel shaft 3. The collision predictor 41 detects whether there is a fear of a collision of the automotive vehicle or a collision of the automotive vehicle is unavoidable. The vehicle speed sensor 42 senses the traveling speed of the automotive vehicle.

The MPU 14 has a memory, not shown, which stores programs such as control programs, and a vibration flag used to cause vibration of the seatbelt by alternately protracting and retracting the seatbelt through execution of programs.

The buckle connection detector 16 detects whether the tongue of the seatbelt has been attached to or disconnected from the buckle, and delivers an ON signal when it detects that the seatbelt tongue has been attached to the buckle, and an OFF signal when it detects that the seatbelt tongue has been disconnected from the buckle.

The winding amount detector 37 does not detect a specific value of the winding amount, but determines whether the thickness of a portion of the seatbelt wound on the reel shaft 3 exceeds a predetermined value. It delivers an ON signal to the MPU 14 when the thickness exceeds the predetermined value, whereas it delivers an OFF signal to the MPU 14 when the thickness does not exceed the predetermined value. The predetermined value is set to a value intermediate between an amount of winding or retraction to be assumed when the seatbelt is in a stored or fully retracted state and an amount of winding or retraction to be assumed when the seatbelt is in a state attached to the occupant.

Figure 17:
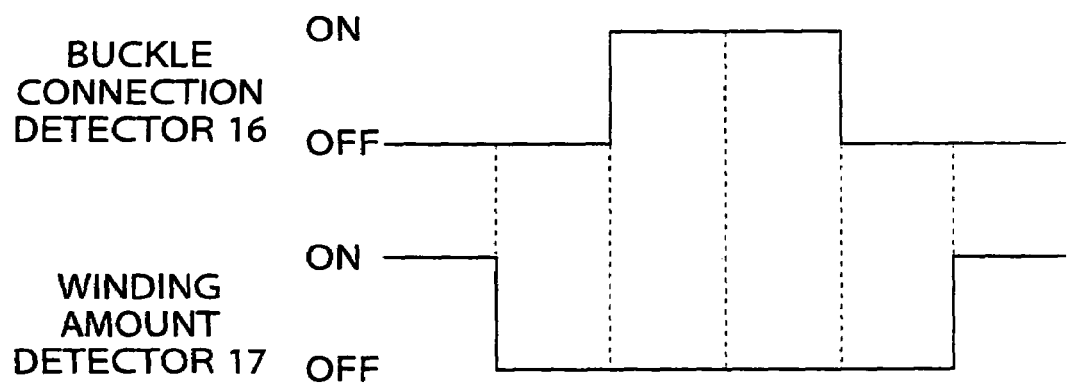
FIG. 17 is a view showing an example of the waveforms of signals input to the MPU 14 when a buckle connection detector 16 is normal.

FIG. 17 is a view showing an example of the waveforms of signals input to the MPU 14 when the buckle connection detector 16 is normal.

At a time point when the occupant starts protracting the seatbelt in order to mount the seatbelt onto his body, the ON signal from the winding amount detector 37 has already been delivered to the MPU 14 and also the OFF signal from the buckle connection detector 16 has already been delivered to the MPU 14. If the occupant then further protracts the seatbelt so that the winding amount decreases below the predetermined value, the winding amount detector 37 starts delivering the OFF signal. Thereafter, when the seatbelt has become attached to the occupant, that is, the seatbelt has been attached to the buckle, the buckle connection detector 16 starts delivering the ON signal. At this time, the winding amount detector 37 continues delivering the OFF signal.

Subsequently, when the seatbelt is disconnected from the occupant, that is, the seatbelt tongue is disconnected from the buckle, the signal received from the buckle connection detector 16 changes from the ON signal to the OFF signal. At this time, the MPU 14 starts seatbelt storing control to start retracting the seatbelt. When the winding amount of the seatbelt increases above the predetermined value, the signal received from the winding amount detector 37 changes from the OFF signal to the ON signal.

Figure 18:
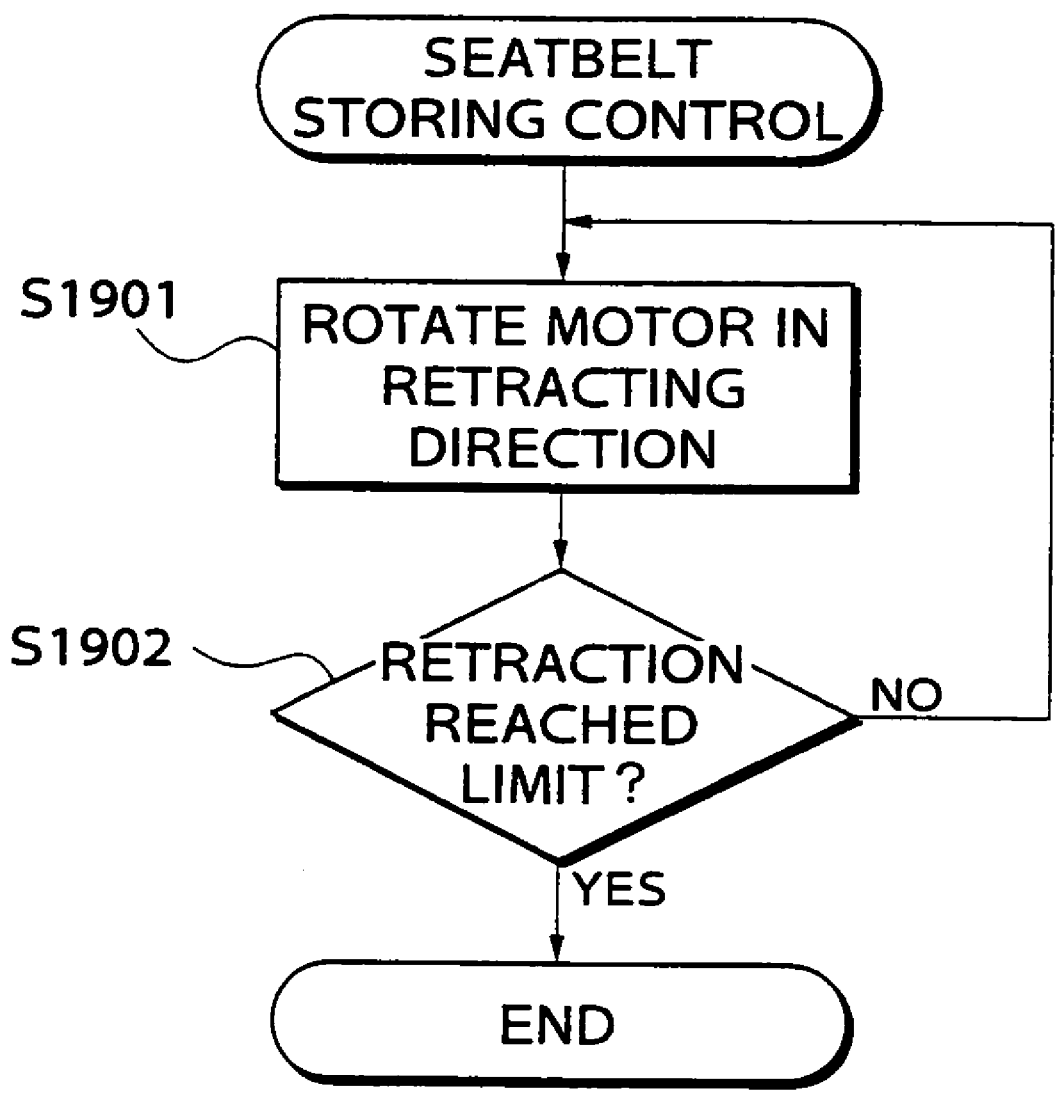
FIG. 18 is a flowchart showing seatbelt storing control according to the sixth embodiment.

FIG. 18 is a flowchart showing the seatbelt storing control.

First, the MPU 14 delivers a PWM signal to the DC motor driver 11 to thereby rotate the DC motor 10 in the seatbelt retracting direction at a step S1901. It is then determined at a step S1902 whether the retraction of the seatbelt has reached its limit, base upon the current flowing to the DC motor 10. If the retraction of the seatbelt has not reached its limit, that is, the seatbelt can still be retracted by the DC motor 10, the processing returns to the step S1901, whereas if the retraction of the seatbelt has reached its limit, the present processing is terminated. The expression "the retraction of the seatbelt has reached its limit" means that the DC motor 10 ceases to rotate in the seatbelt retracting direction.

Now, description will be made of processing executed by the MPU 14 in the event that the buckle connection detector 16 continues delivering the ON signal even when the seatbelt is in a state disconnected from the buckle (hereinafter referred to as "ON fault").

Figure 19:
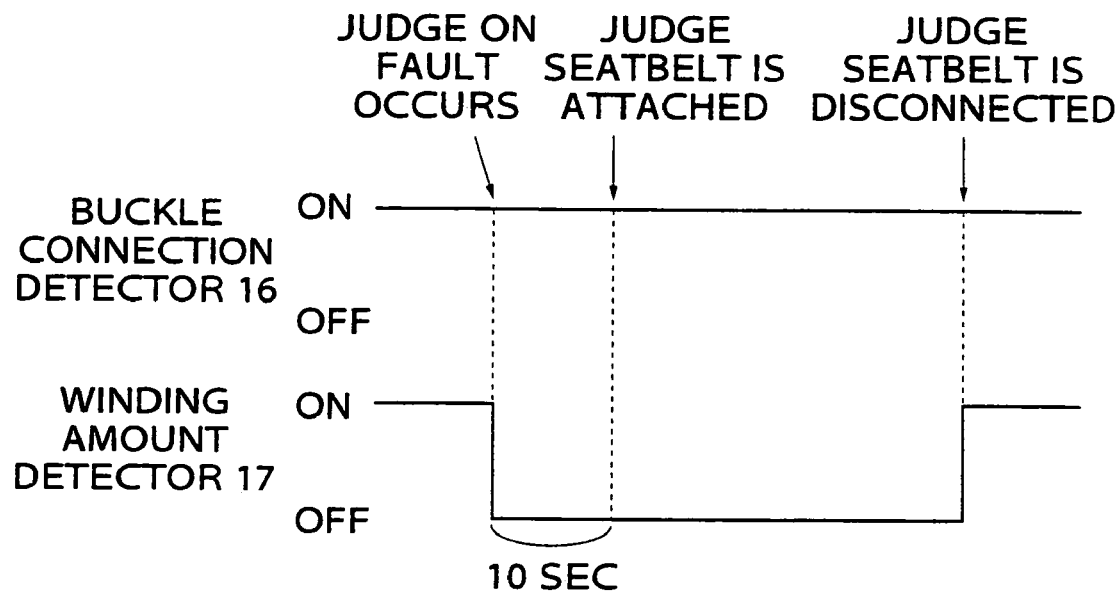
FIG. 19 is a view showing an example of the waveforms of signals input to the MPU 14 when "ON fault" occurs with the seatbelt disconnected from the occupant.
Figure 20:
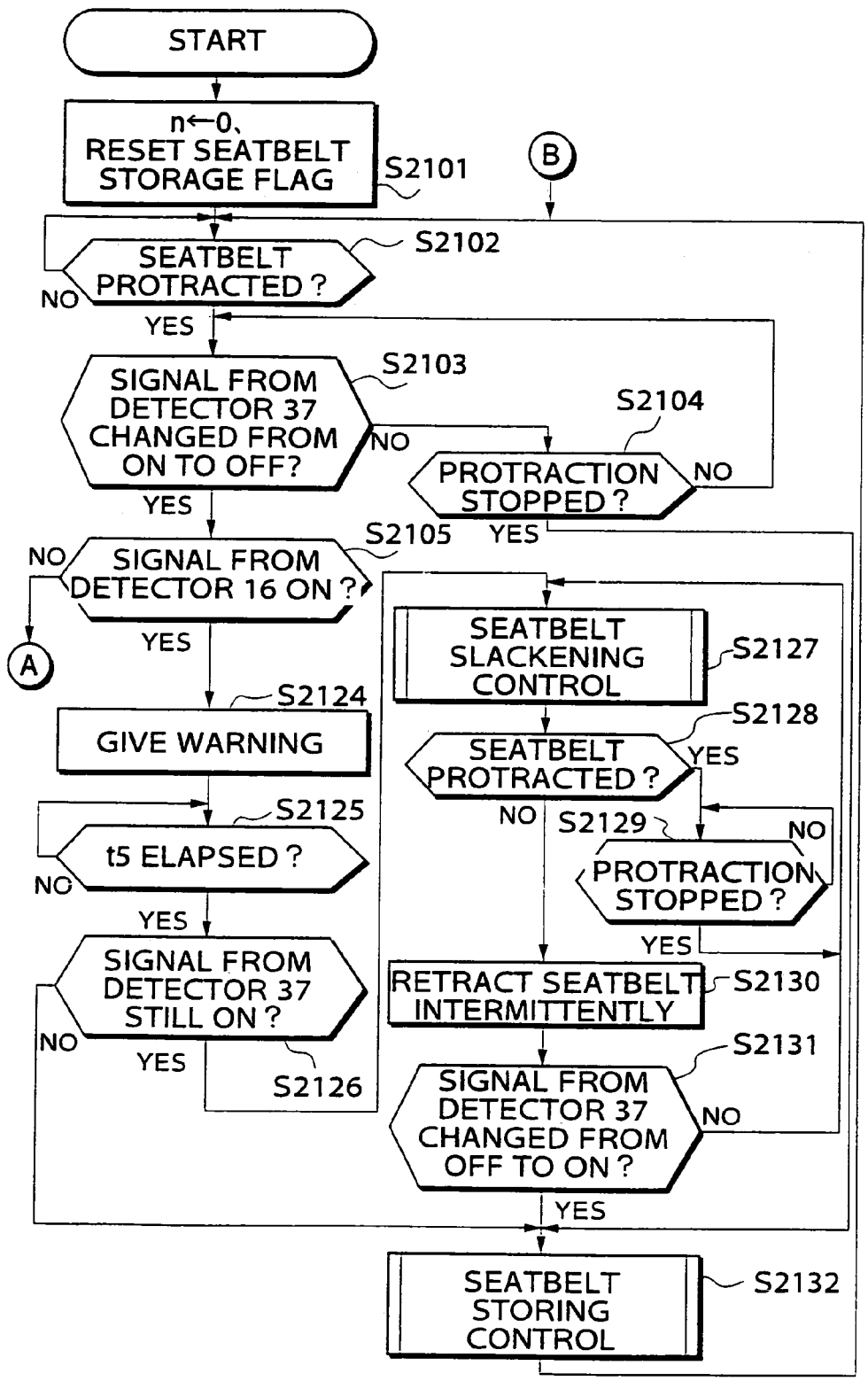
FIG. 20 is a flowchart showing a control program according to the sixth embodiment, executed by the MPU 14.
Figure 21:
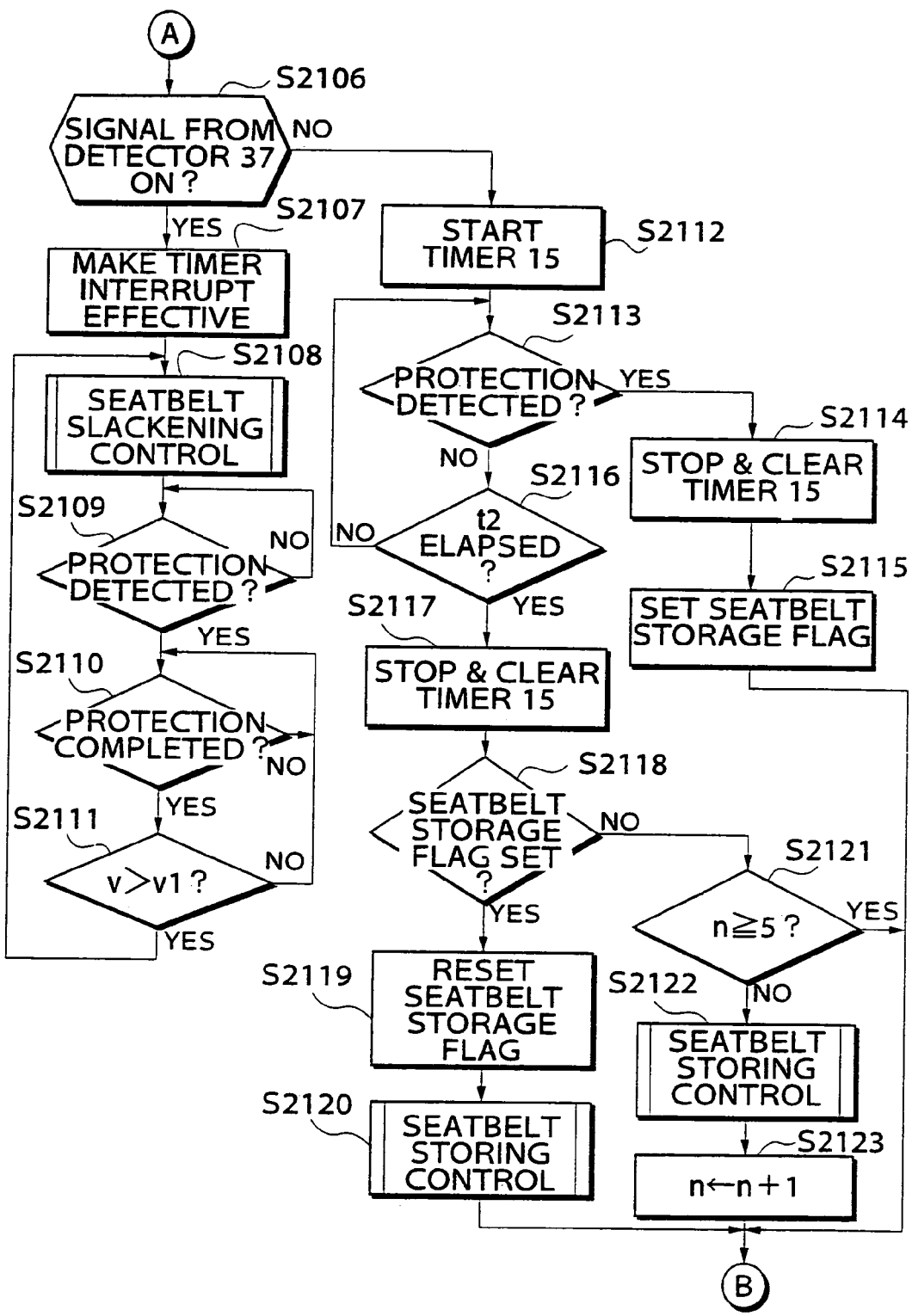
FIG. 21 is a flowchart showing a continued part of the FIG. 20 control.

FIG. 19 shows an example of the waveforms of signals input to the MPU 14 when "ON fault" occurs with the seatbelt disconnected from the occupant. FIGS. 20 and 21 are flowcharts showing a control program executed by the MPU 14. This control program is started when the ON signal is delivered from the winding amount detector 37 to the MPU 14 and at the same time the ON signal is delivered from the buckle connection detector 16 to the MPU 14.

First, a counter n for use in the present control program is reset to 0 and a seatbelt storage flag is reset at a step S2101. It is then determined at a step S2102 whether the seatbelt is being protracted, from the terminal voltage across the DC motor 10. If the seatbelt is not being protracted, the same determination is repeated, whereas if the seatbelt is being protracted, it is determined at a step S2103 whether the signal received from the winding amount detector 37 has changed from the ON signal to the OFF signal. If no change has occurred in the received signal, it is determined at a step S2104 whether the protraction of the seatbelt has been terminated, from the terminal voltage across the DC motor 10.

If the protraction of the seatbelt has not been terminated, the processing returns to the step S2103, whereas if the protraction of the seatbelt has been terminated, the processing proceeds to a step S2132 to execute seatbelt storing control, described hereinafter. If it is determined at the step S2103 that the signal received from the winding amount detector 37 has changed from the ON signal to the OFF signal, it is determined at a step S2105 whether the signal received from the buckle connection detector 16 is the ON signal. If it is the OFF signal, it is determined that there is no ON fault, and then, after the lapse of a predetermined time period t1, it is determined at a step S2106 whether the signal received from the buckle connection detector 16 is the ON signal.

If the signal from the buckle connection detector 16 is the OFF signal, the timer 15 is started at a step S2112, and then it is determined at a step S2113 whether the seatbelt has been protracted, from the terminal voltage across the DC motor 10. If the seatbelt has been protracted, the timer 15 is stopped and cleared at a step S2114, and the seatbelt storage flag is set at a step S2115, followed by the processing returning to the step S2102. On the other hand, if the seatbelt has not been protracted, it is determined at a step S2116 whether a predetermined time period t2 (e.g. 4 sec) has elapsed, from the value of the timer 15. If the predetermined time period t2 has not elapsed, the processing returns to the step S2113, whereas if the predetermined time period t2 has elapsed, the timer 15 is stopped and cleared at a step S2117, and it is determined at a step S2118 whether the seatbelt storage flag has been set.

If the seatbelt storage flag has been set, the same flag is reset at a step S2119, and then the seatbelt storing control of FIG. 18 is executed at a step S2120, followed by the processing returning to the step S2102.

If it is determined at the step S2118 that the seatbelt storage flag has not been set, it is determined at a step S2121 whether the count value of the counter n has reached a predetermined value (e.g. 5). If the count value has reached the predetermined value, the processing returns to the step S2102, whereas if the count value has not reached the predetermined value, the seatbelt storing control is executed at a step S2122, similarly to the step S2120. After completion of the seatbelt storing control, the count value of the counter n is incremented by 1 at a step S2123, followed by the processing returning to the step S2102.

If it is determined at the step S2106 that attaching of the seatbelt to the buckle has been detected from the signal from the buckle connection detector 16, a timer interrupt triggered in response to the value of the timer 22 is made effective at a step S2107, whereby timer interrupt processing is executed at predetermined time intervals (e.g. 0.1 sec), as described hereinbelow.

Figure 22:
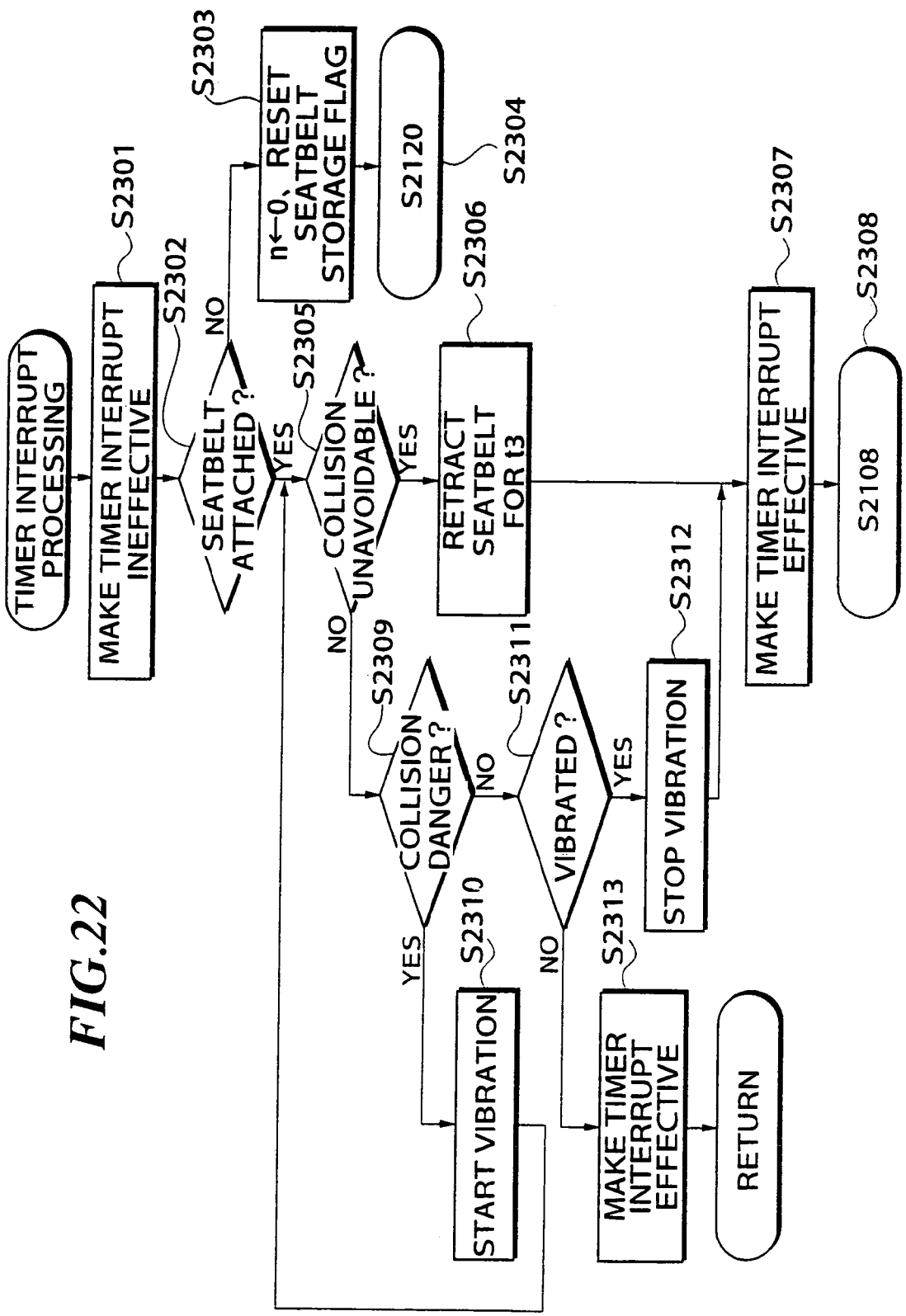
FIG. 22 is a flowchart showing timer interrupt processing according to the sixth embodiment.

FIG. 22 is a flowchart showing the timer interrupt processing.

First, upon the start of execution of the timer interrupt processing, the timer interrupt is made ineffective at a step S2301. Then, it is determined at a step S2302 whether attaching of the seatbelt tongue to the buckle has been detected by the buckle connection detector 16. If attaching of the seatbelt has not been detected, the counter n is reset to 0 and the seatbelt storage flag is reset at a step S2303, and then the program jumps to a step S2304 to execute the seatbelt storing control of the step S2120.

On the other hand, if it is determined at the step S2302 that attaching of the seatbelt has been detected, it is determined at a step S2305 whether an output signal from the collision predictor 41 has been received, which indicates that a collision of the vehicle is unavoidable. If the output signal has been received, a PWM signal is delivered to the DC motor driver 11 over a predetermined time period t3 (e.g. 4 sec) which is measured by the timer 40, to rotate the DC motor 10 in the seatbelt retracting direction at a step S2306. Thus, the occupant can be properly protected in the event of a collision of the vehicle. Then, the timer interrupt is made effective at a step S2307, and the processing proceeds to the step S2108 (step S2308).

If it is determined at the step S2305 that the output signal indicative of a collision of the vehicle being unavoidable has not been received, it is determined at a step S2309 whether an output signal from the collision predictor 41 has been received, which indicates that there is a fear of a collision of the vehicle. If the output signal has been received, a PWM signal is delivered to the DC motor driver 11 to rotate the DC motor 10 alternately in the seatbelt protracting direction and in the seatbelt retracting direction to vibrate the seatbelt, and the vibration flag is set at a step S2310. The frequency of the vibration varies from 1 Hz to 10 kHz so as to provide a vibration which the occupant can easily feel as a warning. Then, the processing returns to the step S2305 while the vibration is continued.

If it is determined at the step S2309 that the output signal indicative of the fear of a collision of the vehicle has not been received, it is determined at a step S2311 whether the seatbelt has been being vibrated, from the state of the vibration flag. If the seatbelt has been being vibrated, the vibration flag is reset and the vibration is stopped at a step S2312, and then the processing proceeds to the step S2307. If the seatbelt has not been being vibrated, the timer interrupt is made effective at a step S2313, and then the program return to a step where the timer interrupt was input.

Referring back to FIG. 21, the processing then proceeds to the step S2308 to execute seatbelt slackening control to give a proper amount of looseness to the occupant so as not to give him a feeling of oppression.

Figure 23:
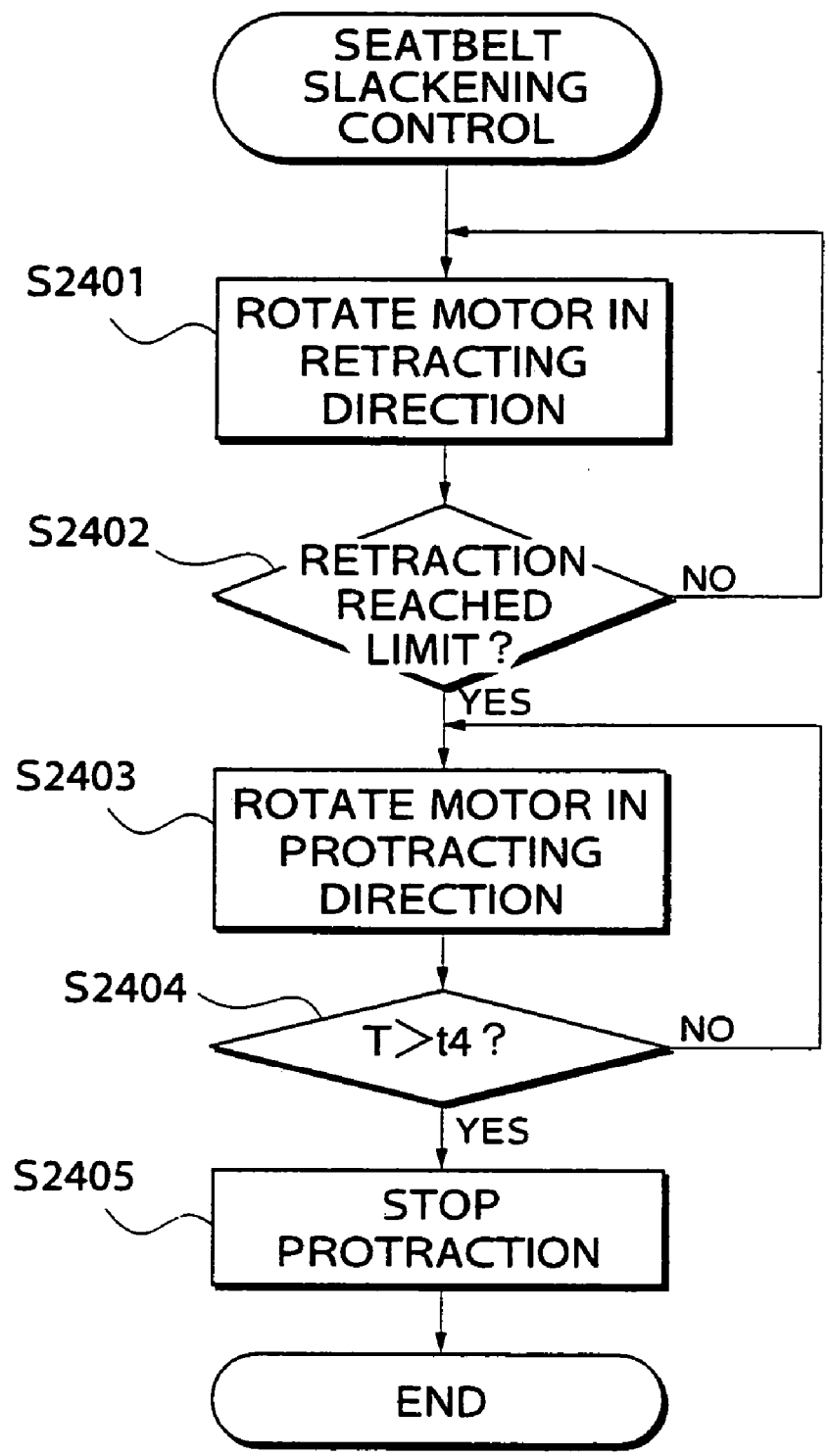
FIG. 23 is a flowchart showing seatbelt slackening control according to the sixth embodiment.

FIG. 23 is a flowchart of the seatbelt slackening control.

First, a PWM signal is delivered from the MPU 14 to the DC motor driver 11 to rotate the DC motor 10 in the seatbelt retracting direction at a step S2401, and it is determined at a step S2402 whether the retraction of the seatbelt has reached its limit, based upon the current flowing to the DC motor 10. When the retraction of the seatbelt has reached its limit, an improper amount of looseness of the seatbelt can be once completely removed.

If it is determined at the step S2402 that the retraction of the seatbelt has not reached its limit, the processing returns to the step S2401, whereas if it has reached the limit, a PWM signal is delivered from the MPU 14 to the DC motor driver 11 to rotate the DC motor in the seatbelt protracting direction at a step S2403, and it is determined at a step S2404 whether a predetermined time period t4 (e.g. 1 sec) has elapsed after the protraction of the seatbelt by the DC motor 10 was started. When the predetermined time period t4 has elapsed, a proper amount of looseness is given to the occupant.

If it is determined at the step S2404 that the predetermined time period t4 has not elapsed, the processing returns to the step S2403, whereas if the predetermined time period t4 has elapsed, the protraction of the seatbelt by the DC motor 10 is stopped at a step S2405, followed by terminating the present processing.

Referring again to FIG. 21, it is determined at a step S2109 whether protraction of the seatbelt has been made, based upon the terminal voltage across the DC motor 10. If protraction of the seatbelt has not been made, the same determination is repeated, whereas if protraction of the seatbelt has been made, it is determined at a step S2110 whether the protraction of the seatbelt has been completed, by determining whether the terminal voltage across the DC motor 10 is equal to or less than a predetermined value (e.g. 0.3 volts). If the protraction of the seatbelt has not been completed, the same determination is repeated, whereas if it has been completed, it is determined at a step S2111 whether the vehicle speed v exceeds a predetermined value v1 (e.g. 10 km/h), based upon an output signal from the vehicle speed sensor 42.

If the vehicle speed v does not exceed the predetermined value v1, the same determination is repeated, whereas if the former exceeds the latter, the processing returns to the step S2108 to again execute the seatbelt slackening control. By virtue of this control, when the vehicle is reversed at a slow speed for parking, for example, the reel shaft is not normally rotated, it can be prevented that the seatbelt is retracted to its limit while the occupant looks backward.

Referring back to FIG. 20, if it is determined at the step S2105 that the signal received from the buckle connection detector 16 is the ON signal, the MPU 14 judges that the buckle connection detector 16 has the ON fault, and then causes the warning device 38 to give warning at a step S2124.

Then, it is determined at a step S2125 whether a predetermined time period t5 (e.g. 10 sec) has elapsed. If the predetermined time period t5 has not yet elapsed, the same determination is repeated, whereas if the predetermined time period t5 has elapsed, it is determined at a step S2126 whether the signal received from the winding amount detector 37 is still the OFF signal. If the signal from the winding amount detector 37 has changed to the ON signal, the processing proceeds to the seatbelt storing control at a step S2132, whereas if the signal from the winding amount detector 37 is still the OFF signal, it is regarded that the seatbelt has been attached to the occupant, and then the processing proceeds to a step S2127 to execute seatbelt slackening control of FIG. 23.

Then, it is determined at a step S2128 whether the seatbelt has been protracted by the occupant, from the terminal voltage across the DC motor 10. If the seatbelt has been protracted by the occupant, it is determined at a step S2129 whether the protraction of the seatbelt has been terminated, from the terminal voltage. If the protraction has been terminated, the seatbelt slackening control is again executed at the step S2127.

If it is determined at the step S2128 that the seatbelt has not been protracted by the occupant, the seatbelt is forcibly retracted every predetermined time period t6 (e.g. 5 sec) so long as the signal received from the winding amount detector 37 is the OFF signal, and it is determined at a step S2131 whether the signal from the winding amount detector 37 has changed from the OFF signal to the ON signal before the retraction of the seatbelt has reached its limit.

If the signal received from the winding amount detector 37 remains to be the OFF signal, the processing returns to the step S2127, whereas if it has changed to the ON signal, it is regarded that the'seatbelt has been released from the attached state, and then the MPU 14 executes the seatbelt storing control at the step S2132.

As described above, according to the present embodiment, after it is regarded that the buckle connection detector 16 has the ON fault with the seatbelt disconnected from the occupant, the MPU 14 executes the seatbelt slackening control if the signal received from the winding amount detector 37 is still the OFF signal. As a result, even in the case where attachment or disconnection of the seatbelt cannot be accurately detected due to the fault of the buckle connection detector 16, a comfortable seatbelt attaching feeling can be given to the occupant. On the other hand, after it is regarded that the buckle connection detector 16 has ON fault, if the signal received from the winding amount detector 37 has changed from the OFF signal to the ON signal, the seatbelt storing control is executed. As a result, it can be prevented that the seatbelt is caught in the door.

Figure 24:
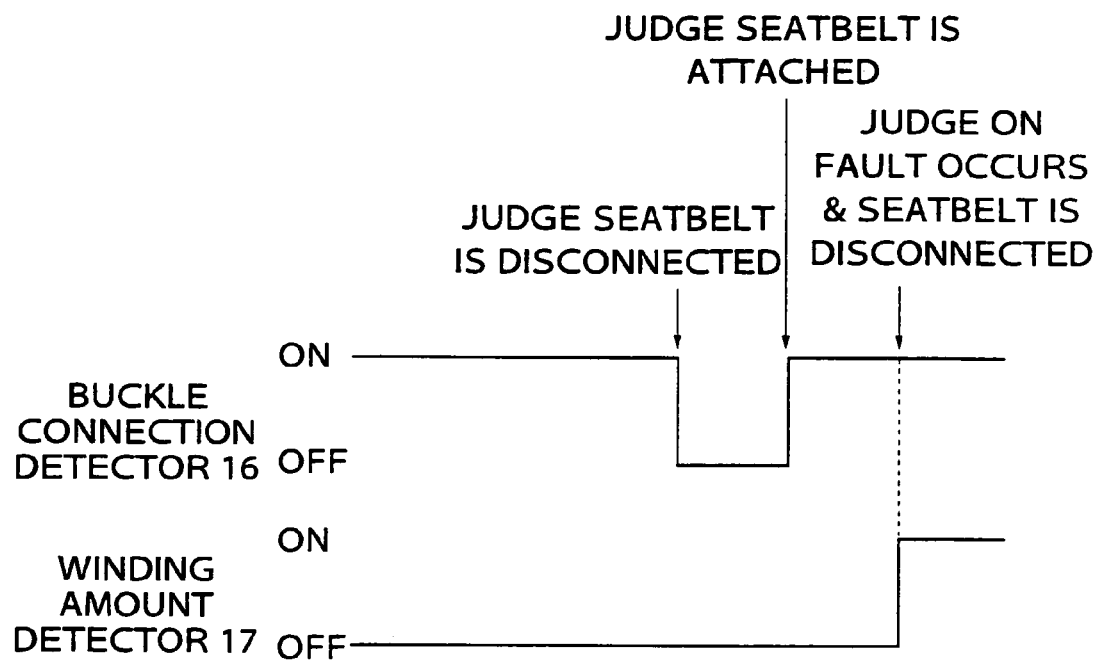
FIG. 24 is a view showing an example of the waveforms of signals input to the MPU 14 when "ON fault" occurs after the seatbelt shifts from a state attached to the occupant to a state disconnected from the occupant.
Figure 25:
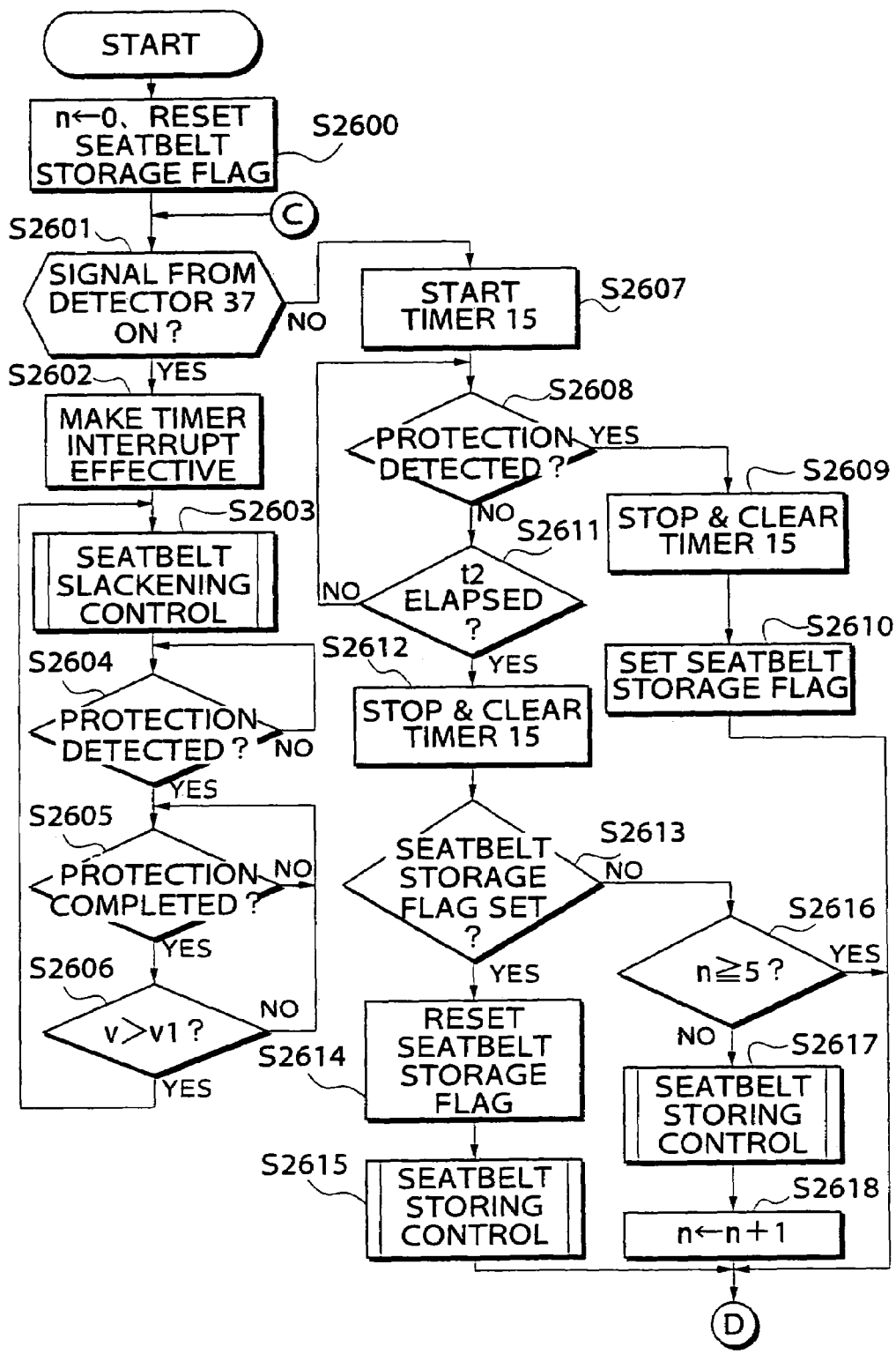
FIG. 25 is a flowchart showing a control program executed by the MPU 14 according to the sixth embodiment.
Figure 26:
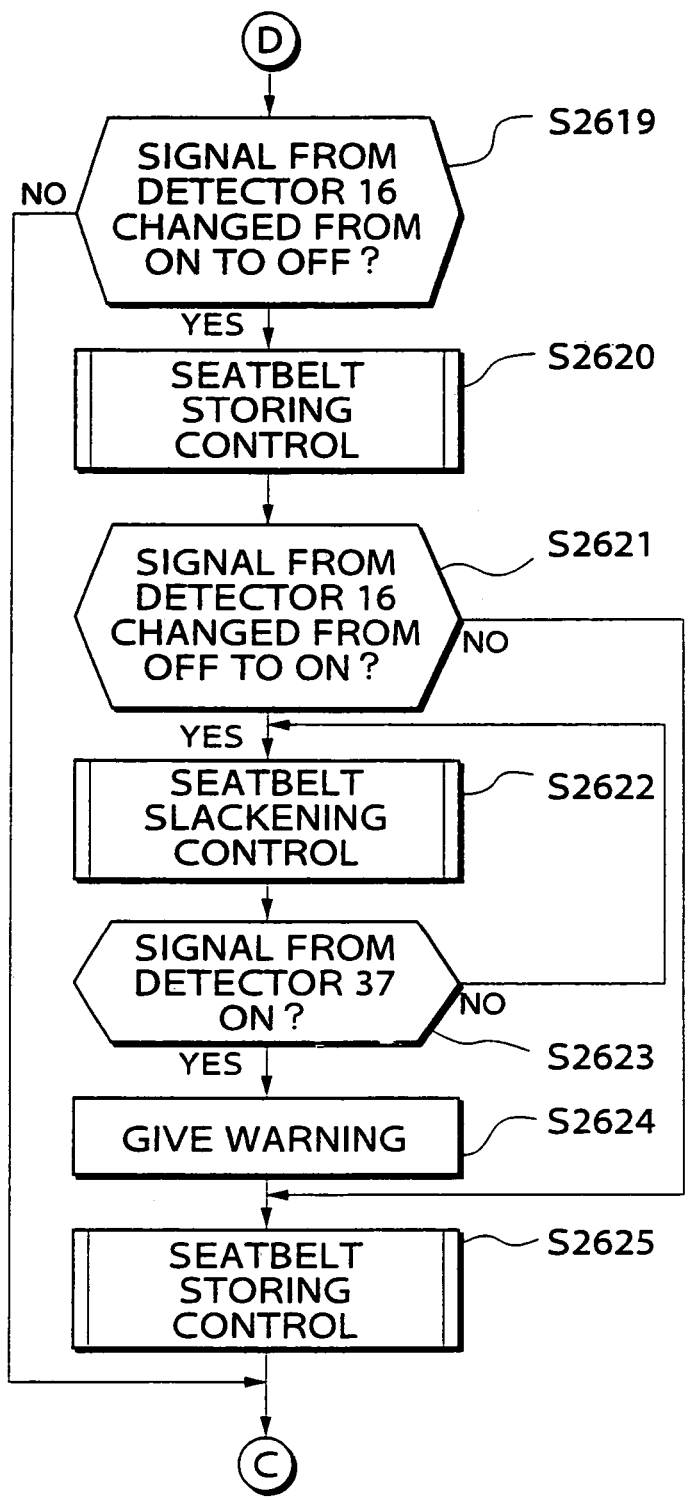
FIG. 26 is a flowchart showing a continued part of the FIG. 25 program.

FIG. 24 shows an example of the waveforms of signals input to the MPU 14 when "ON fault" occurs after the seatbelt shifts from a state attached to the occupant to a state disconnected from the occupant. FIGS. 25 and 26 are flowcharts showing a control program executed by the MPU 14.

First, the counter n is set to 0 and the seatbelt storage flag is reset at a step S2600, and it is determined at a step S2601 whether the signal received from the buckle connection detector 16 is the ON signal. The step S2601 and steps S2602 to S2618 are identical with the steps S2106 to S2123 of FIG. 21 described above, description of which is omitted.

After the execution of the step S2610, after the answer to the question of the step S2616 is YES, or after the execution of the step S2615 or S2618, when the seatbelt has shifted from the attached state to the disconnected state, it is determined at a step S2619 whether the signal received from the buckle connection detector 16 has changed from the ON signal to the OFF signal. If the signal from the buckle connection detector 16 remains to be the ON signal, the processing returns to the step S2601, whereas if the signal from the buckle connection detector 16 has changed from the ON signal to the OFF signal, the seatbelt storing control of FIG. 18 is started at a step S2620.

Then, during the execution of the seatbelt storing control, it is determined at a step S2621 whether the signal received from the buckle connection detector 16 has changed from the OFF signal to the ON signal. If there has been no change in the signal, the processing proceeds to a step S2625, hereinafter referred to, whereas if the signal has changed from the OFF signal to the ON signal, it is regarded that the seatbelt has shifted from the disconnected state to the attached state, and then the seatbelt slackening control of FIG. 23 is started at a step S2622.

While the seatbelt is retracted during the execution of the seatbelt slackening control, it is determined at a step S2623 whether the signal from the winding amount detector 37 has changed to the ON signal. If the signal has not changed to the ON signal, the processing returns to the step S2622, whereas if it has changed to the ON signal, the MPU 14 regards that the buckle connection detector 16 has ON fault, then causes the warning device 38 to give warning at a step S2624, and again executes the seatbelt storing control at a step S2625, followed by the processing returning to the step S2601.

As described above, according to the present embodiment, after the seatbelt shifted from the attached state to the disconnected state and then the MPU 14 regards that the buckle connection detector 16 has ON fault, the seatbelt storing control is executed. As a result, it can be prevented that the seatbelt is caught in the door.

Now, description will be made of processing executed by the MPU 14 in the event that the buckle connection detector 16 continues delivering the OFF signal even when the seatbelt is in a state attached to the buckle (hereinafter referred to as "OFF fault").

Figure 27:
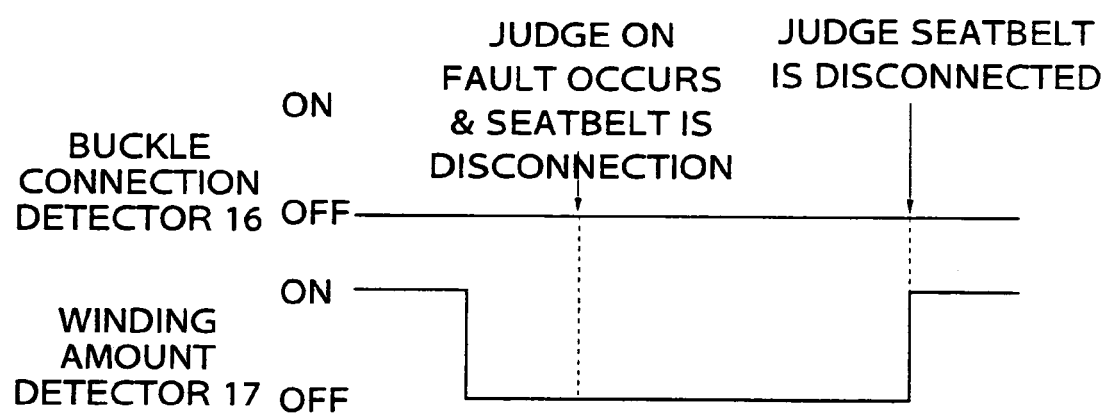
FIG. 27 is a view showing an example of the waveforms of signals input to the MPU 14 when "OFF fault" occurs with the seatbelt disconnected from the occupant.
Figure 28:
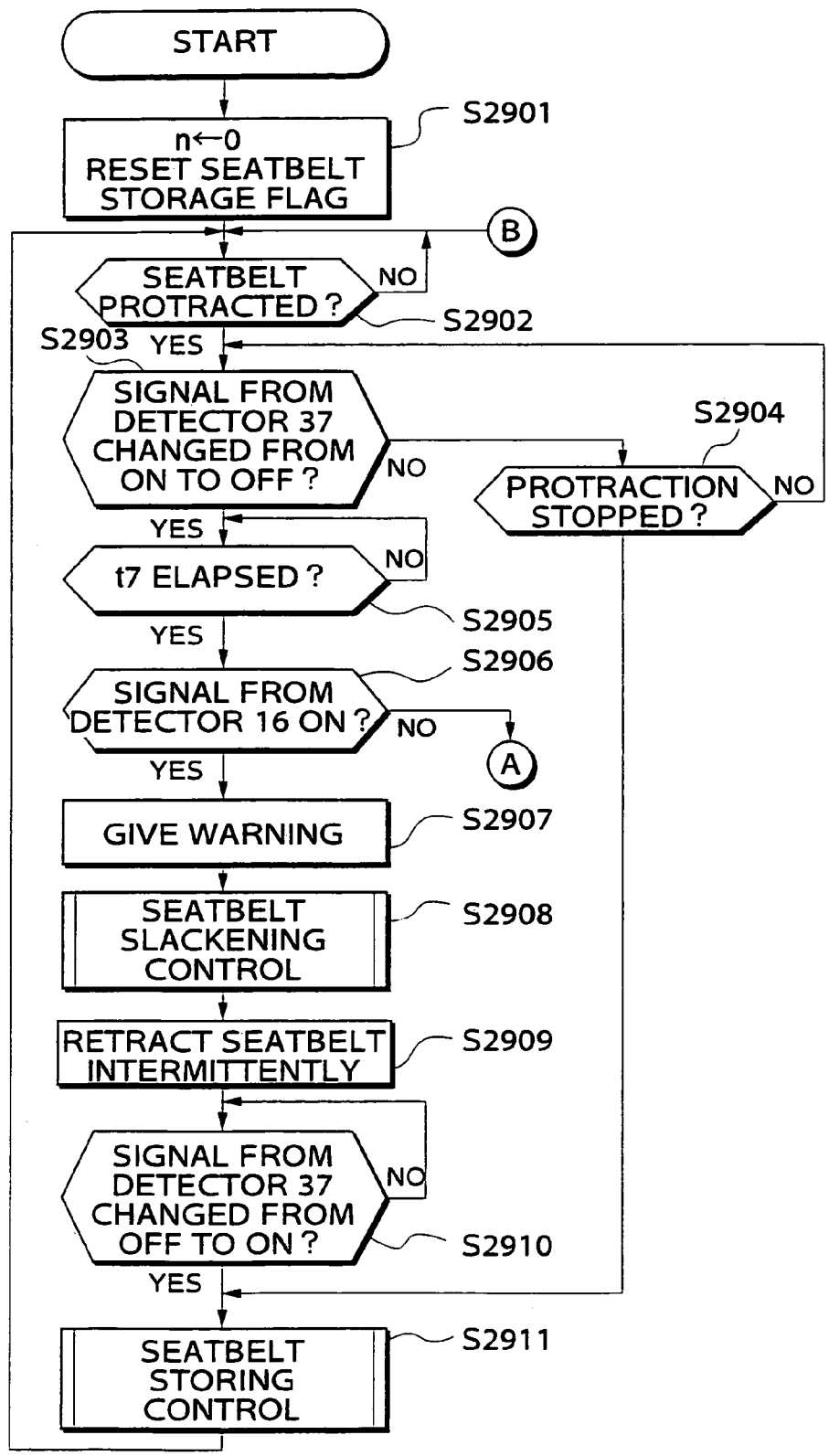
FIG. 28 is a flowchart showing a control program executed by the MPU 14 according to the sixth embodiment.

FIG. 27 is a view showing an example of the waveforms of signals input to the MPU 14 when "OFF fault" occurs with the seatbelt disconnected from the occupant. FIG. 28 is a flowchart showing a control program executed by the MPU 14.

The present control program is started when the ON signal from the winding amount detector 37 and at the same time the OFF signal from the buckle connection detector 16 are received by the MPU 14.

First, the counter n is set to 0 and the seatbelt storage flag is reset at a step S2901, and it is determined at a step S2902 whether the seatbelt is being protracted, from the terminal voltage across the DC motor 10. If the seatbelt is not being protracted, the same determination is repeated, whereas if the seatbelt is being protracted, it is determined at a step S2903 whether the signal received from the winding amount detector 37 has changed from the ON signal to the OFF signal. If there has been no change in the signal, it is determined at a step S2904 whether the protraction of the seatbelt has been terminated, from the terminal voltage across the DC motor 10.

If the protraction of the seatbelt has not been terminated, the processing returns to the step S2903, whereas if the protraction has been terminated, the processing proceeds to a step S2911 to execute the seatbelt storing control, described hereinafter.

If it is determined at the step S2903 that the signal from the winding amount detector 37 has changed from the ON signal to the OFF signal, it is determined at a step S2905 whether a predetermined time period t7 (e.g. 10 sec) has elapsed while the OFF signal continues to be received from the winding amount detector 37.

If the predetermined time period t7 has not yet elapsed, the same determination is repeated, whereas if it has elapsed, it is determined at a step S2906 whether the signal from the buckle connection detector 16 is the OFF signal.

If the signal from the buckle connection detector 16 is the ON signal, the processing proceeds to the step S2106 of FIG. 21, whereas if the signal is the OFF signal, the MPU 14 regards that the buckle connection detector 16 has OFF fault, causes the warning device 38 to give warning at a step S2907, and executes the seatbelt slackening control of FIG. 23 at a step S2908.

So long as the signal received from the winding amount detector 37 is the OFF signal, the seatbelt is forcibly retracted every predetermined time period t8 (e.g. 5 sec) at a step S2909, and it is determined at a step S2910 whether the signal from the winding amount detector 37 has changed from the OFF signal to the ON signal before the retraction of the seatbelt reaches its limit. If the signal has not changed from the OFF signal to the ON signal, the same determination is repeated, whereas if the signal has changed to the ON signal, the MPU 14 regards that the seatbelt has been released from the attached state, and then executes the seatbelt storing control of FIG. 18 at the step S2911, followed by the processing returning to the step S2902.

As described above, according to the present embodiment, after it is regarded that the buckle connection detector 16 has the OFF fault with the seatbelt disconnected from the occupant, the MPU 14 executes the seatbelt slackening control. As a result, even in the case where attachment or disconnection of the seatbelt cannot be accurately detected due to the fault of the buckle connection detector 16, a comfortable seatbelt attaching feeling can be given to the occupant. On the other hand, after it is regarded that the buckle connection detector 16 has OFF fault, if the signal received from the winding amount detector 37 has changed from the OFF signal to the ON signal, the seatbelt storing control is executed. As a result, it can be prevented that the seatbelt is caught in the door.

Figure 29:
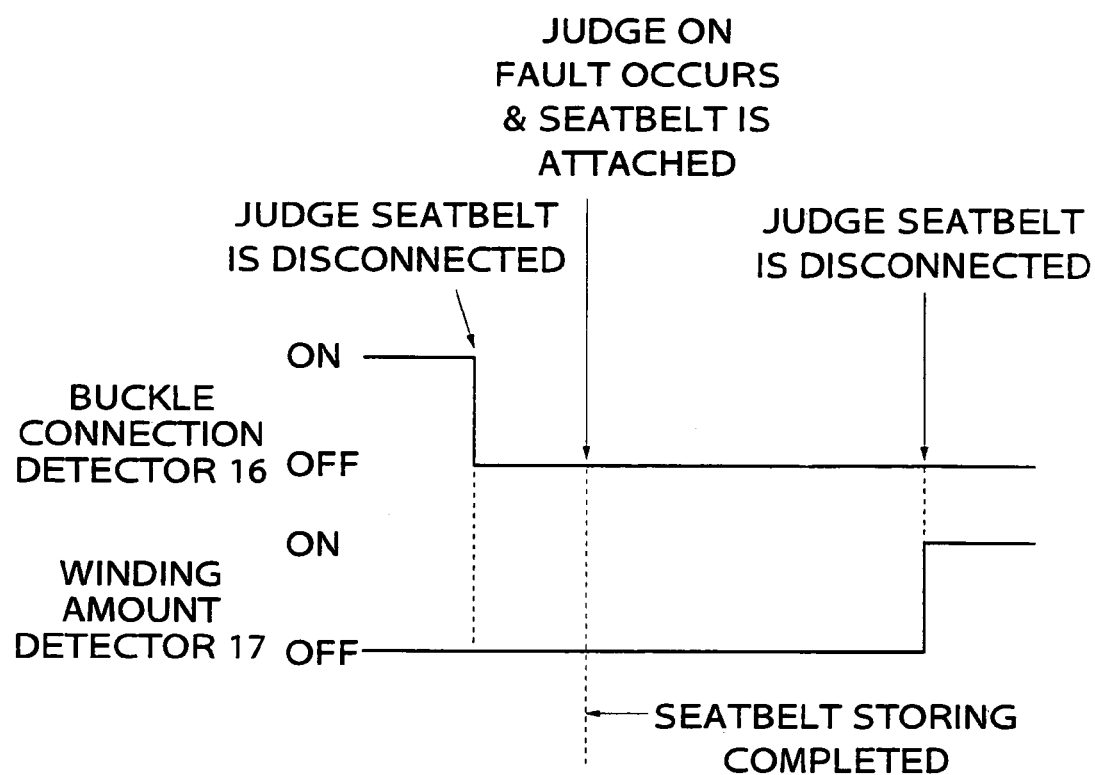
FIG. 29 is a view showing an example of the waveforms of signals input to the MPU 14 when "OFF fault" occurs after the seatbelt shifts from a state attached to the occupant to a state disconnected from the occupant.
Figure 30:
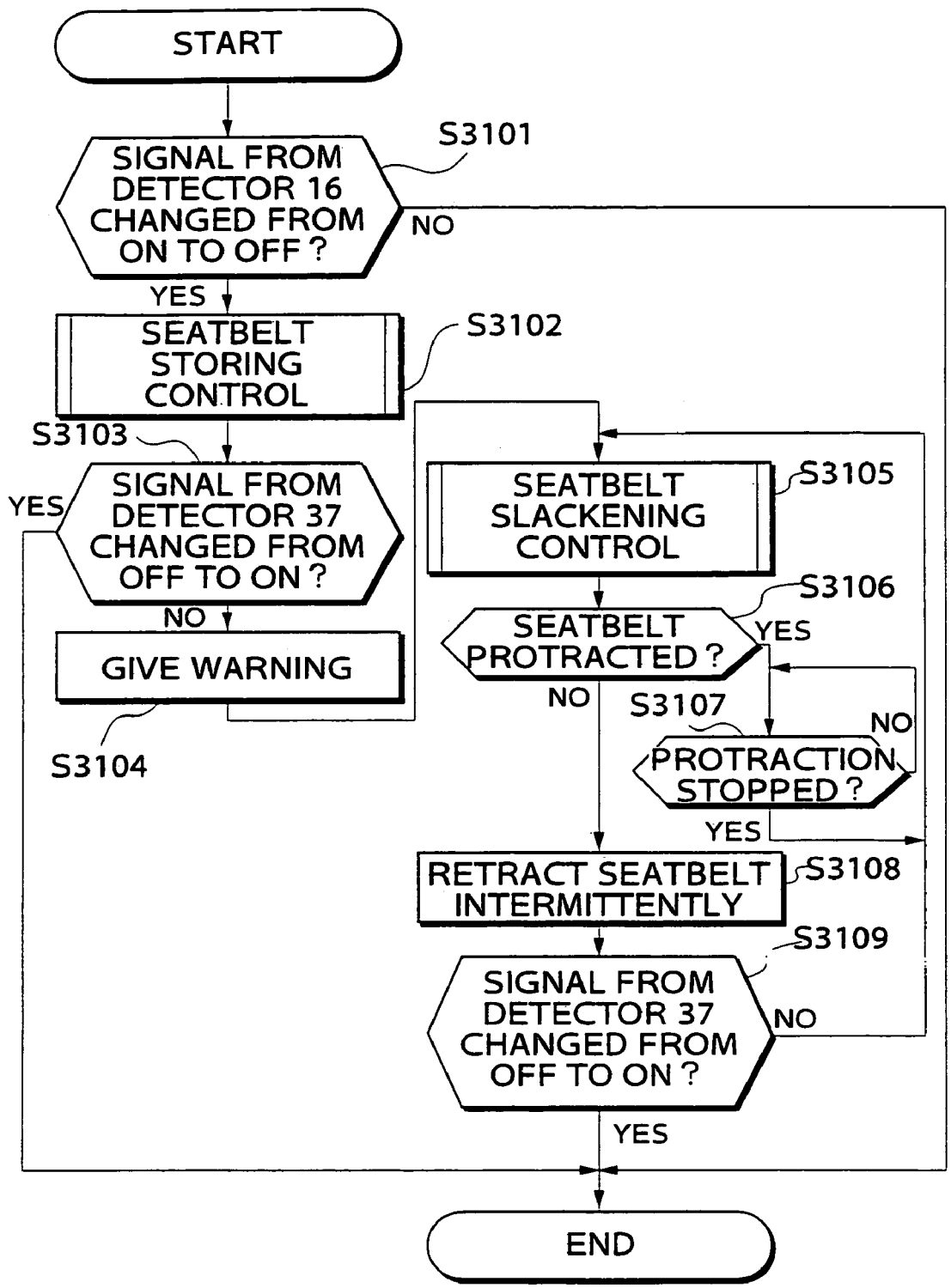
FIG. 30 is a flowchart showing a control program executed by the MPU 14 according to the sixth embodiment.

FIG. 29 shows an example of the waveforms of signals input to the MPU 14 when "OFF fault" occurs after the seatbelt shifts from a state attached to the occupant to a state disconnected from the occupant. FIG. 30 is a flowchart showing a control program executed by the MPU 14.

The present control program is interrupt processing triggered at regular time intervals and started when the OFF signal from the winding amount detector 37 and at the same time the ON signal from the buckle connection detector 16 are received by the MPU 14.

First, it is determined at a step S3101 whether the signal received from the buckle connection detector 16 has changed from the ON signal to the OFF signal. If the signal has not changed from the ON signal to the OFF signal, the present processing is immediately terminated, whereas if the signal has changed from the ON signal to the OFF signal, the MPU 14 regards that the seatbelt has shifted from the attached state to the disconnected state, and then executes the seatbelt storing control of FIG. 18 at a step S3102.

Then, it is determined at a step S3103 whether the signal from the winding amount detector 37 has changed from the OFF signal to the ON signal before completion of storing of the seatbelt. If the signal has changed from the OFF signal to the ON signal, the present processing is terminated, whereas if there has been no change in the signal, that is, the signal from the winding amount detector 37 is still the OFF signal even when the storing of the seatbelt is just about to be completed, the MPU 14 regards that the buckle connection detector 16 has OFF fault, then causes the warning device 38 to give warning at a step S3104, and executes the seatbelt slackening control of FIG. 23 at a step S3105, supposing that the seatbelt is in the attached state.

Then, it is determined at a step S3106 whether the seatbelt has been protracted by the occupant, from the terminal voltage across the DC motor 10. If the seatbelt has been protracted by the occupant, it is determined at a step S3107 whether the protraction of the seatbelt has been terminated, from the terminal voltage across the DC motor 10. If the protraction of the seatbelt has been terminated, the seatbelt slackening control is again executed at the step S3105.

If it is determined at the step S3106 that no protraction of the seatbelt has been made by the occupant, so long as the signal received from the winding amount detector 37 is the OFF signal, the seatbelt is forcibly retracted every predetermined time period t9 (e.g. 5 sec) at a step S3108, and it is determined at a step S3109 whether the signal from the winding amount detector 37 has changed from the OFF signal to the ON signal before the retraction of the seatbelt reaches its limit.

If there has been no change in the signal, the processing returns to the step S3105, whereas if a change has been made from the OFF signal to the ON signal, the present processing is terminated.

As described above, according to the present embodiment, after the seatbelt has shifted from the attached state to the disconnected state and then it is determined that the buckle connection detector 16 has OFF fault, the seatbelt slackening control is carried out. As a result, even in the case where attachment or disconnection of the seatbelt cannot be accurately detected due to the fault of the buckle connection detector 16, a comfortable seatbelt attaching feeling can be given to the occupant.

Although in the present embodiment the winding amount detector 37 detects the thickness of the seatbelt wound on the reel shaft 3 as the winding amount of the seatbelt, the terminal voltage across the DC motor 10 or the current flowing to the DC motor 10 may alternatively be detected to determine the winding amount. That is, when the DC motor 10 is not driven, voltage is developed between terminals of the DC motor 10 due to an electromotive force thereof, and the voltage is detected and accumulated, to determine the amount of retraction or protraction of the seatbelt from the resulting cumulative value. When the DC motor 10 is driven, the reel shaft 3 rotates such that current flowing to the DC motor 10 varies. Therefore, the time is accumulated so long as the current varies, and the accumulated time is used to determine the amount of retraction or protraction of the seatbelt.

Although in the above described embodiment the control executed by the MPU 14 is carried out irrespective of the traveling speed of the automotive vehicle, preferably the seatbelt slackening control may be carried out when the traveling speed is higher than a predetermined value and the seatbelt storing control when the traveling speed is lower than a predetermined value.

Seventh Embodiment

An automotive passenger restraint and protection apparatus according to a seventh embodiment of the invention includes an electric retractor 700, which is distinguished from the electric retractor 100 of FIG. 1 in that a detecting circuit 45 is provided in place of the temperature sensor 19.

The detecting circuit 45 is connected to the DC motor driver 11, the MPU 14, and the buckle connection detector 16, and delivers a mode control signal for selecting a reduced power consumption mode or a normal power consumption mode, based upon a voltage signal generated by protraction of the seatbelt by the occupant or a voltage signal from the buckle connection detector 16. Except for the above, the construction of the electric retractor 700 is identical with that of the electric retractor 100, illustration and description of which are therefore omitted.

Figure 31:
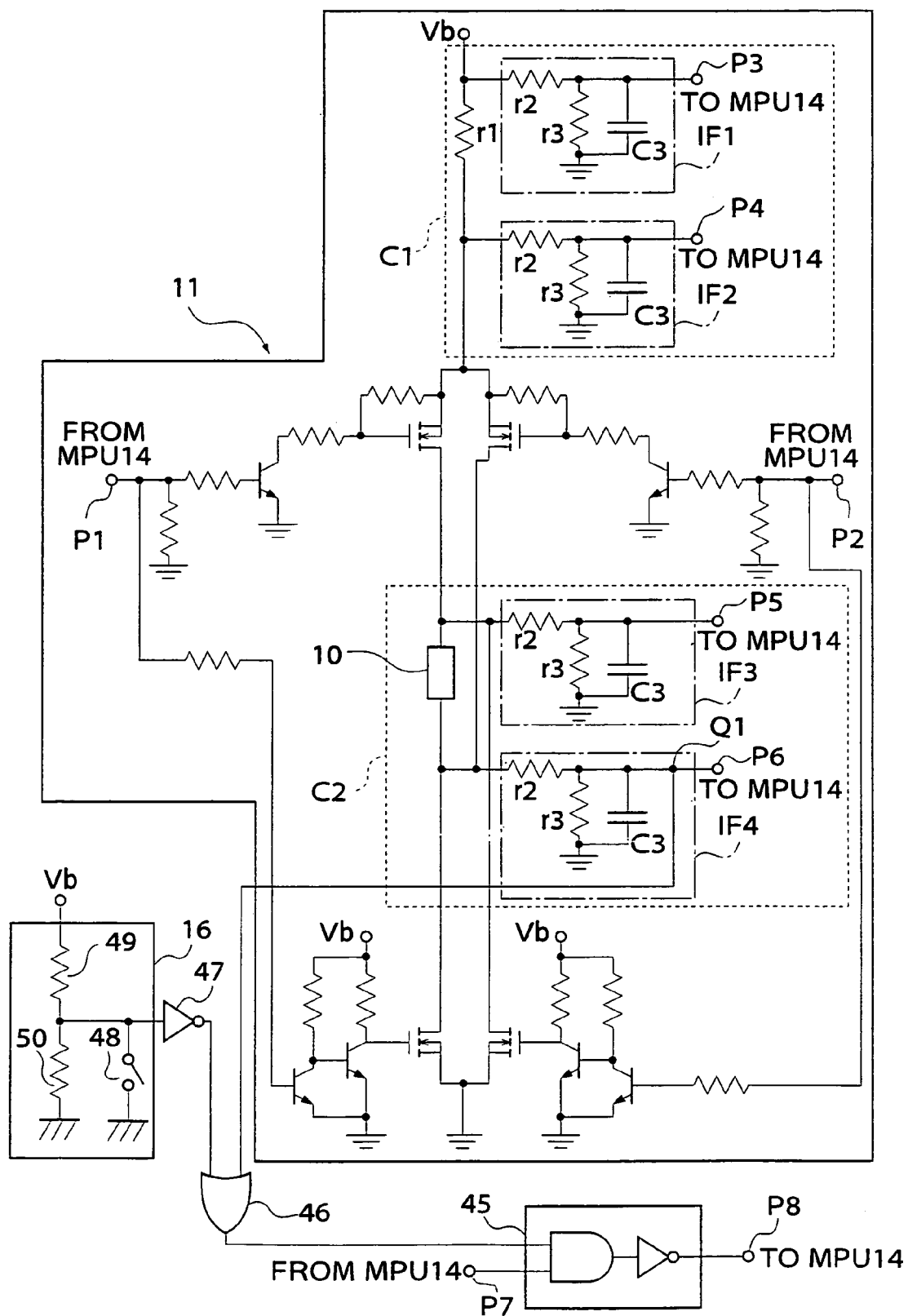
FIG. 31 is a circuit diagram showing the arrangements of a DC motor driver 11, a detecting circuit 45 and a buckle connection detector 16 according to a seventh embodiment of the invention.

FIG. 31 is a circuit diagram showing the arrangements of the DC motor driver 11, the detecting circuit 45 and the buckle connection detector 16 according to the seventh embodiment. In FIG. 31, reference numeral P7 designates an input terminal for receiving a control signal delivered to the detecting circuit 45 from the MPU 14, and reference numeral P8 designates an output terminal for outputting the mode control signal for selecting the reduced power consumption mode or the normal power consumption mode, to the MPU 14. The reduced power consumption mode is a mode for stopping all the functions of the MPU 14 except for a function of receiving the mode control signal, and the normal power consumption mode is a mode for allowing all the functions of the MPU 14 to operate.

The detecting circuit 45 includes a NAND circuit which has one input terminal thereof serving as the input terminal P7, and the other input terminal connected to an output terminal of an OR circuit 46. An output terminal of the NAND circuit serves as the output terminal P8. The OR circuit 46 has one input terminal thereof connected between the capacitor C3 of the IF IF4 and the output terminal P6 at a junction Q1, and the other input terminal connected to an output terminal of a NOT circuit 47, which in turn has an input terminal thereof connected to the battery Vb through a resistance 49, as well as to ground via a switch 48 which closes when the tongue of the seatbelt is attached to the buckle. The input terminal of the NOT circuit 47 is connected to a junction between voltage dividing resistances 49 and 50 serially connected between the battery Vb and ground. The switch 48 and the resistances 49, 50 are components of the buckle connection detector 16.

The OR circuit 46 receives a high-level (H) signal from the junction Q1 when the seatbelt is protracted by the occupant. The switch 48 closes when the tongue of the seatbelt is connected to the buckle by the occupant, and then the NOT circuit 47 delivers a high-level (H) signal to the OR circuit 46. When no protraction of the seatbelt is made by the occupant and when the seatbelt tongue is not connected to the buckle, a low-level (L) signal is input to the OR circuit 46.

FIGS. 32A to 32D show changes in an output signal (mode control signal) delivered from the output terminal P8 to the MPU 14 and modes of the MPU 14 corresponding to the changes.

Figure 32:
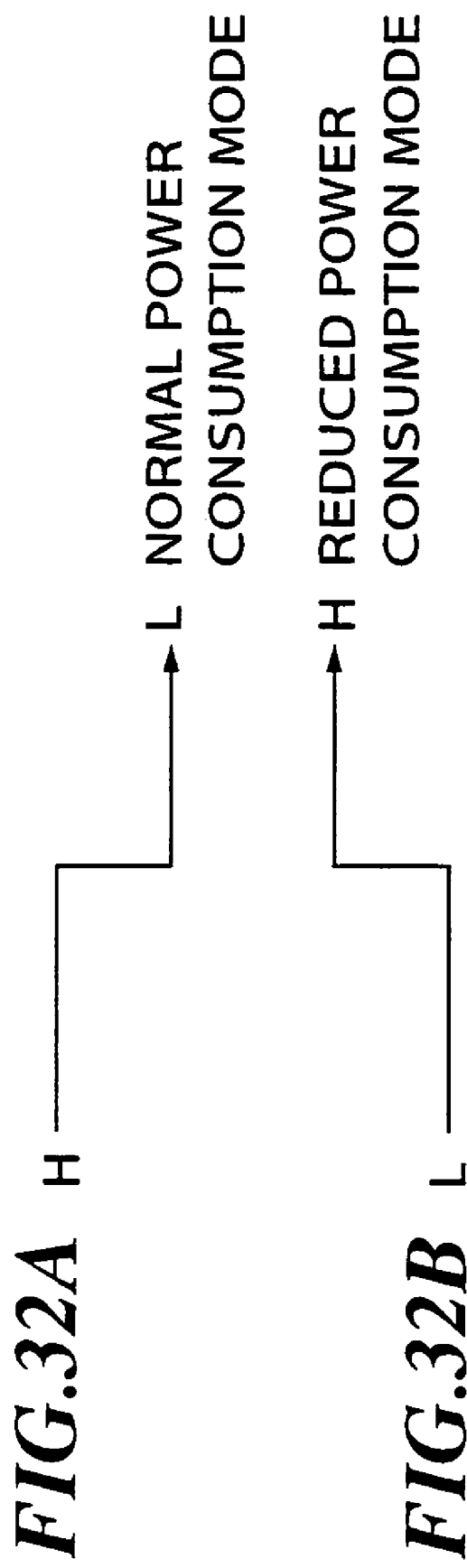
FIG. 32A is a view showing a change in a signal input to the MPU 14 to indicate a normal power consumption mode.
FIG. 32B is a view showing a change in the signal input to the MPU 14 to indicate a reduced power consumption mode.
FIG. 32C is a view showing a low level at which the signal input to the MPU 14 is held to indicate no change in the power consumption mode.
FIG. 32D is a view showing a high level at which the signal input to the MPU 14 is held to indicate no change in the power consumption mode.

First, as shown in FIG. 32A, when the output signal from the output terminal P8 turns from a high level H to a low level L, the MPU 14 enters the normal power consumption mode. As shown in FIG. 32B, when the mode control signal from the output terminal P8 turns from the low level L to the high level H, the MPU 14 enters the reduced power consumption mode. When the mode control signal remains at the low level L (FIG. 32C) or when the mode control signal remains at the high level L (FIG. 32D), the MPU 14 remains in the same mode without a change in the mode.

Figure 33:
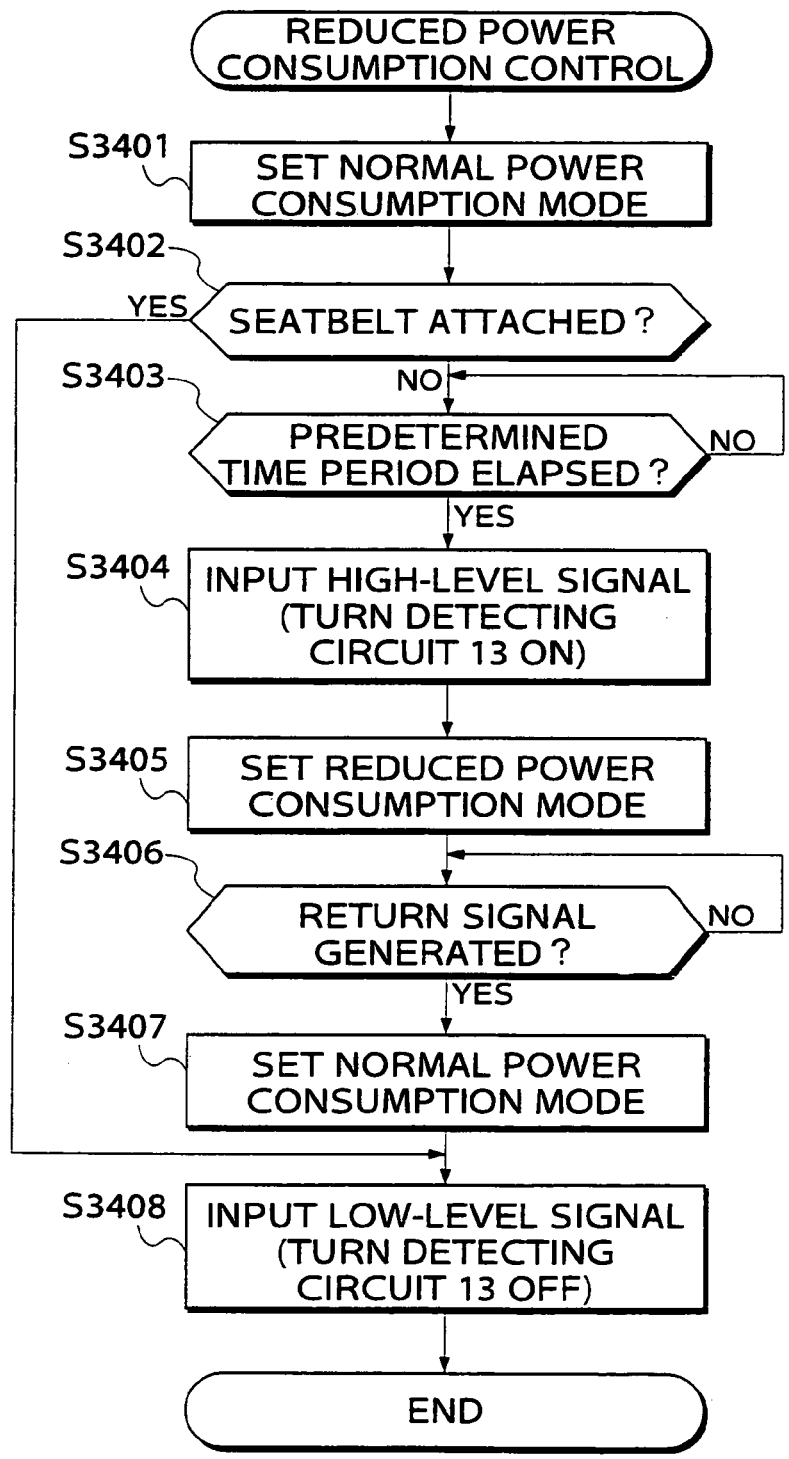
FIG. 33 is a flowchart showing reduced power consumption control executed by the MPU 14 according to the seventh embodiment.

FIG. 33 is a flowchart showing reduced power consumption control executed by the MPU 14. This control forms part of main control executed by the MPU 14 and is executed when the storage of the seatbelt has been completed.

In an initial state, the MPU 14 sets itself into the normal power consumption mode at a step S3401. Then, it is determined at a step S3402 whether attaching of the seatbelt tongue to the buckle has been detected by the buckle connection detector 16. If attaching of the seatbelt tongue to the buckle has not been detected, the present processing is immediately terminated, whereas if attaching of the seatbelt tongue has been detected, it is determined at a step S3403 whether a predetermined time period t (e.g. 3 sec) has elapsed, from the value of the timer 15. If the predetermined time period t has not yet elapsed, the same determination is repeated, whereas if the predetermined time period t has elapsed, the MPU 14 delivers a high-level (H) control signal to the detecting circuit 45 through the input terminal P7 at a step S3404, and the power consumption mode is set to the reduced power consumption mode at a step S3405.

Then, it is determined at a step S3406 whether the mode control signal from the detecting circuit 45 has turned to the low level (L). On this occasion, the mode control signal goes low if the high-level (H) signal indicative of protraction of the seatbelt by the occupant or the high-level (H) signal indicative of attaching of the seatbelt tongue to the buckle is delivered through the OR circuit 46 to the detecting circuit 45. If the mode control signal has not turned to the low level (L), the same determination is repeated, whereas if the mode control signal has turned to the low level (L), the power consumption mode is set to the normal power consumption mode at a step S3407. Then, a low-level (L) control signal is delivered to the detecting circuit 45 through the input terminal P7 at a step S3408, followed by terminating the present processing.

As described above, according to the present embodiment, upon the lapse of the predetermined time period t after disconnection of the seatbelt from the occupant is detected while the MPU 14 is in the normal power consumption mode, the power consumption mode is set to the reduced power consumption mode whereby all the functions of the MPU 14 are stopped except for the function of receiving the mode control signal. Thereafter, when protraction of the seatbelt by the occupant or attaching of the seatbelt tongue to the buckle is detected, the power consumption mode is set to the normal power consumption mode whereby all the functions of the MPU 14 can be resumed. Thus, it is possible to change the operative state of the MPU 14 according to the expected ability thereof to thereby reduce the power consumption.

Eighth Embodiment

Figure 34:
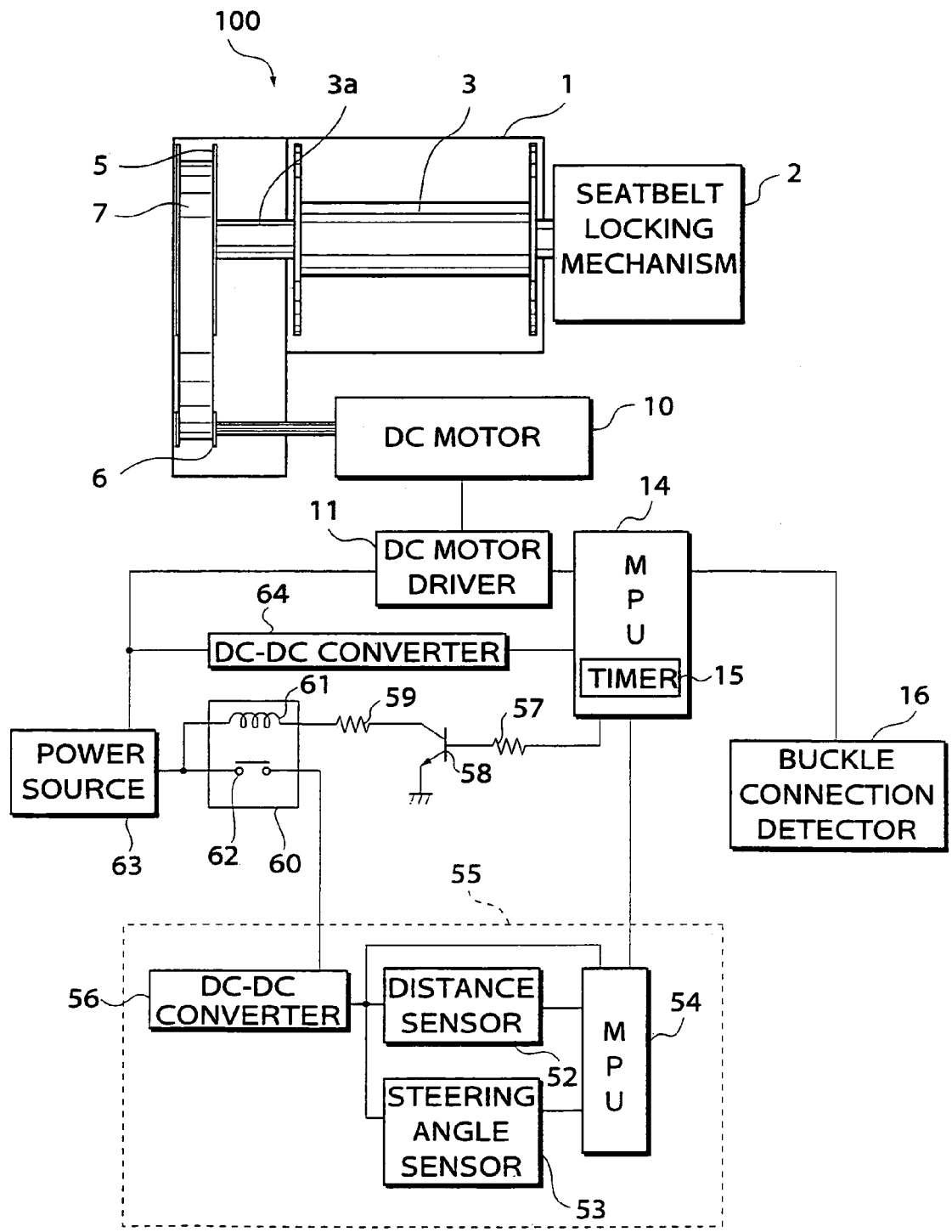
FIG. 34 is a block diagram showing the arrangement of an electric retractor 800, provided in an automotive passenger restraint and protection apparatus according to an eighth embodiment of the invention.

FIG. 34 shows the arrangement of an electric retractor 800 provided in an automotive passenger restraint and protection apparatus according to an eighth embodiment of the invention.

In FIG. 34, the DC motor driver 11 is connected to a power source 63 which supplies the DC motor driver 11 with supply power required for driving the DC motor 10. The electric retractor 800 includes a driving/traveling state detector 55 for detecting states of driving and traveling of the automotive vehicle by the occupant, which is comprised of an MPU 54 which is connected to the MPU 14, a distance sensor 52, a steering angle sensor 53, and a DC-DC converter 56.

The MPU14 is connected to the power source 63 through a DC-DC converter 64 which converts supply voltage from the power source 63 to a level suitable for operation of the MPU 14, e.g. 5 volts. A transistor 58 has a base thereof connected through a resistance 57 to the MPU 14. The transistor 58 has an emitter thereof grounded and a collector thereof connected through a resistance 59 to a coil 61 of a relay circuit 60. The coil 61 is connected to the power source 63, which is connected through contacts 62 of the relay circuit 60 to the DC-DC converter 56 which converts supply voltage from the power source 63 to a level suitable for operation of the MPU 14 as well as the distance sensor 52 and the steering angle sensor 53, e.g. 5 volts. The DC-DC converter 56 is connected to the MPU 54 as well as the distance sensor 52 and steering angle sensor 53 which are connected to the MPU 54.

The distance sensor 52 detects the distance between the present vehicle (occupant's vehicle) and an object lying ahead of the vehicle, and the steering angle sensor 53 senses the steering angle of a steering arm of the vehicle.

The MPU 14 determines whether protraction of the seatbelt has been made, from the sign of terminal voltage across the DC motor 10, and also determines whether retraction of the seatbelt has been completed, from the current i flowing to the DC motor 10.

Next, the flow of control signals at various components of the automotive passenger restraint and protection apparatus according to the present embodiment will be described.

The distance sensor 52 delivers an output signal indicative of results of detection of the distance between the present vehicle and an object lying ahead of the vehicle to the MPU 54. The MPU 54 calculates a safety distance ds (m) between the present vehicle and an object lying ahead by the use of the following formula (1), and when the calculated safety distance ds is larger than a value indicated by the output signal from the distance sensor 52, the MPU 54 delivers an output signal for collision danger warning to the MPU 14. Further, the MPU 54 calculates a collision unavoidable distance dd (m) by the use of the following formula (2), and when the calculated collision unavoidable distance dd is larger than a value indicated by the output signal from the distance sensor 52, the MPU 54 delivers an output signal indicative of a collision being unavoidable, to the MPU 14.

$$ds = Vr \times (td + \beta) \quad (1)$$

$$dd = Vr \times td \quad (2)$$

where Vr represents relative speed (m/sec), td response delay of the driver (e.g. 0.5 to 2 sec), and β a value determined by the braking characteristic of the vehicle (e.g. 0.5 to 2 sec).

The steering angle sensor 53 delivers an output signal indicative of the sensed steering angle to the MPU 54, and when the maximum value of change amount in the detected steering angle within a prescribed time period (e.g. 2 sec) is less than a predetermined value (e.g. 8 degrees), the MPU 15 judges that the driver might be dozing and delivers an output signal for doze warning to the MPU 14.

The buckle connection detector 16 detects whether the tongue of the seatbelt has been connected to the buckle, and delivers an output signal indicative of results of the detection to the MPU 14. The DC motor driver 11 controls the rotation of the DC motor 10, based upon a control signal from the MPU 14.

The MPU 14 operates in response to the signal from the buckle connection detector 16, indicating that the seatbelt tongue has been connected to the buckle, to deliver a high-level signal to the transistor 58 through the resistance 57, whereby the transistor 58 is turned on to permit current to flow from the power source 63 to the coil 61 to close the contacts 62, and permit supply voltage to be supplied to the MPU 54 as well as to the distance sensor 52 and the steering angle sensor 53. On the other hand, when the signal from the buckle connection detector 16, indicating that the seatbelt tongue has been connected to the buckle has ceased to be delivered to the MPU 14, the MPU 14 delivers a low-level signal to the transistor 58, whereby the transistor 58 is turned off to stop supply of current from the power source 63 to the coil 61 to open the contacts 62 and stop supply of the supply voltage to the MPU 54 as well as to the distance sensor 52 and the steering angle sensor 53.

As described above, according to the present embodiment, it is controlled such that when the seatbelt is in the attached state, supply voltage from the power source is supplied to the MPU 54 nor to the distance sensor 52 and the steering angle sensor 53, while when the seatbelt is in the disconnected state, supply voltage from the power source is not supplied to the MPU 54 nor to the distance sensor 52 and the steering angle sensor 53. Thus, only when it is necessary to operate these components, the supply voltage can be supplied, thereby reducing the power consumption.

Although in the present embodiment the control of supply voltage to the MPU 54, etc. is made depending upon whether the seatbelt is in the attached state or in the disconnected state, this is not limitative. For example, alternatively the control of supply voltage to the MPU 54 and its peripheral components may be carried out depending upon a shift position of a transmission of the automotive vehicle, providing substantially the same results. More specifically, a shift position sensor may be connected to the MPU 14, and if the detected shift position is the parking position, the supply of power to the MPU 54 and its peripheral components is inhibited, while if the detected shift position is other than the parking position, the supply of the MPU 14, etc. is permitted. Further, the control of supply voltage to the MPU 54 and its peripheral components may be carried out depending upon whether a parking brake of the automotive vehicle is pulled up or in operative position, providing substantially the same results. More specifically, a parking brake position sensor may be connected to the MPU 14, and if the detected parking brake position is the pulled-up or operative position, the supply of power to the MPU 54 and its peripheral components is inhibited, while if the detected parking brake position is other than the pulled-up or operative position, the supply of the MPU 14, etc. is permitted.

Ninth Embodiment

An electric retractor provided in an automotive passenger restraint and protection apparatus according to a ninth embodiment of the invention is identical in construction with the electric retractor 100, illustration and description of which are therefore omitted.

Figure 35:
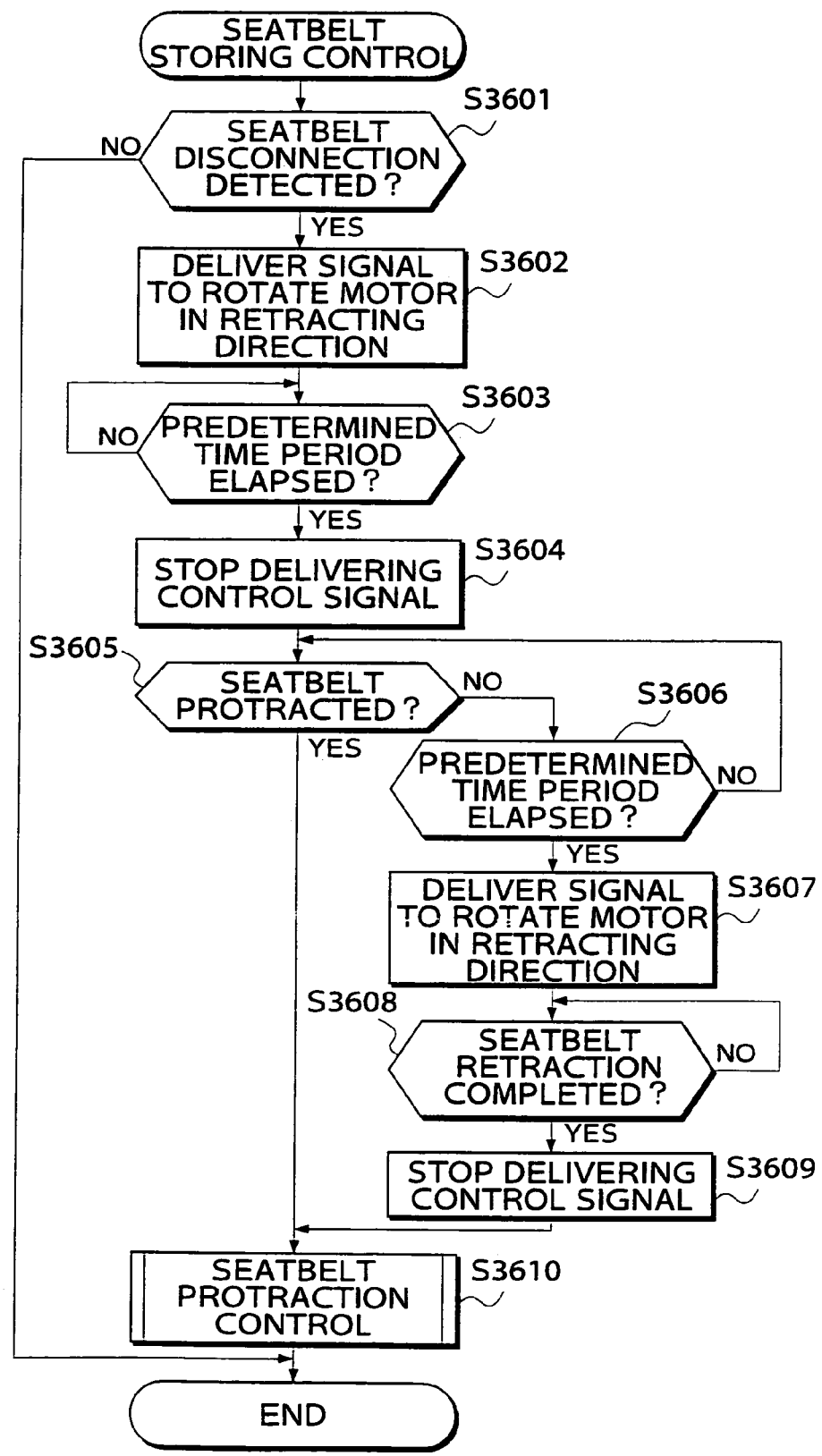
FIG. 35 is a flowchart showing seatbelt storing control according to a ninth embodiment of the invention executed by the MPU 14 in retracting the seatbelt.

FIG. 35 is a flowchart showing seatbelt storing control according to the ninth embodiment, executed by the MPU 14 in retracting the seatbelt.

First, it is determined at a step S3601 whether disconnection of the seatbelt tongue from the buckle has been detected by the buckle connection detector 16. If disconnection of the seatbelt tongue has not been detected, the present processing is immediately terminated, whereas if disconnection of the seatbelt tongue has been detected, a control signal is delivered to the DC motor driver 11 to rotate the reel shaft 3 in the seatbelt retracting direction at a step S3602, whereby the seatbelt is retracted. On this occasion, the timer 15 measures time elapsed after the start of delivery of the control signal to the DC motor driver 11.

Then, it is determined at a step S3603 whether a predetermined time period (e.g. 3 sec) has elapsed after the start of delivery of the control signal to the DC motor driver 11. Upon the lapse of the predetermined time period, a control signal is delivered to the DC motor driver 11 to stop the rotation of the reel shaft 3 at a step S3504, whereby the rotation of the reel shaft 3 is stopped. On this occasion, it is assumed that locking of the seatbelt by the seatbelt locking mechanism 2 does not take place. On this occasion, the timer 15 measures time elapsed after the delivery of the control signal to the DC motor driver 11 to stop the rotation of the reel shaft 3.

Then, it is determined at a step S3605 whether protraction of the seatbelt has been made. If protraction of the seatbelt has been made, seatbelt protraction control is executed, as described hereinafter. If protraction of the seatbelt has not been made, it is determined at a step S3606 whether a predetermined time period (e.g. 10 sec) has elapsed after the delivery of the control signal to the DC motor driver 11 to stop the rotation of the reel shaft 3. If the predetermined time period has not yet elapsed, the processing returns to the step S3605, whereas if it has elapsed, a control signal is delivered to the DC motor driver 11 to rotate the reel shaft 3 in the seatbelt retracting direction at a step S3607, whereby the seatbelt is retracted.

Then, it is determined at a step S3608 whether the retraction of the seatbelt has been completed. If the completion of the retraction has been completed, a control signal is delivered to the DC motor driver 11 to stop the rotation of the reel shaft 3 at a step S3609, and then the seatbelt protraction control is executed, as described hereinafter, at a step S3610, followed by terminating the present processing.

Figure 36:
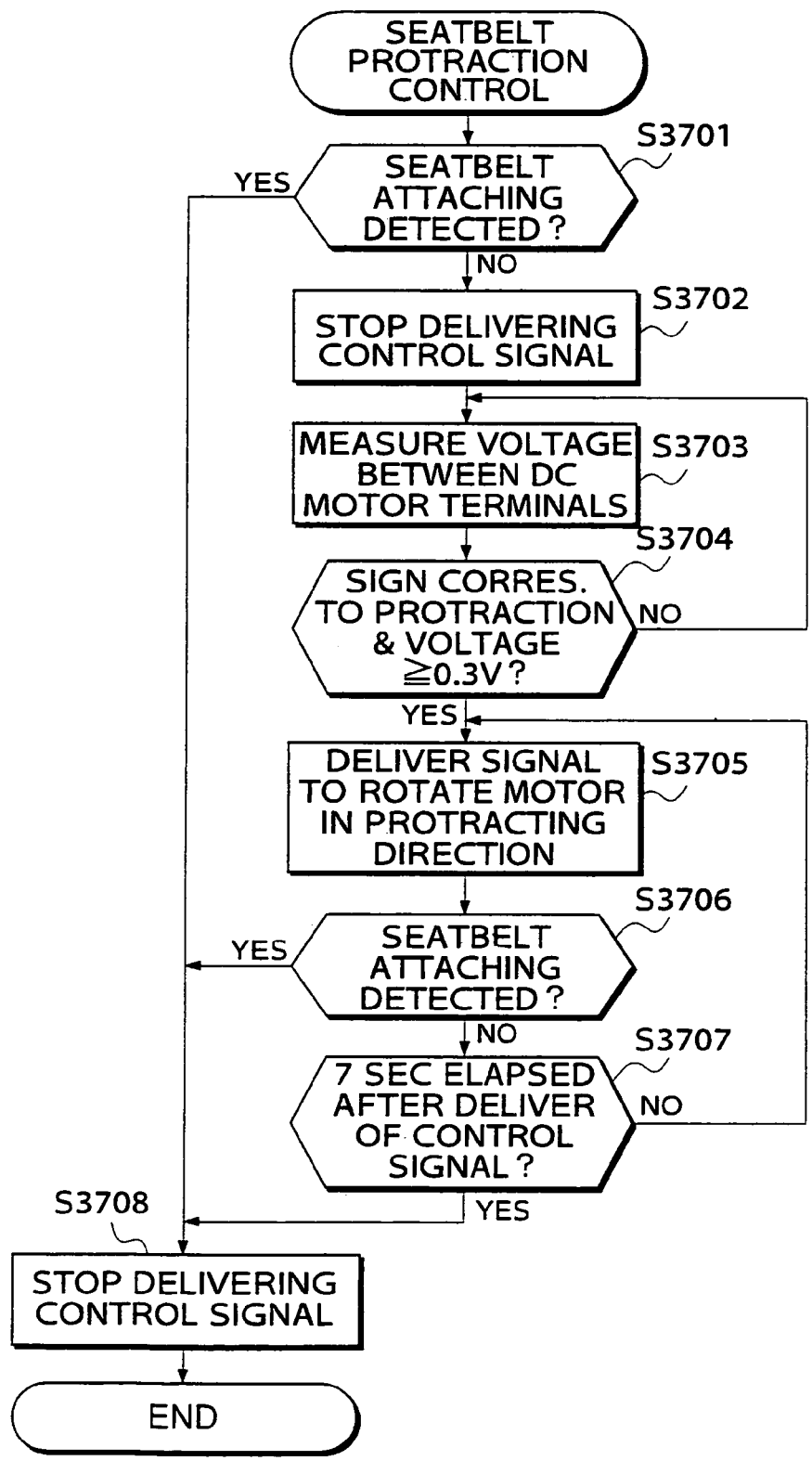
FIG. 36 is a flowchart showing seatbelt protraction control according to the ninth embodiment executed by the MPU 14 in protracting the seatbelt.

FIG. 36 is a flowchart showing seatbelt protraction control according to the ninth embodiment, executed by the MPU 14 in protracting the seatbelt.

First, it is determined at a step S3701 whether attaching of the seatbelt tongue to the buckle has been detected by the seatbelt connection detector 16. If attaching of the seatbelt tongue to the buckle has been detected, it is regarded that the protraction of the seatbelt has been completed, and a control signal is delivered to the DC motor driver 11 to stop the rotation of the reel shaft 3 at a step S3708, followed by terminating the present processing. On the other hand, if attaching of the seatbelt tongue to the buckle has not been detected, a control signal is delivered to the DC motor driver 11 to stop the rotation of the reel shaft 3 so as to execute assisting of the protraction of the seatbelt at a step S3702.

Then, the terminal voltage across the DC motor 10 and the sign thereof are measured by the circuit C2 of the DC motor driver 11 at a step S3703. It is determined whether the measured terminal voltage exceeds a predetermined value (e.g. 0.3 volts) and at the same time the sign of the terminal voltage corresponds to the direction of protracting the seatbelt at a step S3704. The answer to this question becomes affirmative (YES) if the occupant lightly protracts the seatbelt.

If it is determined at the step S3704 that the terminal voltage does not exceed the predetermined value (0.3 volts) or the sign does not correspond to the direction of protracting the seatbelt, the processing returns to the step S3703, whereas if the terminal voltage exceeds the predetermined value (0.3 volts) and at the same time the sign of the terminal voltage corresponds to the direction of protracting the seatbelt, the MPU 14 delivers a control signal commanding to rotate the reel shaft 3 in the seatbelt protracting direction, to the DC motor driver 11 at a step S3705, whereby the seatbelt can be easily protracted.

According to the control of the steps S3701 to S3705 described above, when the measured terminal voltage exceeds the predetermined value (0.3 volts) and at the same time the sign of the terminal voltage corresponds to the direction of protracting the seatbelt, the seatbelt can be brought into a state where it can be easily protracted. As a result, a large force as required in the conventional apparatus is not needed, and therefore even a weak occupant who has degraded physical ability such as an advanced-age occupant can easily mount the seatbelt onto his body.

Then, it is determined at a step S3706 whether attaching of the tongue of the seatbelt has been detected by the buckle connection detector 16. If attaching of the seatbelt has been detected, the processing proceeds to the step S3708. On the other hand, if attaching of the seatbelt has not been detected, it is determined at a step S3707 whether a predetermined time period (e.g. 7 sec) has elapsed after the control signal commanding to rotate the reel shaft 3 was delivered to the DC motor driver 11.

If the predetermined time period has not elapsed, the processing returns to the step S3705, whereas if it has elapsed, which means that the seatbelt has been protracted but the tongue of the seatbelt has not been connected to the buckle such that the seatbelt is in a slackened state, a control signal commanding to stop the rotation of the reel shaft 3 is delivered to the DC motor driver 11 at a step S3708, followed by terminating the present processing.

As described above, according to the present embodiment, when disconnection of the seatbelt tongue from the buckle has been detected, retraction of the seatbelt is started. Then, before completion of the retraction, the retraction of the seatbelt is stopped by stopping the rotation of the reel shaft 3 for a predetermined time period. If the seatbelt is protracted during the predetermined time period, the seatbelt protraction control is executed, whereas if the seatbelt is not protracted over the predetermined time period, retraction of the seatbelt is carried out. Therefore, in the case where if the seatbelt tongue is once disconnected from the buckle and soon then the seatbelt tongue is connected to the buckle, it is not necessary to protract or pull the seatbelt against the retracting force of the electric retractor, as is distinct from the conventional automotive passenger restraint and protection apparatus, to thereby facilitate mounting of the seatbelt onto the occupant.

Although in the present embodiment the retraction of the seatbelt is stopped only one time over the predetermined time period before completion of the retraction (steps S3604 to S3606), the stopping of the retraction may be made a plurality of times.

Tenth Embodiment

Figure 37:
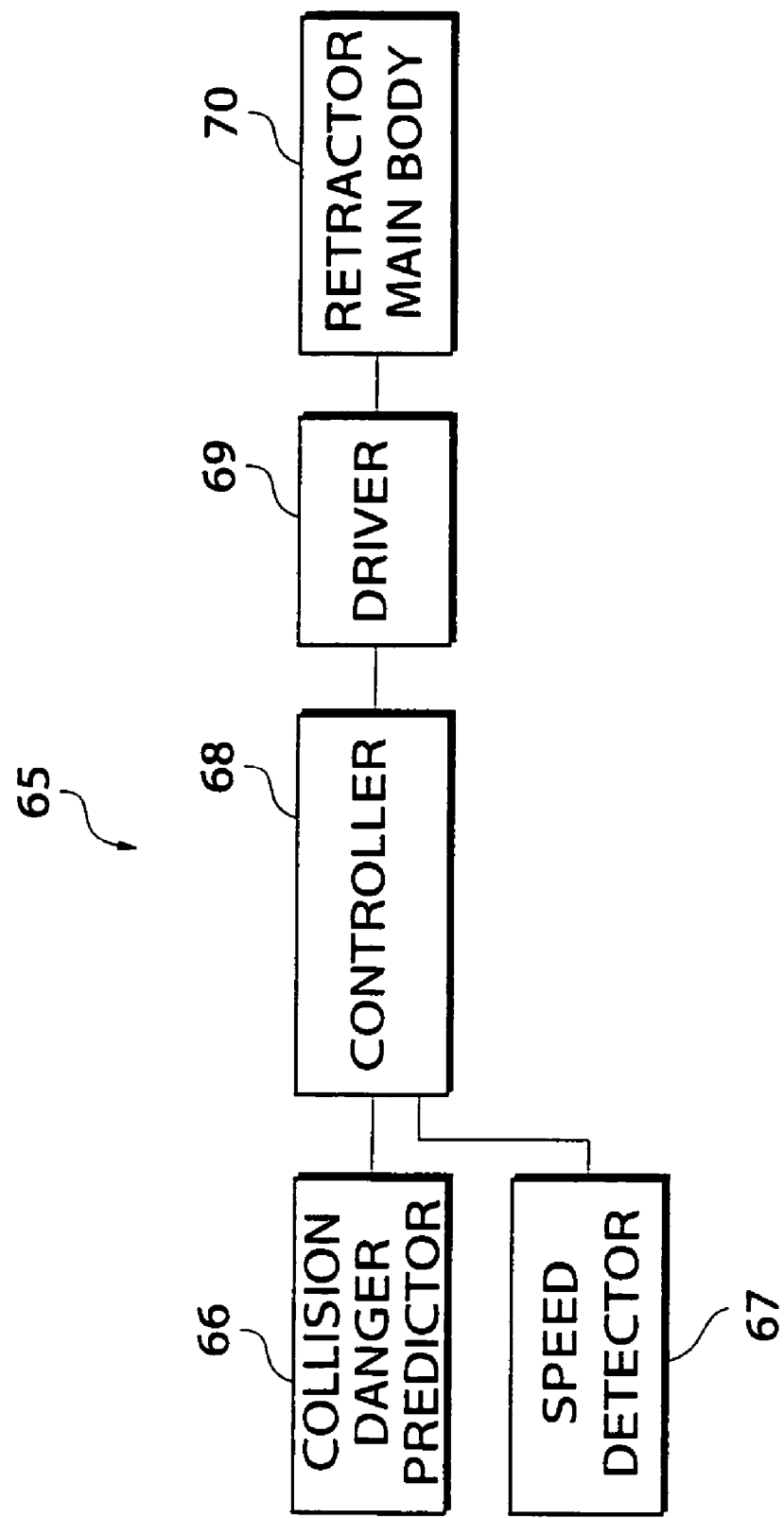
FIG. 37 is a block diagram showing the arrangement of an automotive passenger restraint and protection apparatus according to a tenth embodiment of the invention.

FIG. 37 shows the arrangement of an automotive passenger restraint and protection apparatus according to a tenth embodiment of the invention. The automotive passenger restraint and protection apparatus according to the present embodiment is comprised of a collision danger predictor 66, a speed detector 67, a controller 68, a driver 69, and a retractor main body 70.

The collision danger predictor 66 is adapted to generate a collision unavoidableness signal indicating that a degree of danger of collision of the automotive vehicle with an obstacle lying ahead has reached such a degree that the collision cannot be avoided only through operation of the driver, and a collision danger signal indicating that a danger of collision is impending but the collision can be avoided through operation of the driver. The speed detector 67 generates a signal indicative of the traveling speed of the automotive vehicle.

The controller 68 controls the driver 69, based upon the signals from the collision danger predictor 66 and the speed sensor 67. The driver 69 drives the retractor main body 70 which carries out retraction and protraction of the seatbelt.

Figure 38:
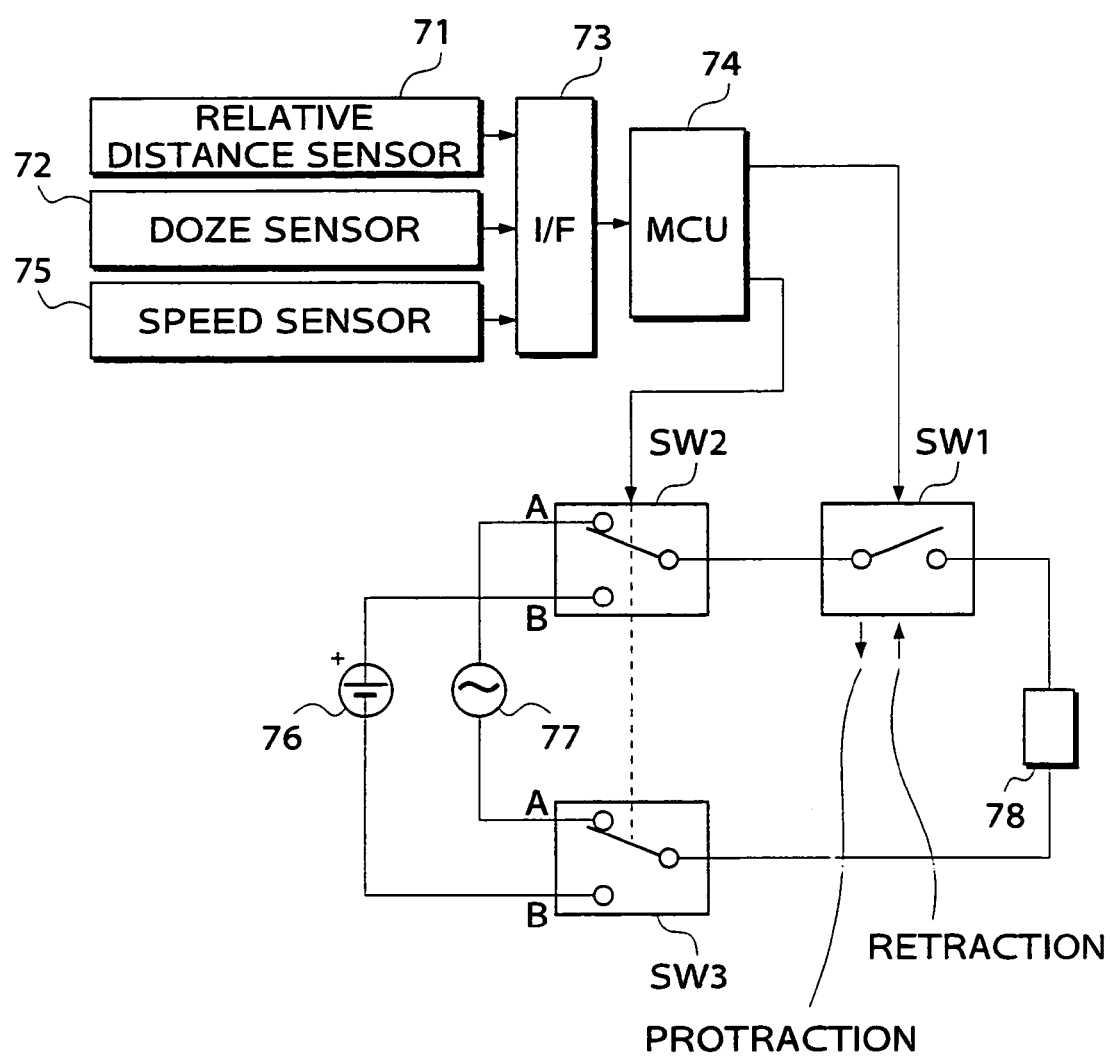
FIG. 38 is a block diagram showing details of the arrangement of the automotive passenger restraint and protection apparatus according to the tenth embodiment.

FIG. 38 shows details of the arrangement of the automotive passenger restraint and protection apparatus according to the tenth embodiment. The collision danger predictor 66 is comprised of a relative distance sensor 71, a doze sensor 72, an interface (I/F) 73, and a microcomputer unit (MCU) 74. The relative distance sensor 71 is adapted to generate a voltage signal corresponding to the distance between an obstacle and the present automotive vehicle. The doze sensor 72 is adapted to detect a change in the steering angle sensed by a steering angle sensor provided in a steering of the automotive vehicle and generate a signal indicative of a doze of the driver if the change in the steering angle exceeds a predetermined value, for example.

The speed detector 67 is formed of a speed sensor 75 and generates and delivers a signal indicative of the sensed traveling speed V of the vehicle to the MPU 74 via the interface 73.

The controller 68 is mainly comprised of the MCU 74, to which are connected via the interface 73 the relative distance sensor 71, the doze sensor 72 and the speed sensor 75. The MCU 74 stores in an internal memory thereof the traveling speed V of the vehicle sensed by the speed sensor 75 and produces the collision danger signal and the collision unavoidableness signal based upon output signals from the relative distance sensor 71 and the doze sensor 72 and delivers these signals to switches SW1, SW2, and SW3.

The driver 69 is comprised of a motor 78, the switches SW1, SW2, and SW3, a DC power source 76, and an oscillator 77. When the collision danger signal is received from the MCU 74, the driver 69 operates in response to the collision danger signal to close the switch SW1 and at same time cause movable contacts of the switches SW2 and SW3 to be connected to respective fixed contacts A, whereby an output signal from the oscillator 77 is delivered to the motor 78. The oscillator 77 has an oscillation frequency of 20 Hz in the present embodiment.

When the collision unavoidableness signal is received from the MCU 74, the driver 69 operates in response to the collision unavoidableness signal to close the switch SW1 and at the same time causes the movable contacts of the switches SW2 and SW3 to be connected to respective fixed contacts B, whereby output voltage from the DC power source 76 is applied to the motor 78.

Figure 39A:
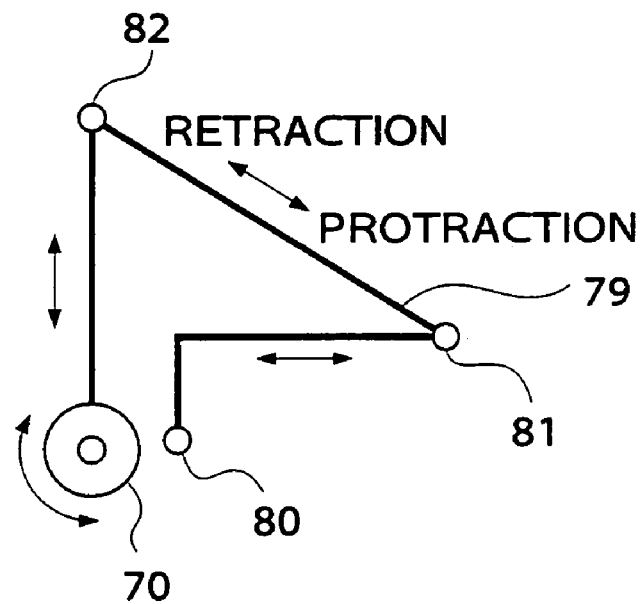
FIG. 39A is a schematic view showing the construction of a seatbelt device with an electric retractor according to the tenth embodiment.
Figure 39B:
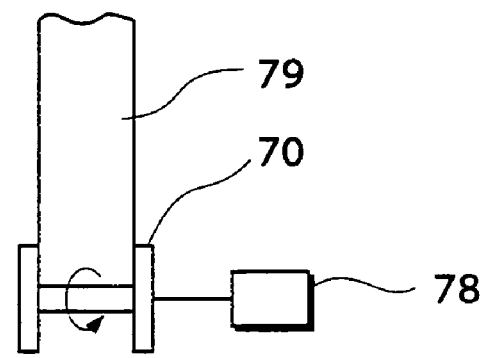
FIG. 39B is a schematic view showing the construction of the seatbelt device of FIG. 39A, as viewed from a different angle.

FIGS. 39A and 39B schematically show the construction of a seatbelt device with the electric retractor according to the present embodiment. In the seatbelt device, a seatbelt 79 with one end thereof fixed to a stationary shaft 80 extends through a buckle 81, a shoulder portion 82 and is wound on the retractor main body 70. When the motor 78, which is directly coupled to the retractor main body 70, is driven, retraction or protraction of the seatbelt 79 is carried out while the tension of the seatbelt 79 is increased or decreased.

Figure 40:
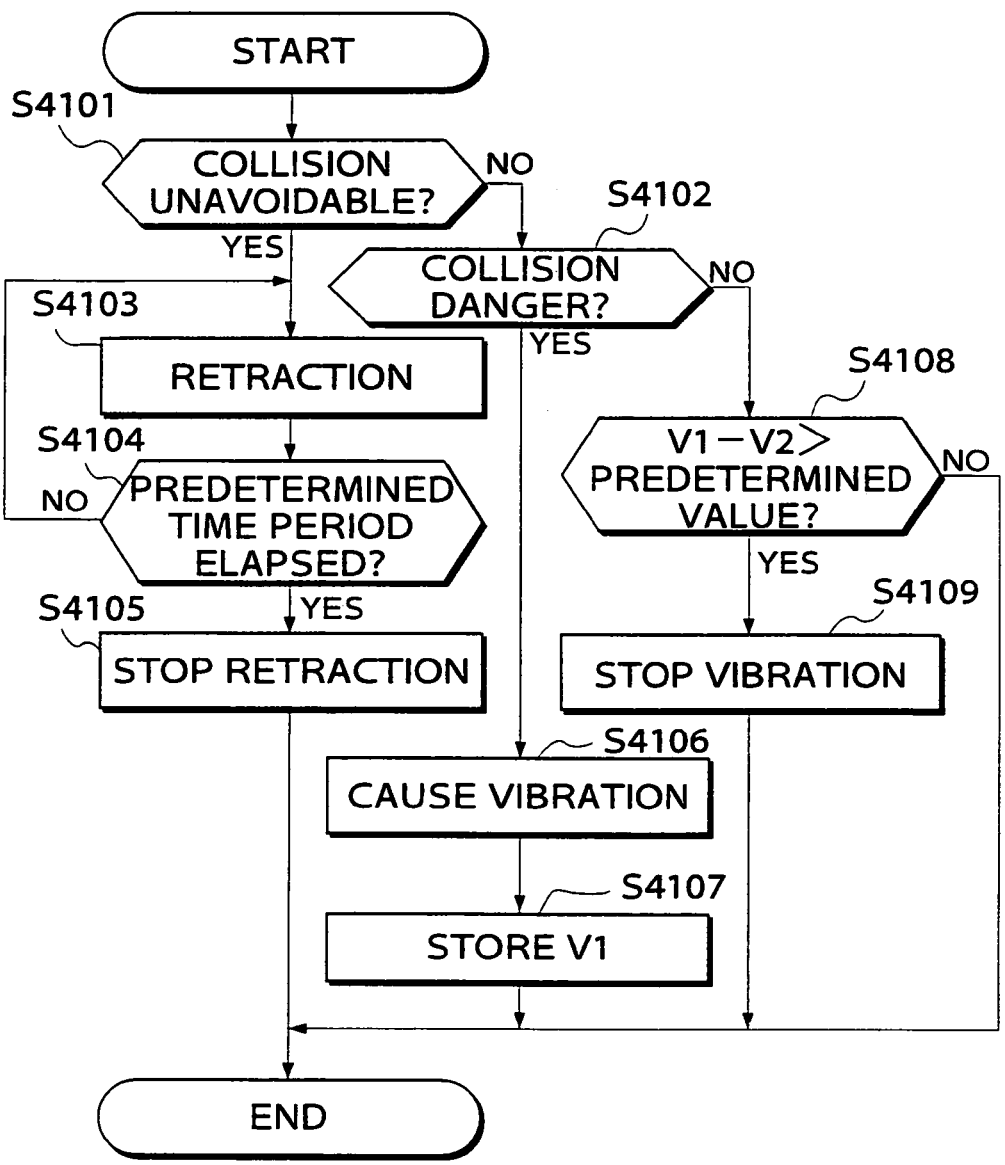
FIG. 40 is a flowchart showing a manner of operation of the automotive passenger restraint and protection apparatus according to the tenth embodiment.

FIG. 40 is a flowchart showing a manner of operation of the automotive passenger restraint and protection apparatus according to the present embodiment.

This processing is executed at predetermined time intervals during a time period of seatbelt attaching as electric retractor control. First, it is determined at a step S4101 whether a collision of the vehicle with an obstacle lying ahead is unavoidable. If the collision is not unavoidable, it is determined at a step S4102 whether there is a danger or possibility of a collision of the vehicle with an obstacle lying ahead. More specifically, these determinations are carried out in the following manner:

That is, a relative distance $\Delta d$ between the vehicle and the obstacle is detected by the relative distance sensor 71. Based upon the detected relative distance $\Delta d$, a relative speed $\Delta V$ between the obstacle and the vehicle ($=\Delta di-\Delta di-1$) is calculated. Based upon the calculated relative speed $\Delta V$, a time period t before the expected collision ($=\Delta d/\Delta V$) is estimated.

It is determined whether the time period t before the expected collision exceeds a predetermined time period t1, that is, whether there is a possibility of collision. If the time period t before the expected collision is shorter than the predetermined time period t1, it is determined whether the time period t before the expected collision is equal to or longer than a predetermined time period t2 which is shorter than the predetermined time period t1. If the time period t is shorter than the predetermined time period t2, it is judged that a collision of the vehicle with the obstacle lying ahead cannot be avoided only through operation of the driver, and then the MPU 74 generates the collision unavoidableness signal. On the other hand, if the time period t is equal to or longer than the predetermined time period t2, the MPU 74 generates the collision danger signal.

Further, on the other hand, if the time period t before the expected collision is equal to or longer than the predetermined time period t1, it is determined whether a signal has been generated from the doze sensor 72, which indicates that the driver is dozing, and if the signal has been generated, the MPU 74 generates the collision danger signal. On the other hand, if th signal has not been generated, it is regarded that there is no possibility of collision, and then the MCU 74 does not generate the collision danger signal.

If it is determined at the step S4101 that a collision of the vehicle with an obstacle lying ahead is unavoidable, the MCU 74 delivers the collision unavoidableness signal to the switches SW1, SW2, and SW3 to close the switch SW1 and cause the movable contacts of the switches SW2 and SW3 to be connected to the respective fixed contacts B, whereby output voltage from the DC power source 76 is applied to the motor 78 to drive the same to start retraction of the seatbelt 79 at a step S4103. Then, the lapse of a predetermined time period is waited at a step S4104. Upon the lapse of the predetermined time period, the retraction is stopped at a step S4105, followed by terminating the processing. This predetermined value is set to a time period within which the tension of the seatbelt 79 can be increased by the driving of the motor 78 to properly fasten or restrain the occupant.

On the other hand, if it is determined at the step S4102 that there is a danger of a collision of the vehicle with an obstacle lying ahead, the MPU 74 delivers the collision danger signal to the switches SW1, SW2, and SW3 to close the switch SW1 and cause the movable contacts of the switches SW2 and SW3 to be connected to the respective fixed contacts A, whereby an output signal (frequency: 20 Hz) from the oscillator 77 is supplied to the motor 78 to drive the same to cause alternate retraction and protraction of the seatbelt 79 onto or from the retractor main body 70 to periodically increase and decrease or generate vibration by applying pressure to and release the same from the occupant at a step S4106. Then, the traveling speed V1 of the present vehicle sensed by the speed sensor 75 is stored in the internal memory of the MCU 74 at a step S4107, followed by terminating the present processing.

On the other hand, if it is determined at the step S4102 that there is no danger of collision and hence the collision danger signal is not generated, it is determined at a step S4108 whether a difference $\Delta V$ between the traveling speed V1 of the present vehicle stored at the step S4107 and a current traveling speed V2 of the present vehicle exceeds a predetermined value. The predetermined value is set to such a value that the vehicle has been sufficiently decelerated after the collision danger signal ceased to be generated and the vehicle cannot be expected to enter a dangerous state.

If it is determined that the speed difference $\Delta V$ exceeds the predetermined value, it is judged that a dangerous state has been fully obviated, and then the MCU 74 delivers a signal to the switch SW1 to open the same to thereby deenergize the motor 78 to stop the vibration of the seatbelt at a step S4102. On the other hand, if the speed difference $\Delta V$ does not exceed the predetermined value, it is judged that a dangerous state has not yet been fully obviated, and then the MCU 74 keeps the switch SW1 closed and the movable contacts of the switches SW2 and SW3 connected to the respective fixed contacts A, followed by terminating the processing.

As described above, according to the present embodiment, when it is determined that there is no danger of a collision of the vehicle with an obstacle to stop generation of the collision danger signal, it is determined whether the speed difference $\Delta V$ between the stored traveling speed V1 of the vehicle and the current traveling speed V2 of the vehicle exceeds a predetermined value, and if the former does not exceed the latter, it is judged that a dangerous state has not been fully obviated, and then the processing is terminated without stopping vibration of the seatbelt. As a result, so long as it can be expected that the vehicle enters a dangerous state even after the collision danger signal ceases to be generated, vibration is continued by alternately applying pressure and release the same to and from the occupant to thereby fully alert the occupant to the danger. Thus, the automotive passenger restraint and protection apparatus can be effectively utilized as a warning device.

Although in the present embodiment the switches SW1 to SW3 are switched by signals from the MCU 74 to selectively deliver supply voltage from the DC power source 76 or the output from the oscillator 77 to the motor 78, this is not limitative, but, for example, an interface circuit for detecting terminal voltage across the motor or supply current to the motor and a motor driving circuit may be provided such that the MCU 14 detects the terminal voltage or the supply current and controls the motor driving circuit based upon the detected terminal voltage or supply current to thereby drive the motor 78 for retraction and protraction of the seatbelt.

Eleventh Embodiment

An automotive passenger restraint and protection apparatus according to an eleventh embodiment of the invention includes an electric retractor 1100, which is distinguished from the electric retractor 100 of FIG. 1 in that an A/D converter 83 is included in the MPU 14, for sampling voltage signals every predetermined time period. Except for this, the construction of the electric retractor 1100 is identical with that of the electric retractor 100, illustration and description of which are therefore omitted.

Figure 41A:
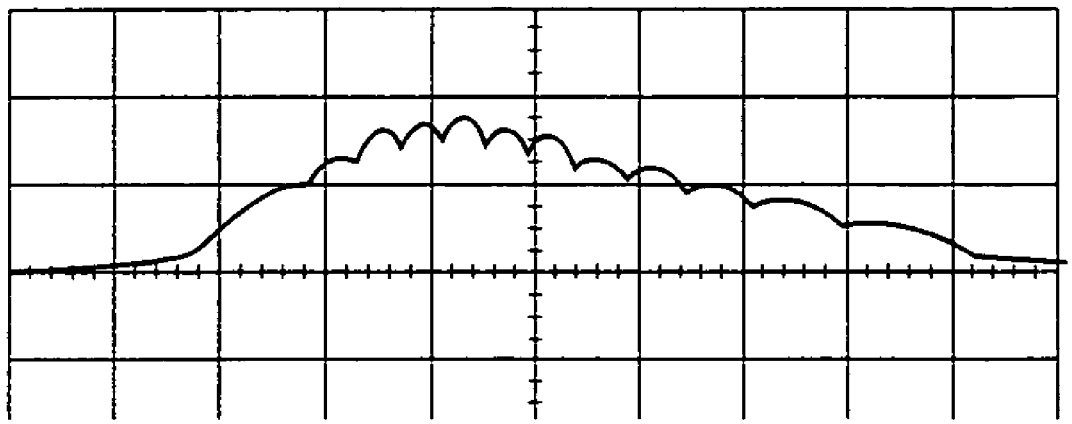
FIG. 41A is a diagram showing an example of the waveform of terminal voltage across the DC motor 10 assumed when the seatbelt is slowly protracted by the occupant.
Figure 41B:
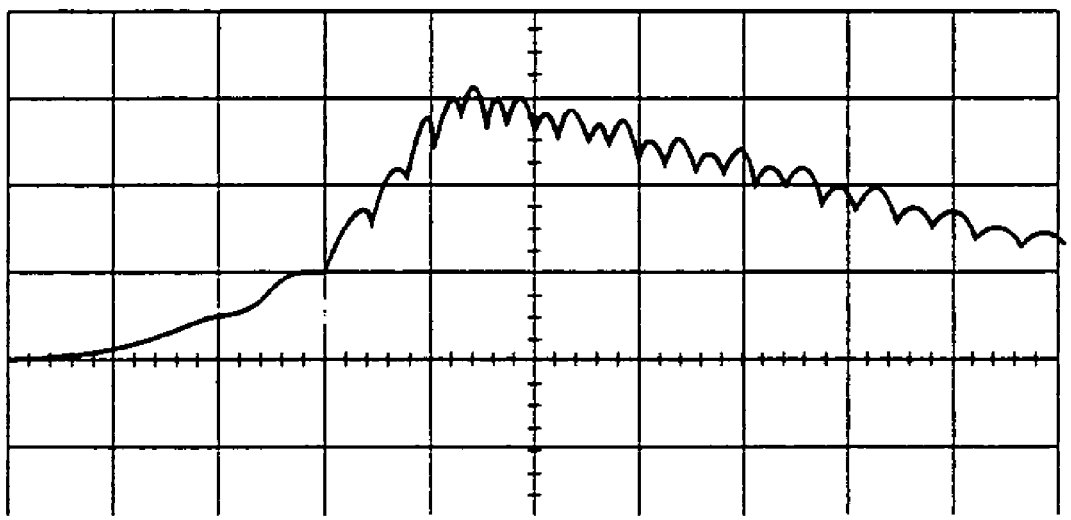
FIG. 41B is a diagram showing an example of the waveform of terminal voltage across the DC motor 10 assumed when the seatbelt is quickly protracted by the occupant.

The MPU 14 receives voltage signals from the IFs IF3 and IF4 in FIG. 2 and measures terminal voltage across the DC motor 10, based upon the received voltage signals. FIG. 41A shows an example of the waveform of terminal voltage across the DC motor 10 containing pulsating components assumed when the seatbelt is slowly protracted by the occupant, and FIG. 41B shows an example of the waveform of terminal voltage across the DC motor 10 containing pulsating components assumed when the seatbelt is quickly protracted by the occupant.

Figure 42:
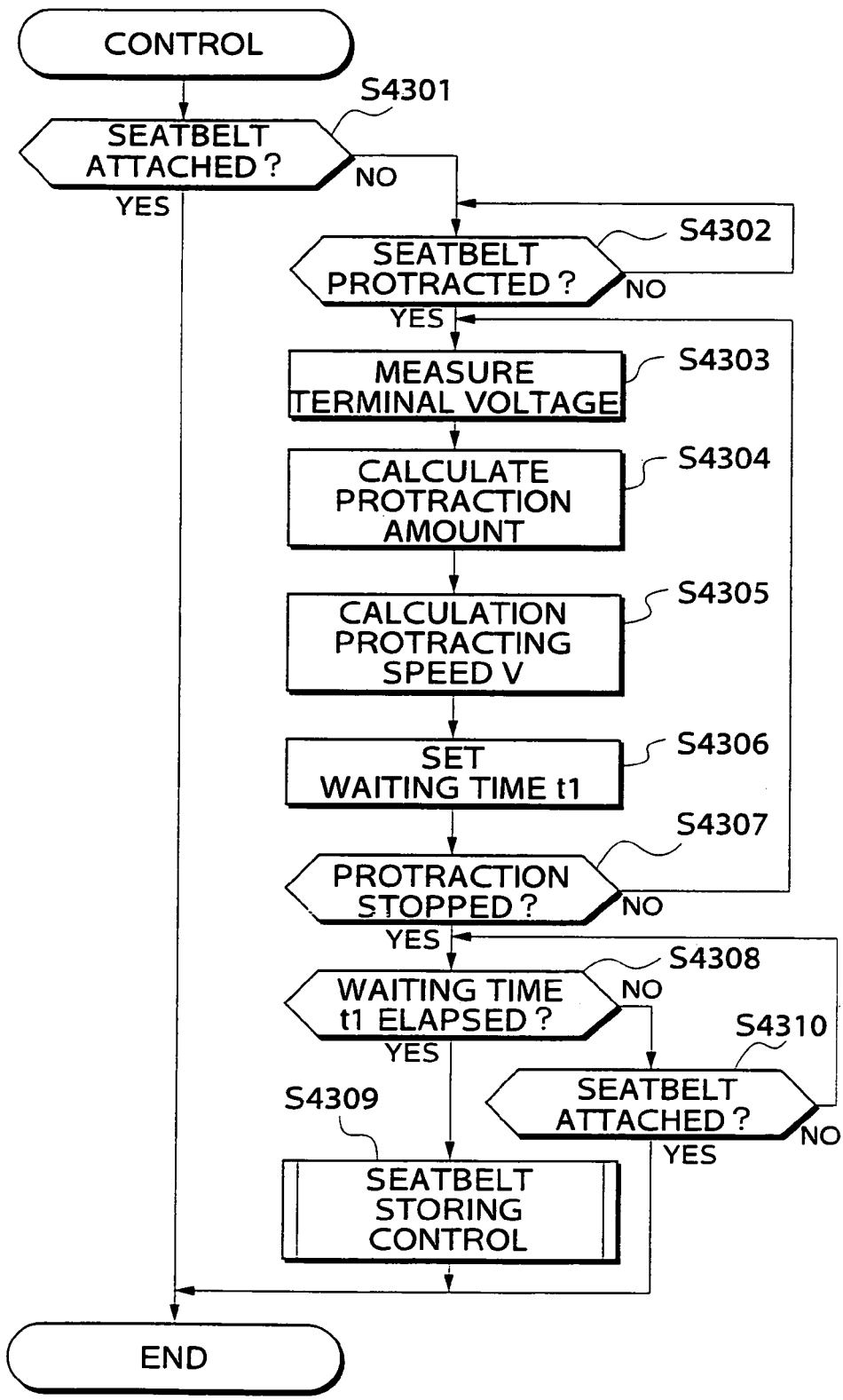
FIG. 42 is a flowchart showing a control program according to the eleventh embodiment, executed by the MPU 14.

FIG. 42 is a flowchart showing a control program according to the eleventh embodiment, executed by the MPU 14.

First, it is determined at a step S4105 whether attaching of the seatbelt tongue to the buckle has been detected by the buckle connection detector 16. If attaching of the seatbelt tongue to the buckle has been detected, the present processing is immediately terminated, whereas if attaching of the seatbelt tongue to the buckle has not been detected, it is determined at a step Serb whether the seatbelt is being protracted, from the terminal voltage across the DC motor 10. If the seatbelt is not being protracted, the same determination is repeated, whereas if the seatbelt is being protracted, the terminal voltage across the DC motor 10 is measured at a step S4303. More specifically, an amount of protraction of the seatbelt over a predetermined time period (e.g. 0.5 sec) is calculated from the measured terminal voltage.

An example of the manner of calculating the amount of protraction of the seatbelt, i.e. a length of the seatbelt protracted will be described hereinbelow.

Figure 43:
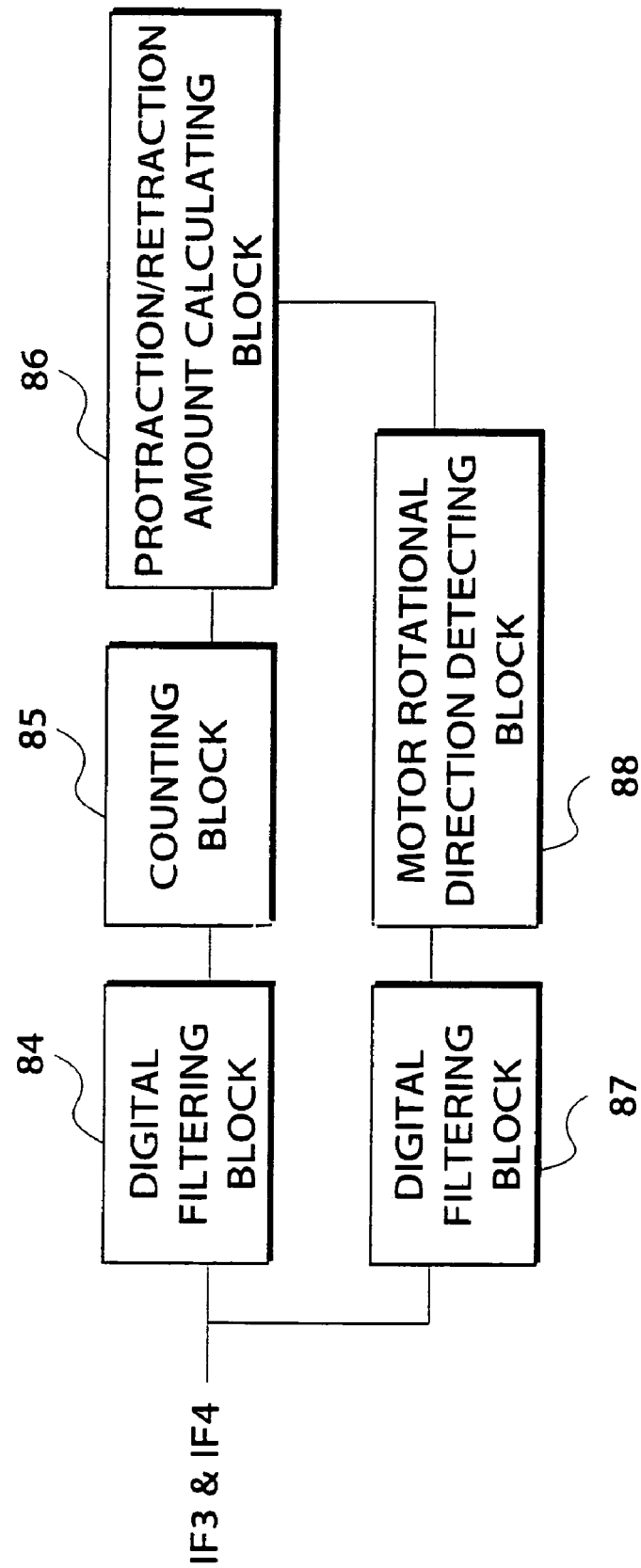
FIG. 43 is a block diagram showing the arrangement of an arithmetic processing portion of the apparatus according to the eleventh embodiment.

FIG. 43 is a block diagram showing contents of arithmetic processing executed by the MPU 14 according to the present embodiment provided in the electric retractor 1100.

The MPU 14 is comprised of a digital filtering block (high-pass filter) 84 for extracting only pulsating components from voltage signals from the IFs IF3 and IF4, a counting block 85 for counting a number of times the extracted pulsating components rise a predetermined voltage v0 (e.g. 1 volt) from a level below the predetermined voltage, a protraction/retraction amount calculating block 86 for calculating an amount of protraction or retraction of the seatbelt, based upon a count value obtained by the counting block 85, a digital filtering block (low-pass filter) 87 for removing only pulsating components from the voltage signals from the IFs IF3 and IF4, and a motor rotational direction detecting block 88 for detecting whether the rotational direction of the DC motor 10 is in the seatbelt protracting direction or in the seatbelt retracting direction, based upon the sign of the voltage signals with pulsating components removed therefrom.

Next, the operation of these blocks of the electric retractor 1100 for calculating the protraction amount or the retraction amount of the seatbelt will be described.

When the seatbelt has been protracted by the occupant, the reel shaft 3 is rotated, and the rotation is transmitted through the reel shaft pulley 5, the DC motor pulley 6, and the power transmission belt 7 to the rotary shaft of the DC motor 10 to rotate the same, whereby an electromotive force is generated. The A/D converter 83 samples the resulting voltage signals from the IFs IF3 and IF4 every predetermined time period.

In the digital filtering block 84, the voltage signal from the IF IF4 is subtracted from the voltage signal from the IF IF3, and the resulting difference voltage is subjected to high-pass filtering to extract only pulsating components therefrom. The counting block 85 counts the number of times the extracted pulsating components rise above the predetermined value V0 from a level below the same, and a signal indicative of the count value is delivered to the protraction/retraction amount calculating block 86.

On the other hand, in the digital filtering block 87, the voltage signal from the IF IF4 is subtracted from the voltage signal from the IF IF3, and the resulting difference voltage is subjected to low-pass filtering to remove only pulsating components therefrom. The resulting voltage signal free of pulsating components is delivered to the motor rotational direction detecting block 88, which in turn detects whether the rotational direction of the DC motor 10 is in the seatbelt protracting direction or in the seatbelt retracting direction, based upon the sign of the voltage signals free of pulsating components, and delivers a signal indicative of results of the detection (the seatbelt protracting direction in the present case) to the protraction/retraction amount calculating block 86.

In the protraction/retraction amount calculating block 86, the count value from the counting block 85 is multiplied by a predetermined value (e.g. 10 cm/1 count), and the amount of protraction of the seatbelt is calculated based upon the resulting product and the signal indicative of the detected rotational direction of the DC motor 10 from the motor rotational direction detecting block 88.

Referring back to FIG. 42, after the calculation of the length of the seatbelt over the predetermined time period (0.5 sec) at the step S4304, the speed v of protracting the seatbelt is calculated at a step S4305, and based upon the calculated protracting speed v, a waiting time t1 after stoppage of protraction of the seatbelt is set at a step S4306. The waiting time t1 is set in the following manner, for example:

TABLE 1

| PROTRACTING SPEED v (m/s) | WAITING TIME t1 (s) |
|---|---|
| v > 0.5 | t1 = 1.5 |
| 0.5 ≧ v ≧ 0.3 | t1 = 3 |
| 0.3 > v | t1 = 5 |

The above setting of the waiting time t1 takes into consideration the fact that in the case of an occupant having a high physical ability, the seatbelt protracting speed is high and the time period after stoppage of protraction of the seatbelt by the occupant and before completion of mounting of the seatbelt onto his body is relatively short, whereas in the case of an occupant having a low physical ability, the seatbelt protracting speed is low and the time period after the occupant protracts and before completion of mounting of the seatbelt onto his body is relatively long.

Next, it is determined at a step S4307 whether the protraction of the seatbelt has been terminated, from the current i flowing to the DC motor 10. If the protraction has not been terminated, the processing returns to the step S4303, whereas if the protraction has been terminated, it is determined at a step S4308 whether the waiting time t1 has elapsed after the termination of protraction of the seatbelt. If the waiting time t1 has elapsed, the seat storing control of FIG. 18 is executed at a step S4309, followed by terminating the present processing. If the waiting time t1 has not elapsed, it is determined at a step S4310 whether attaching of the seatbelt tongue to the buckle has been again detected by the buckle connection detector 16. If attaching of the seatbelt tongue has not been detected, the processing returns to the step S4308, whereas if attaching of the seatbelt tongue has been detected, the present processing is terminated.

As described above, according to the present embodiment, the waiting time t1 after the stoppage of protraction of the seatbelt is set according to the seatbelt protracting speed. As a result, even when an occupant of a high physical ability gets off the vehicle and closes the door in a short time after protracting the seatbelt, it can be prevented that the seatbelt is caught in the door. On the other hand, when an occupant of a low physical ability mounts the seatbelt onto his body, it can be prevented that the seatbelt starts to be retracted before he finishes mounting the seatbelt onto his body to impede his mounting motion, whereby a comfortable seatbelt attaching environment is provided.

Twelfth Embodiment

An automotive passenger restraint and protection apparatus according to a twelfth embodiment of the invention includes an electric retractor 1200, which is distinguished from the electric retractor 100 of FIG. 1 in that a danger degree detector 89 for detecting a degree of danger of collision of the automotive vehicle is connected to the MPU 14, in place of the temperature sensor 19 in FIG. 1. Except for this, the construction of the electric retractor 1200 is identical with that of the electric retractor 100, description of which is therefore omitted.

Figure 44:
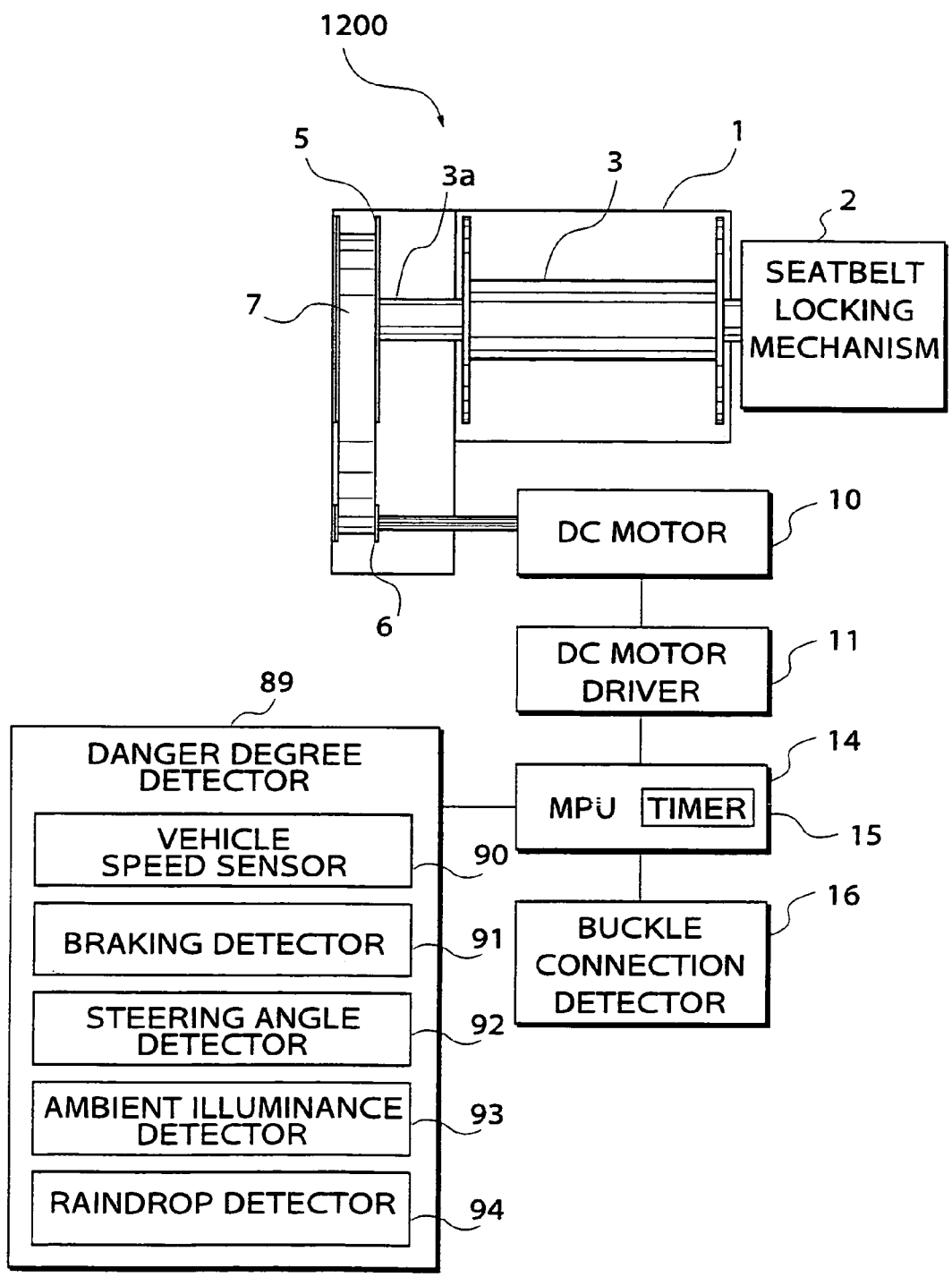
FIG. 44 is block diagram showing the arrangement of an electric retractor 1200 according to a twelfth embodiment of the invention.

FIG. 44 shows the arrangement of the electric retractor 1200 according to the present embodiment.

As shown in FIG. 44, the danger degree detector 89 is connected to the MPU 14.

The danger degree detector 89 is comprised of a vehicle speed sensor 90 for sensing the traveling speed of the automotive vehicle, a braking detector 91 for detecting stepping-on of a brake pedal of the automotive vehicle, a steering angle detector 92 for detecting the steering angle of a steering arm of the vehicle, an ambient illuminance detector 93 for detecting ambient illuminance of the vehicle, and a raindrop detector 94 for sensing raindrops.

Figure 45:
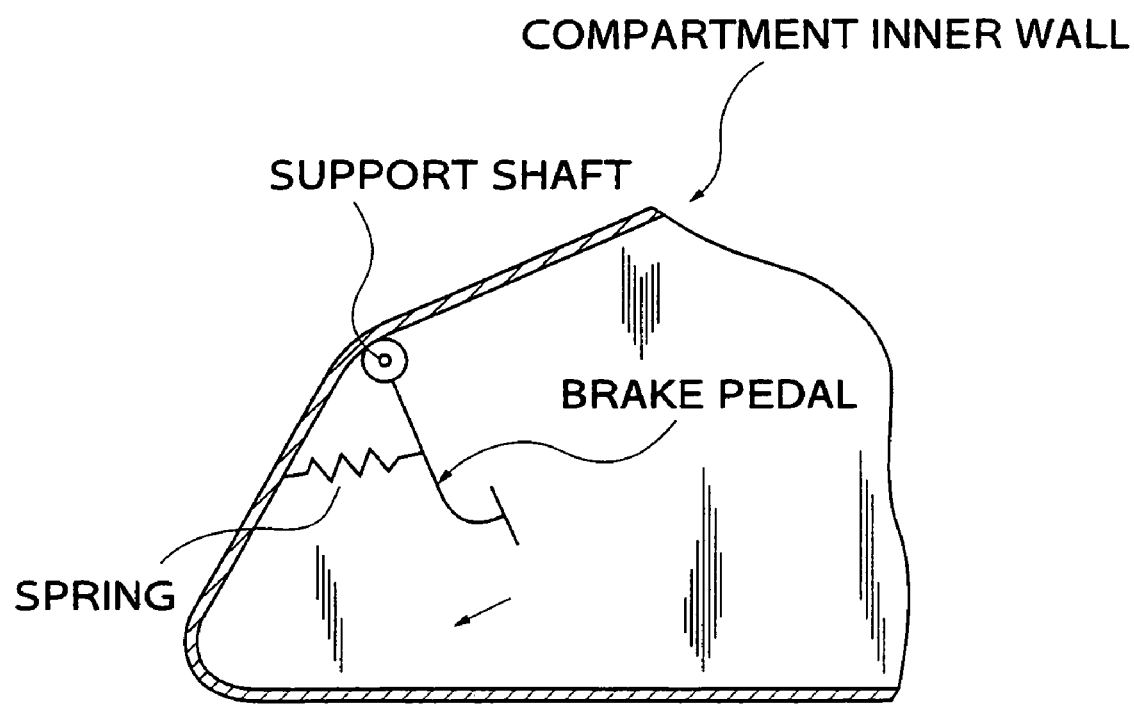
FIG. 45 is a schematic view showing the interior of a vehicle compartment with a brake pedal, which is applied to the twelfth embodiment of the invention.

FIG. 45 is a schematic view showing the interior of the vehicle compartment, which is applied to the present embodiment.

Fixed to an inner wall of the vehicle compartment is a support shaft of the brake pedal which is normally biased in a non-stepped-on position by a spring. Mounted within the support shaft of the brake pedal is an angle sensor, not shown, which rotates in unison with movement of the brake pedal and is connected to the braking detector 91 in FIG. 44.

The braking detector 91 calculates the stepping-on force from an angle sensed by the angle sensor to thereby detect stepping-on of the brake, and calculates the stepping-on speed, from a time change in the sensed angle.

Alternatively, the braking detector 91 may detect whether deceleration of the automotive vehicle sensed by a G sensor or a like sensor is smaller than a predetermined value, or whether a time change in the vehicle speed sensed by the vehicle sensor 90 exceeds a predetermined degree of deceleration.

The steering angle detector 92 is connected to a potentiometer rotatable in unison with rotation of a column at the center of the steering arm and detects the steering angle, based upon a signal from the potentiometer. Further, the steering angle detector 92 also detects a rate of change in the steering angle, from a time change in the steering angle.

The ambient illuminance detector 93 is connected to a photo sensor such as a photo diode. The photo sensor is arranged between an internal mirror of the automotive vehicle and a windshield of the same, for receiving light from the outside through the windshield. An output signal indicative of the sensed intensity of light from the photo sensor is delivered to the ambient illuminance detector 93, which in turn detects the ambient illuminance from the output signal.

The raindrop detector 94 is connected to two electrodes on an insulating board arranged on a bonnet of the vehicle. The resistance between the two electrodes varies with the amount of raindrops, and a signal indicative of the amount of raindrops is delivered to the raindrop detector 94, which in turn detects the presence of raindrops from the signal.

Figure 46:
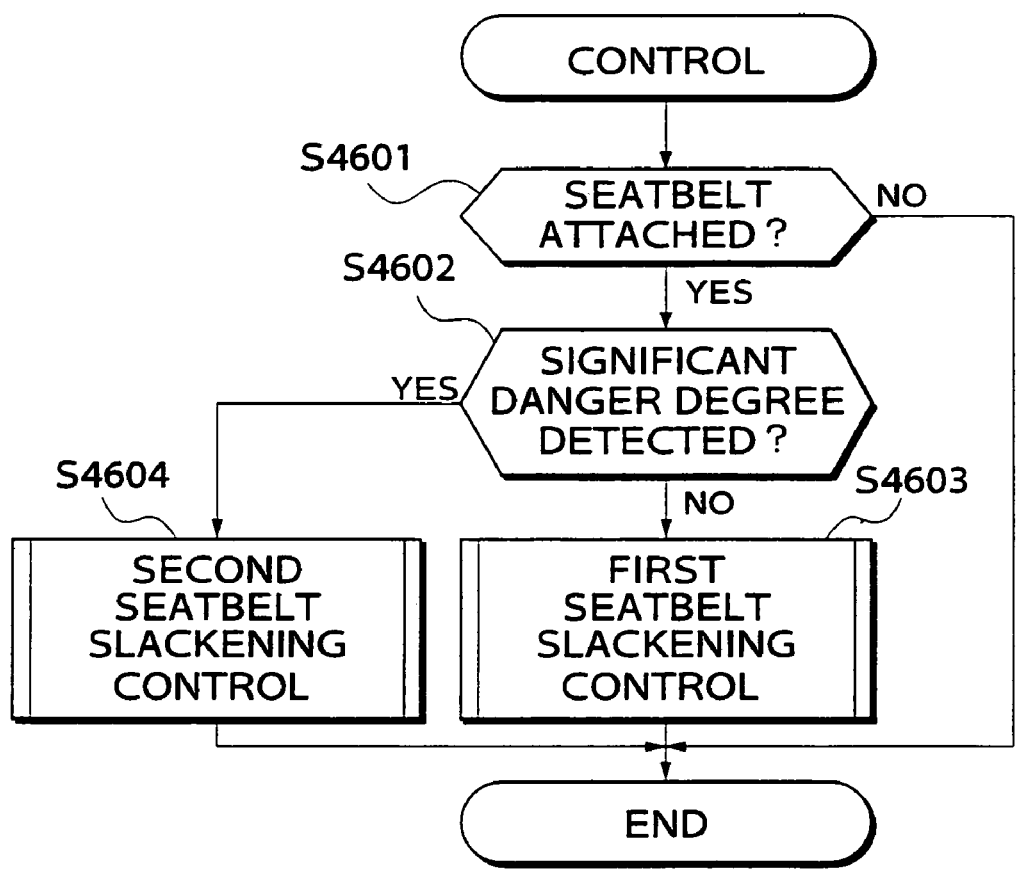
FIG. 46 is a flowchart showing a control program according to the twelfth embodiment, executed by the MPU 14.

FIG. 46 is a flowchart showing a control program according to the present embodiment, executed by the MPU 14.

First, it is determined at a step S4601 whether attaching of the seatbelt tongue to the buckle has been detected by the buckle connection detector 16. If attaching of the seatbelt tongue has not been detected, the present processing is immediately terminated, whereas if attaching of the seatbelt tongue has been detected, it is determined at a step S4602 whether a significant degree of danger has been defected by the danger degree detector 89. It is determined that the significant degree of danger has been detected, if the vehicle speed detected by the vehicle speed detector 90 exceeds a predetermined value (e.g. 60 km/h) and at the same time at least one of the following conditions is detected:

(1) Braking has been detected by the braking detector 91;

(2) The rate of change in the steering angle detected by the steering angle detector 92 exceeds a predetermined value;

(3) The ambient illuminance detected by the ambient illuminance detector 94 exceeds a predetermined value; and (4) Raindrops have been detected by the raindrop detector 94.

If it is determined at the step S4602 that the significant degree of danger has not been detected, first seatbelt slackening control, described hereinafter, is executed at a step S4603, whereas if the significant degree of danger has been detected, second seatbelt slackening control, described hereinafter, is executed at a step S4604, followed by terminating the present processing.

The present control program is executed every predetermined time period t1 (e.g. 0.1 sec). However, when the determination as to the significant degree of danger at the step S4602 continuously provides the same result, the first or second seatbelt slackening control is executed only when the result of the first determination is obtained, but the same control is not executed when the results of the second determination et seq. are obtained.

Figure 47:
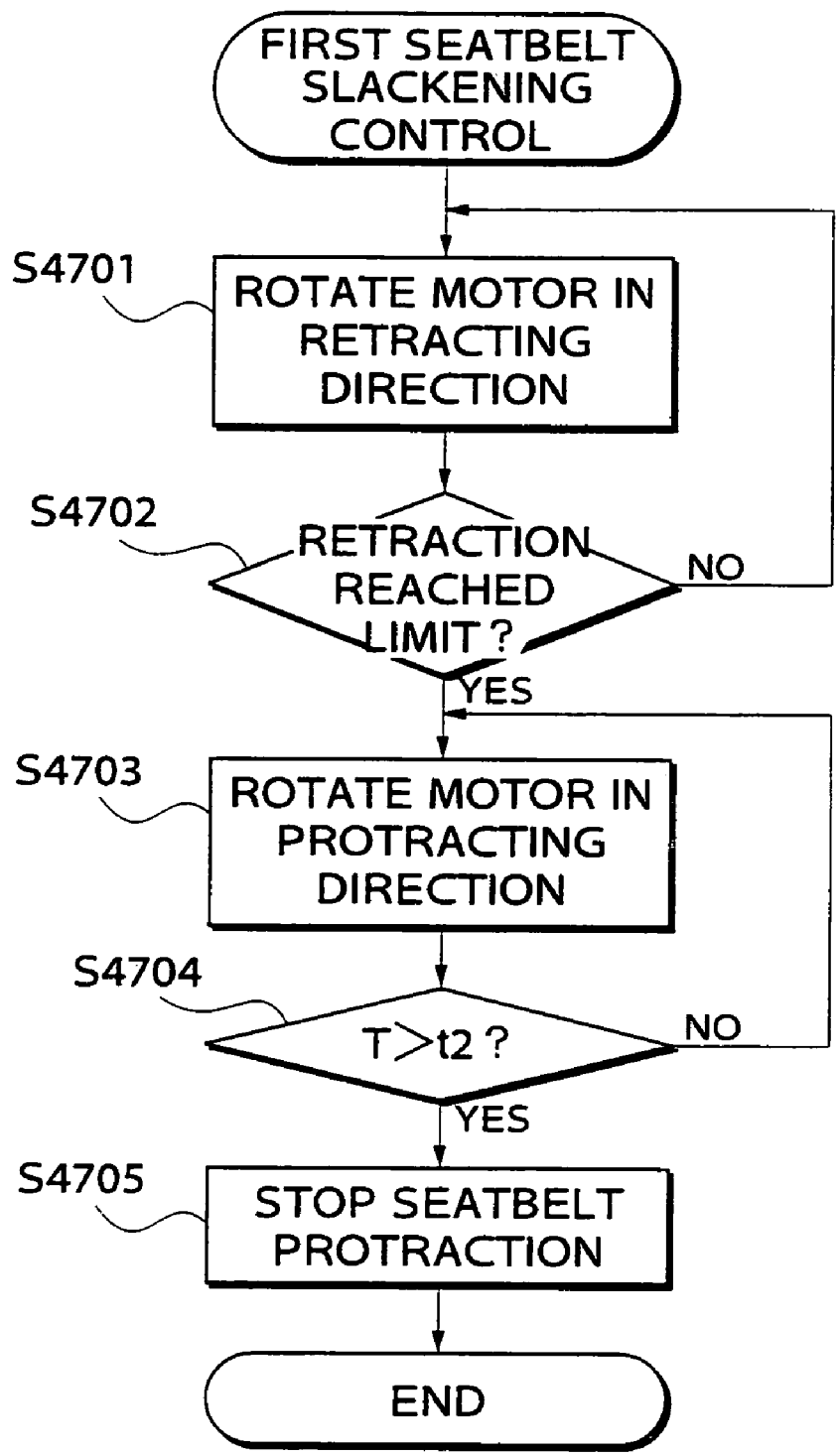
FIG. 47 is a flowchart showing first seatbelt slackening control according to the twelfth embodiment.

FIG. 47 is a flowchart showing the first seatbelt slackening control according to the present embodiment.

First, a PWM signal is delivered from the MPU 14 to the DC motor driver 11 to rotatively drive the DC motor 10 in the seatbelt retracting direction at a step S4701, and then it is determined at a step S4702 whether the retraction of the seatbelt has reached its limit, from current flowing to the DC motor 10. When the retraction of the seatbelt has reached its limit, an improper looseness of the seatbelt has been completely removed.

If it is determined at the step S4702 that the retraction of the seatbelt has not reached its limit, the processing returns to the step S4701, whereas if the retraction has reached the limit, a PWM signal is delivered from the MPU 14 to the DC motor driver 11 to rotatively drive the DC motor 10 in the seatbelt protracting direction at a step S4703, and then it is determined at a step S4704 whether a predetermined time period t2 (e.g. 1 sec) has elapsed after the start of the driving of the DC motor 10 in the seatbelt protracting direction. When the predetermined time period t2 has elapsed, a proper amount of looseness has been given to the seatbelt and hence to the occupant.

If it is determined at the step S4704 that the predetermined time period t2 has not elapsed, the processing returns to the step S4703, whereas if the predetermined time period t2 has elapsed, the protraction of the seatbelt by the DC motor 10 is stopped at a step S4705, followed by terminating the present processing.

Figure 48:
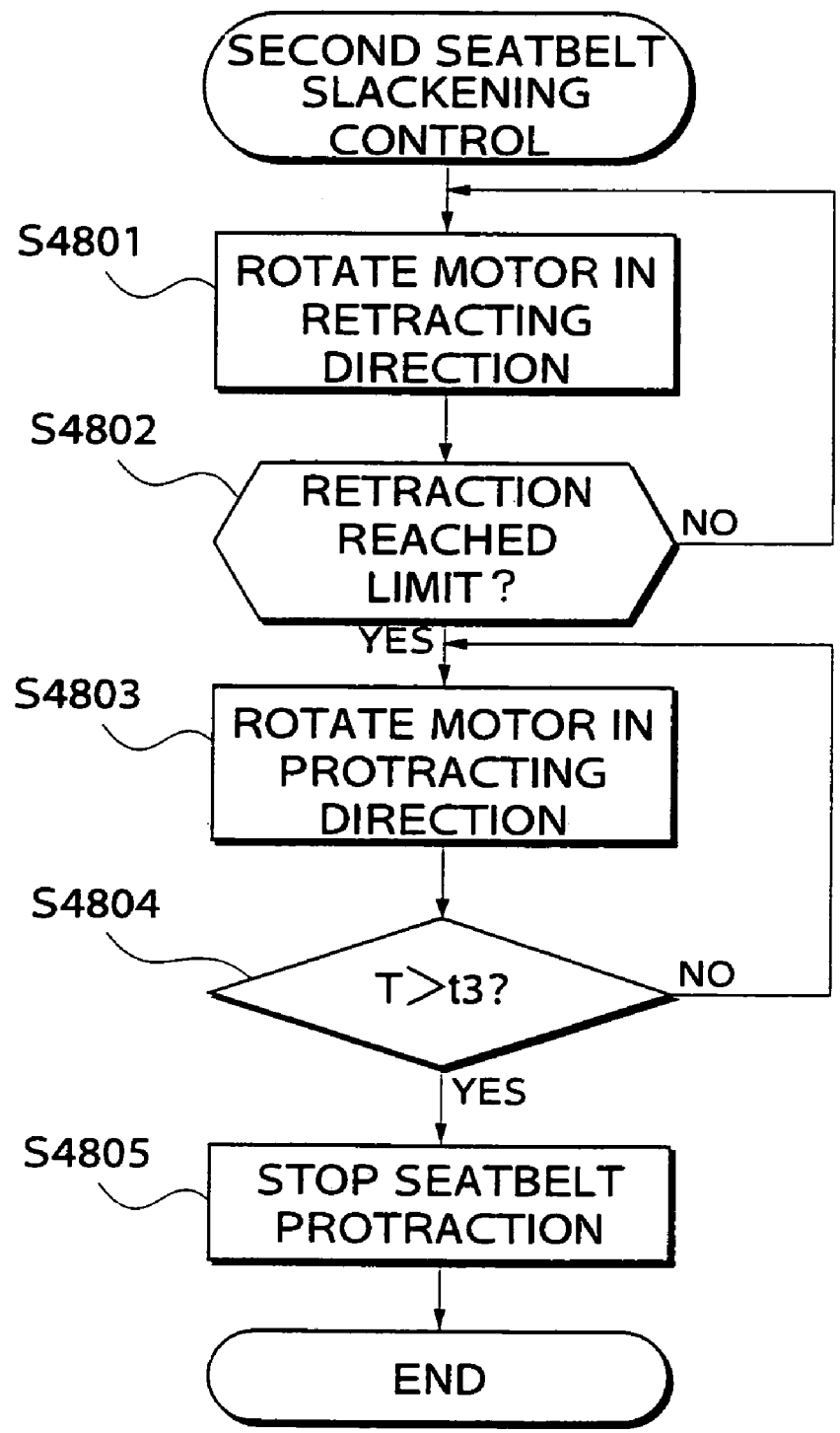
FIG. 48 is a flowchart showing second seatbelt slackening control according to the twelfth embodiment.

FIG. 48 is a flowchart showing the second seatbelt slackening control according to the present embodiment.

First, a PWM signal is delivered from the MPU 14 to the DC motor driver 11 to rotatively drive the DC motor 10 in the seatbelt retracting direction at a step S4801. On this occasion, the MPU 14 controls the rotational speed of the DC motor 10 by varying the duty factor of the PWM signal.

More specifically, (i) If the vehicle speed detected by the vehicle speed detector 90 exceeds a predetermined value (e.g. 60 km/h), the rotational speed of the DC motor 10 is set to a higher value as the stepping-on force or the stepping-on speed detected by the braking detector 91 is larger or higher.

(ii) If the detected vehicle speed exceeds a predetermined value (e.g. 60 km/m) and at the same time the braking detector 91 detects that the vehicle has been braked, the rotational speed of the DC motor 10 is set to a higher value as the detected vehicle speed is higher.

(iii) If the detected vehicle speed exceeds a predetermined value (e.g. 60 km/h), the rotational speed of the DC motor 10 is set to a higher value as the rate of change in the steering angle detected by the steering angle detector 92 is larger.

(iv) If the detected vehicle speed exceeds a predetermined value (e.g. 60 km/m) and at the same time the detected rate of change in the steering angle exceeds a predetermined value, the rotational speed of the DC motor 10 is set to a higher value as the detected vehicle speed is higher.

(v) If the detected vehicle speed exceeds a predetermined value (e.g. 60 km/h), the rotational speed of the DC motor 10 is set to a higher value as the ambient illuminance detected by the ambient illuminance detector 93 is lower.

(vi) If the detected vehicle speed exceeds a predetermined value (e.g. 60 km/h) and at the same time the detected ambient illuminance detected by the ambient illuminance detector 93 is below a predetermined value, the rotational speed of the DC motor 10 is set to a higher value as the detected vehicle speed is higher.

(vii) If the detected vehicle speed exceeds a predetermined value (e.g. 60 km/m) and at the same time the raindrop detector 94 detects raindrops, the rotational speed of the DC motor 10 is set to a higher value as the detected vehicle speed is higher.

Next, it is determined at a step S4802 whether the retraction of the seatbelt has reached its limit. When the retraction of the seatbelt has reached the limit, an improper amount of looseness has been completely removed.

If it is determined at the step S4802 that the retraction of the seatbelt has not reached its limit, the processing returns to the step S4801, whereas if the retraction of the seatbelt has reached the limit, a PWM signal is delivered from the MPU 14 to the DC motor driver 11 to rotatively drive the DC motor 10 in the seatbelt protracting direction at a step S4803. On this occasion as well, the MPU 14 controls the rotational speed of the DC motor 10 by varying the duty factor of the PWM signal, similarly to the step S4801. Therefore, by controlling the rotational speed of the DC motor 10 to a higher value according to the above control manners (i) to (vii), the time duration of the retraction of the seatbelt at the step S4801 and the time duration of the protraction of the seatbelt at the step S4803 become shorter, to thereby shorten the time period required to shift from an amount of looseness given by the first seatbelt slackening control (hereinafter referred to as "the first amount of looseness") to an amount of looseness given by the second seatbelt slackening control (hereinafter referred to as "the second amount of looseness").

Then, it is determined at a step S4804 whether a predetermined time period t3 (e.g. 0 to 1 sec) has elapsed after the start of the driving of the DC motor 10 in the seatbelt protracting direction. When the predetermined time period t3 has elapsed, a proper amount of looseness has been given to the seatbelt and hence to the occupant. On this occasion, the predetermined time period t3 which is set to the timer 15 is changed according to the degree of danger detected by the danger degree detector 89.

More specifically, (viii) If the vehicle speed detected by the vehicle speed detector 90 exceeds a predetermined value (e.g. 60 km/h), the predetermined time period t3 is set to a shorter value as the stepping-on force or the stepping-on speed detected by the braking detector 91 is larger or higher.

(ix) If the detected vehicle speed exceeds a predetermined value (e.g. 60 km/m) and at the same time the braking detector 91 detects that the vehicle has been braked, the predetermined time period t3 is set to a shorter value as the detected vehicle speed is higher.

(x) If the detected vehicle speed exceeds a predetermined value (e.g. 60 km/h), the predetermined time period t3 is set to a shorter value as the rate of change in the steering angle detected by the steering angle detector 92 exceeds is larger.

(xi) If the detected vehicle speed exceeds a predetermined value (e.g. 60 km/m) and at the same time the detected rate of change in the steering angle exceeds a predetermined value, the predetermined time period t3 is set to a shorter value as the detected vehicle speed is higher.

(xii) If the detected vehicle speed exceeds a predetermined value (e.g. 60 km/h), the predetermined time period t3 is set to a shorter value as the ambient illuminance detected by the ambient illuminance detector 93 is lower.

(xiii) If the detected vehicle speed exceeds a predetermined value (e.g. 60 km/h) and at the same time the detected ambient illuminance detected by the ambient illuminance detector 93 is below a predetermined value, the predetermined time period t3 is set to a shorter value as the detected vehicle speed is higher.

(xiv) If the detected vehicle speed exceeds a predetermined value (e.g. 60 km/m) and at the same time the raindrop detector 94 detects raindrops, the predetermined time period t3 is set to a shorter value as the detected vehicle speed is higher.

By shortening the predetermined time period t3 according to the above control manners (viii) to (xiv), the time duration of driving of the DC motor 10 in the seatbelt protracting direction can be shorter, whereby the amount of looseness of the seatbelt can be reduced.

If it is determined at the step S4804 that the predetermined time period t3 has not elapsed, the processing returns to the step S4803, whereas if the predetermined time period t3 has elapsed, the protraction of the seatbelt by the DC motor 10 is terminated at a step S4805, followed by terminating the present processing.

As described above, according to the present embodiment, when no significant degree of danger is detected by the danger degree detector 89, that is, in a normal case, the first amount of looseness is given to the seatbelt by executing the first seatbelt slackening control, and on the other hand, when the significant degree of danger is detected, the second amount of looseness is given to the seatbelt by executing the second seatbelt slackening control (first amount of looseness>second amount of looseness). As a result, a comfortable seatbelt attaching environment can be provided while the occupant can be properly protected.

Thirteenth Embodiment

Figure 49:
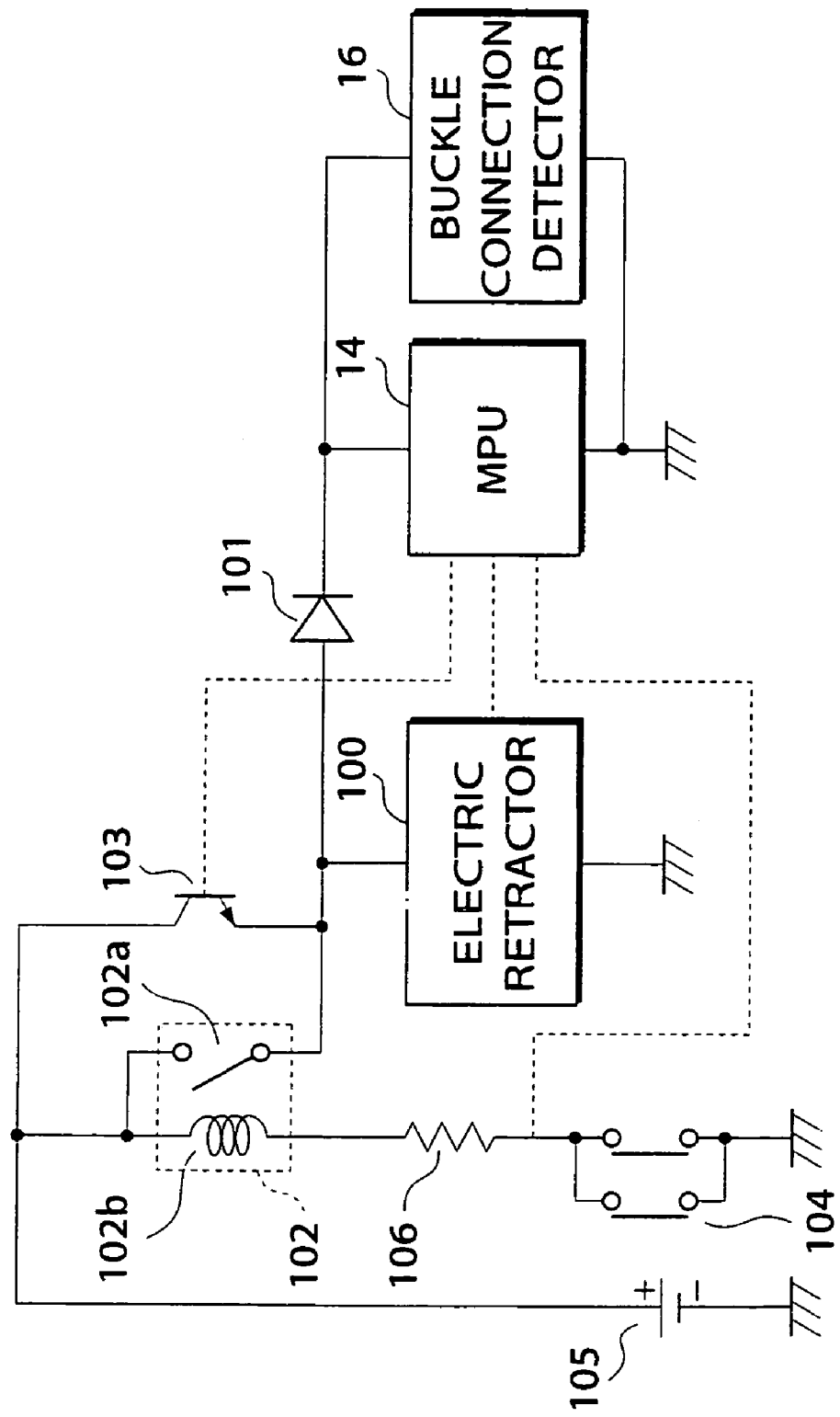
FIG. 49 is a schematic view showing the arrangement of an automotive passenger restraint and protection apparatus according to a thirteenth embodiment of the invention.

FIG. 49 shows the arrangement of an automotive passenger restraint and protection apparatus according to a thirteenth embodiment of the invention. An electric retractor provided in the present embodiment is identical in construction with the electric retractor 100 of FIG. 1, illustration and description of which are therefore omitted.

Connected to a supply voltage input terminal of the electric retractor 100 are one of contacts 102*a* of a relay 102, an emitter of a transistor 103, and an anode of a diode 101.

The other contact of the relay 102, one end of a coil 102*b* of the relay 102, and a collector of the transistor 103 are connected to a positive terminal of a battery 105, with the other end of the coil 102*b* of the relay 102 being connected to one end of a resistance 106.

The other end of the resistance 106 is connected to one end of a seating switch 104 for detecting seating of the occupant on the seat, with the other end of the seating switch 104 being grounded. The battery 105 has a negative terminal thereof grounded.

The diode 101 has a cathode thereof connected to the MPU 14 as well as to the buckle connector detector 16.

Connected to the MPU 14 are the electric retractor 100, buckle connection detector 16, seating switch 79, and a base of the transistor 103 such that the MPU 14 monitors and controls these components.

Figure 50:
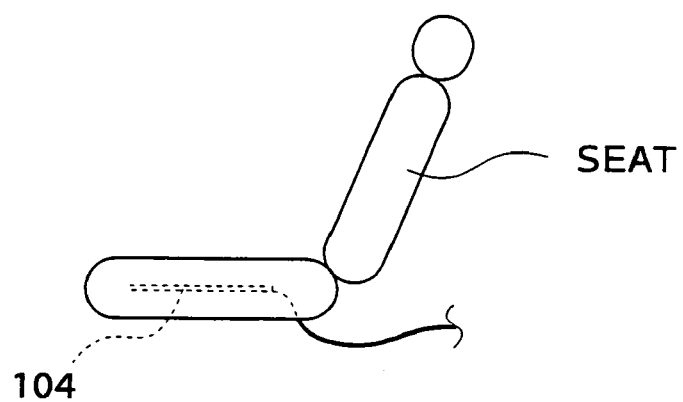
FIG. 50 is a schematic view showing an occupant seat with a seating switch 104.
Figure 51:
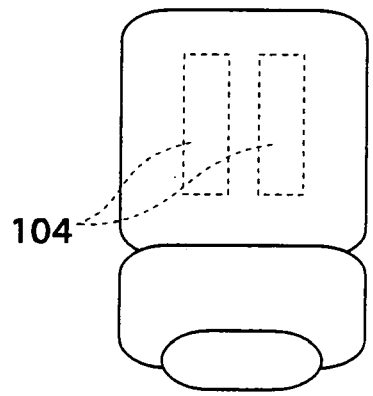
FIG. 51 is a schematic view showing the occupant seat as viewed from a different angle.

The seating switch 104 is provided in a seat of the automotive vehicle at a location below the occupant sitting on the seat (sitting portion), as shown in FIGS. 50 and 51. The seating switch 104 may be arranged at any other location such as the back portion of the seat or at both the sitting portion and the back portion.

Figure 52:
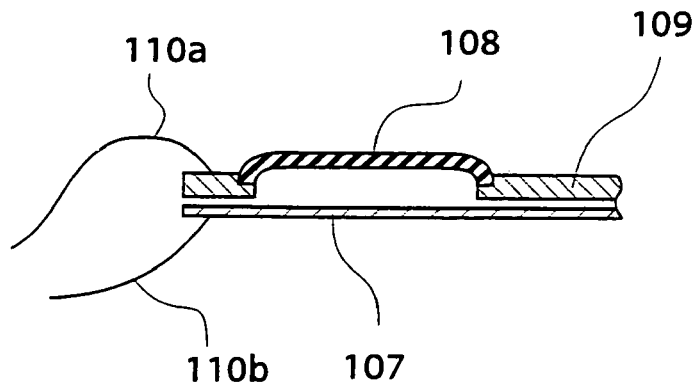
FIG. 52 is a schematic sectional view showing the construction of the seating switch 104.

FIG. 52 shows the construction of the seating switch 104. The seating switch 104 is comprised of a fixed electrode 107, and a deformable electrode 108 formed of an elastic material and disposed above the fixed electrode 107 in normally spaced relation thereto. The deformable electrode 108 is secured to an insulating member 109. Lead wires 110*a* and 110*b* are connected to the electrodes 107 and 108, respectively.

The deformable electrode 108 is arranged in the seat at a location where the occupant sits on the seat (sitting portion). The electrode 108 is deformed into contact with the fixed electrode 107 due to the weight of the occupant when the occupant sits on the seat, whereby current flows through one of the lead wires 110*a*, 110*b*, the electrodes 107, 108, and the other lead wire 110*a* 110*b*.

The control operation of the automotive passenger restraint and protection apparatus according to the present embodiment constructed as above will now be described with reference to FIG. 49.

When the occupant does not sit on the seat, the seating switch 104 is off, and accordingly no current flows from the battery 105 to the coil 102*b* of the relay 102, with the contacts 102*a* being open, whereby no supply voltage is delivered from the battery 105 to the electric retractor 100, MPU 14, and buckle connection detector 16.

Thereafter, when the occupant sits down on the seat, the seating switch 104 is turned on, and accordingly current flows from the battery 105 to the coil 102*b* of the relay 102 to close the contacts 102*a*, whereby supply voltage is delivered from the battery 105 to the electric retractor 100, MPU 14, and buckle connection detector 16. Then, the MPU detects voltage applied to the seating switch 104 to thereby monitor on and off states of the seating switch 104.

Subsequently, when the occupant stands up from the seat, the seating switch 104 is turned off, and accordingly supply of current from the battery 105 to the coil 102*a* of the relay 102 is stopped, whereby the contacts 102*a* of the relay 102 are opened with a time lag of 10 ms, for example, so that the delivery of supply voltage from the battery 105 to the electric retractor 100, MPU 14, and buckle connection detector 16 is stopped.

Simultaneously upon the turning-off of the seating switch 104, the MPU 14 delivers a high-level signal to the base of the transistor 103 to turn the same on, whereby supply voltage from the battery 105 is supplied via the transistor 103 to the electric retractor 100, MPU 14, and buckle connection detector 16.

When a predetermined time period (e.g. 1 minute) within which the retraction of the seatbelt can be completed by the electric retractor 100 has elapsed after the MPU 14 delivered the high-level signal to the base of the transistor 103, the MPU 14 delivers a low-level signal to the base of the transistor 103 to turn the same off, whereby the supply of the supply voltage from the battery 105 to the electric retractor 100, MPU 14, and buckle connection detector 16 is stopped.

Thus, the supply of supply voltage from the battery 105 is carried out only when the occupants is seated on the seat, to thereby prevent the battery from being wastefully consumed and deteriorated, overcoming the disadvantage with the conventional electric retractor that supply voltage from the battery to the electric retractor is carried out even when it is not needed. Further, since the seatbelt is retracted when the seatbelt is disconnected from the buckle, it can be prevented that the seatbelt tongue is caught in the door.

As described above, according to the present embodiment, when the occupant sits on the seat, the seating switch 104 becomes on to close the relay 102, whereby supply voltage from the battery 105 is supplied to the electric retractor 100, etc., and when the occupant stands up from the seat, the seating switch 104 becomes off to open the relay 102, whereby the supply of supply voltage from the battery to the electric retractor, etc. is stopped. As a result, wasteful consumption and deterioration of the battery can be prevented.

Further, simultaneously when the seating switch 104 is turned off, the MPU 14 causes the transistor 103 to be turned on to supply the supply voltage from the battery 105 to the electric retractor 100, etc., and then, after the lapse of a predetermined time period within which the retraction of the seatbelt by the electric retractor 100 can be completed, the MPU 14 causes the transistor 103 to be turned off to stop the supply of the supply voltage. As a result, retraction of the seatbelt can be carried out without fail when the seatbelt is disconnected from the occupant, to thereby prevent the seatbelt from being caught in the door.

Although in the present embodiment, when a predetermined time period (e.g. 1 minute) after the occupant leaves the seat, the MPU 14 turns the transistor 103 off, alternatively, when the occupant stands up from the seat, if voltage applied to the seating switch 104 is equal to a predetermined value (e.g. 7 volts) or less, for example, the buckle connection detector 16 may detect whether the seatbelt tongue is attached to the buckle, and if it is attached to the buckle, the MPU 14 may keep the transistor 103 on for 3 minutes, while if the seatbelt tongue is not attached to the buckle, the MPU 14 may keep the transistor 103 on for 30 seconds.

Further, although in the present embodiment, the supply of power to the electric retractor and stoppage of the same are carried out depending upon on and off states of the seating switch, they may be carried out depending upon on and off states of an ignition switch of the engine connected to the battery, opening and closure of the door, whether the vehicle speed is equal to 0, whether the parking brake is operated, whether the magnitude of vibration of the vehicle is below a predetermined value, whether noise volume of the vehicle engine is below a predetermined value, whether the engine noise has a frequency distribution other than a predetermined frequency distribution, or whether temperature within the engine compartment of the vehicle is below a predetermined value.

The automotive passenger restraint and protection apparatuses according to the above described embodiments may be provided at any of the driving seat, the assistant driving seat, and the back seats.

What is claimed is:

1. An automotive passenger restraint and protection apparatus for an automotive vehicle, having a seatbelt, for restraining an occupant of the automotive vehicle by the seatbelt to protect the occupant, comprising:
    an electric retractor having driving means for retracting and protracting the seatbelt;
    seatbelt attaching detecting means for detecting attaching of the seatbelt to the occupant or disconnection of the seatbelt from the occupant; and
    seatbelt protraction detecting means for detecting protraction of the seatbelt by the occupant; and
    control means for controlling said driving means by performing a plurality of functions, said control means having selecting means for selecting a reduced power consumption mode for permitting said control means to perform at least one minimum required function of said plurality of functions so as to save power consumption by said electric retractor, or a normal power consumption mode for permitting said control means to perform all of said plurality of functions so as not to save power consumption by said electric retractor;
    wherein said selecting means selects said reduced power consumption mode when a predetermined time period has elapsed after detection of the disconnection of the seatbelt from the occupant by said seatbelt attaching detecting means while said normal power consumption mode is selected, and selects said normal power consumption mode when the protraction of the seatbelt by the occupant is detected by said seatbelt protraction detecting means or when the attaching of the seatbelt to the occupant is detected by said seatbelt attaching detecting means.

\* \* \* \* \*